(12) United States Patent
Bochmann et al.

(10) Patent No.: US 10,593,897 B2
(45) Date of Patent: Mar. 17, 2020

(54) METAL COMPLEXES

(71) Applicants: UEA ENTERPRISES LIMITED, Norwich (GB); CAMBRIDGE ENTERPRISE LIMITED, Cambridge (GB)

(72) Inventors: Manfred Bochmann, Norwich (GB); Alexander Sergeyevich Romanov, Norwich (GB); Daniel John Nicholas Credgington, Cambridge (GB); Dawei Di, Cambridge (GB); Le Yang, Cambridge (GB)

(73) Assignees: UEA Enterprises Limited, Norwich (GB); Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 15/760,037

(22) PCT Filed: Sep. 9, 2016

(86) PCT No.: PCT/GB2016/052797
§ 371 (c)(1),
(2) Date: Mar. 14, 2018

(87) PCT Pub. No.: WO2017/046572
PCT Pub. Date: Mar. 23, 2017

(65) Prior Publication Data
US 2019/0131549 A1    May 2, 2019

(30) Foreign Application Priority Data

Sep. 14, 2015 (GB) .................. 1516230.8
Jun. 3, 2016 (GB) .................. 1609707.3

(51) Int. Cl.
| | |
|---|---|
| H01L 51/00 | (2006.01) |
| C07F 1/08 | (2006.01) |
| C07F 1/00 | (2006.01) |
| C09K 11/06 | (2006.01) |
| C07F 1/12 | (2006.01) |
| H01L 51/50 | (2006.01) |

(52) U.S. Cl.
CPC ............ *H01L 51/0091* (2013.01); *C07F 1/00* (2013.01); *C07F 1/08* (2013.01); *C07F 1/12* (2013.01);
(Continued)

(58) Field of Classification Search
CPC .... H01L 51/0091; H01L 51/5016; C07F 1/00; C07F 1/08; C09K 11/06; C09K 2211/10; C09K 2211/188; C09K 2211/1029
(Continued)

(56) References Cited

U.S. PATENT DOCUMENTS

2015/0108541 A1    4/2015  Thompson et al.

FOREIGN PATENT DOCUMENTS

| WO | 2009/113646 A1 | 9/2009 |
|---|---|---|
| WO | 2011/063083 A1 | 5/2011 |

OTHER PUBLICATIONS

English Translation WO 2009/113646 (Year: 2009).*
(Continued)

*Primary Examiner* — Caleen O Sullivan
(74) *Attorney, Agent, or Firm* — Nixon Peabody LLP

(57) ABSTRACT

The present invention provides complexes of the formula (L)M(X), in which M is a metal atom selected from copper, silver and gold; L is a carbene ligand; and X is a monoanionic ligand. The complexes are useful as light emitters in the emissive zone of light-emitting devices such as OLEDs. The present invention also provides organometallic complexes which exhibit RASI photoemission, and the use of the same in light-emitting devices such as OLEDs.

20 Claims, 31 Drawing Sheets

(52) U.S. Cl.
CPC .......... *C09K 11/06* (2013.01); *C09K 2211/10* (2013.01); *C09K 2211/1029* (2013.01); *C09K 2211/188* (2013.01); *H01L 51/5016* (2013.01)

(58) Field of Classification Search
USPC .......................................................... 257/40
See application file for complete search history.

(56) References Cited

OTHER PUBLICATIONS

Jin et al., "Trinuclear Gold Clusters Supported by Cyclic (alkyl)(amino) carbene Ligands: Mimics for Gold Heterogeneous Catalysts" Angew. Chem. Int. Ed. 53:9059-9063 (2014).

Frey et al., "Synthesis of a Room-Temperature-Stable Dimeric Copper (I) Hydride", Chemistry—An Asian Journal 6 (2):402-405 (2011).

Hu et al., "Air-Stable (CAAC) CuCl and (CAAC) CuBH4 Complexes as Catalysts for the Hydrolytic Dehydrogenation of BH3NH3", Angewandte Chemie International Edition 54:6008-6011 (2015).

Romanov et al., "Highly photoluminescent copper carbene complexes based on prompt rather than delayed fluorescence", Chemical Communications 52:6379-6382 (2016).

Braunshweig et al., "Organometallic Probe for the Electronics of Base-Stabilized Group 11 Metal Cations", Chemistry European Journal, 21, 12347-12356, (2015).

\* cited by examiner (a)

(b)

a.

b.

METAL COMPLEXES

CROSS REFERENCE TO RELATED APPLICATIONS

This application is a 371 National Phase Entry of International Patent Application No. PCT/GB2016/052797 filed on Sep. 9, 2016 which claims benefit under one or more of 35 U.S.C. § 119(a)-119(d) of GB Application No. 1516230.8 filed Sep. 14, 2015 and GB Application No. 1609707.3 filed Jun. 3, 2016, the contents of both of which are incorporated herein by reference in their entirety.

FIELD OF THE INVENTION

The present invention is concerned with transition metal complexes and their use in light-emitting devices (for example Organic Light Emitting Diodes, OLEDs). More particularly, this invention relates to two-coordinate copper, silver and gold complexes comprising one carbene ligand as neutral electron donor (L-type ligand) and a monodentate anionic ligand (X-type ligand), as well as organometallic complexes that exhibit rotationally accessed spin-state inversion (RASI) photoemission, and the use of these compounds as photoemissive materials. The present invention also relates to light-emitting devices which incorporate such complexes.

BACKGROUND OF THE INVENTION

Current technological developments are very much directed at new display screens that are flexible and lightweight and are capable of covering large areas. Such display devices have the potential of offering high brightness for lighting applications, as well as bleach-resistant colours and long device lifetimes. In particular, such display devices offer the advantage of cheap production costs and low energy consumption during their lifetime, due to low operating voltages. Production costs can be low because many of the components required to make such devices are based on cheap organic compounds and polymers. OLEDs are therefore highly attractive candidates to fulfil the requirements of the next advance in display technology.

The function of OLEDS has been described numerous times [see for example: J. Shinar (ed.): *Highly Efficient OLEDs with Phosphorescent Materials*. Wiley-VCH, Weinheim 2008; Z. H. Kafafi: *Organic Electroluminescence*. Taylor & Francis, Boca Raton 2005; X. H. Yang, D. C. Müller, D. Neher, K. Meerholz, *Adv. Mater.* 2006, 18, 948; H. Yersin, *Top. Curr. Chem.* 2004, 241, 1], for example also in U.S. Pat. Nos. 4,539,507, 5,151,629 and WO 98/27136. A device showing green electroluminescence with good efficiency based on a simple coordination compound, tris(8-hydroxyquinolinato)aluminium, was reported in 1987 [C. W. Tang, S. A. van Slyke, *Appl. Phys. Lett.* 1987, 51, 913 and U.S. Pat. No. 5,151,629], and it was shown that a triple-layer structure improved the device efficiency. The content of these publications is incorporated herein by reference.

As is known, OLEDs generally comprise, in sequence, an anode, optionally a hole-transporting zone, an emissive zone capable of emitting light, and a cathode. The arrangement may suitably be supported on a substrate. An electron-transporting zone may be present, between the emissive zone and the cathode. OLEDs are typically multilayer structures with each component part forming a layer or part of a layer. Depending on which side or sides of the device is/are to emit the light, layers may be independently selected to be transparent, translucent or opaque.

An embodiment of an OLED is shown schematically in FIG. 1 of the accompanying drawings, to illustrate a typical sequence of layers. In this embodiment, a glass substrate is covered by a thin, optically transparent, layer of indium tin oxide (ITO), which acts as anode. A metal or metal alloy of low work function acts as cathode. The cathode and anode are separated by several layers of different organic molecules which are able to conduct charges, and provide the hole-transporting and emissive zones. Holes are injected into the organic layers from the anode, and electrons are injected from the cathode. The holes and the electrons migrate in opposite directions in the layers of the organic molecules and bind to form excitons. In the illustrated embodiment the anode injects into a hole-transporting layer (hole-transporting zone), which may, for example, comprise a hole-transporting material such as PEDOT:PSS [poly(3,4-ethylenedioxythiophene)/polystyrene sulfonate polymer mixture], while the cathode injects into an electron-injection layer, which may, for example, comprise an electron-transporting material such as a metal oxide, salt or organic electron-transporting compound. Both the hole-transporting layer and the electron-injection layer serve to block the escape of the opposite-sign charge carrier. Between these layers is the emissive layer, which is a layer of organic compounds in which excitons form in a mixture of spin-0 singlet and spin-1 triplet states.

Layer devices such as that illustrated in FIG. 1 are built up by successive deposition of the layers on the substrate. The deposition technique for each layer is selected from a range of available techniques. For example, the cathode is typically generated by evaporating metal vapour on the top surface of the previously deposited layers.

A common approach to forming the material of an emissive layer is to embed emitter molecules in a wider-bandgap organic matrix, usually at a level of 1-10 weight-percent. The role of the matrix is to allow excitons and charges to migrate to the emitter molecules. In use of the device, through charge or energy transfer, these emitter molecules are promoted to an excited state, which relaxes with the emission of light. This light can be of varying colour and can include white light.

The emitter molecules can be of various types, such as, for example, organic compounds with no metal atoms, organometallic complexes of heavy transition metals, and metal coordination complexes. The key role of the heavy metals in the complexes is to enhance spin-orbit coupling and thus allow luminescence from the normally dark triplet exciton state, significantly increasing the achievable photon quantum yield. The device efficiency is improved when the emitters have excited states with short life times, reducing competition with non-radiative decay channels.

A wide range of such metal complexes for applications as photo-emitters and based on polydentate ligand frameworks is described in WO2004/081017, the content of which is incorporated herein by reference. Particularly widely used as emitters are complexes of expensive noble metals, especially those of iridium, platinum and gold in high oxidation states, which are used in combination with polydentate chelating aromatic and heteroaromatic ligands. Emitter compounds based on these metals have been extensively patented and have for example been described in WO 2006/070896, U.S. Pat. 2009/0278453, WO2014/023377, WO2013/097920, WO2014/094960, WO2014/094961, WO2014/094962 and U.S. Pat. 2011/0012093, the contents of which are incorporated herein by reference.

Many copper complexes are known to become luminescent when excited with UV light. These complexes contain copper in the coordination number three or, most commonly, coordination number four in a distorted tetrahedral geometry and are of the form $Cu_2X_2L_4$, where L stands for a monodentate or part of a polydentate phosphine ligand. Copper and silver complexes of this type are for example described in WO 2014/102079, and are based on binuclear halide-bridged structures and four-coordinate metal centres. Similar copper and silver complexes of bidentate phosphines coordinated to bidentate nitrogen donor ligands in place of halide ligands are described in WO 2014/108430. The photophysical characteristics of copper complexes have recently been described in more detail in a number of reviews [N. Armaroli, G. Accorsi, F. Cardinali, A. Listorti: "Photochemistry and photophysics of coordination compounds: Copper", *Topics in Current Chemistry* 2007, 280, 69-115; M. Wallesch, D. Volz, D. M. Zink, U. Schepers, M. Nieger, T. Baumann, S. Braese: "Bright coppertunities: multinuclear complexes with N—P ligands and their applications", *Chemistry—a European Journal* 2014, 20, 6578-6590; the contents of these publications are incorporated herein by reference].

There is a well-recognised need for emitters based on cheap, earth-abundant metals. Materials based on earth-abundant metals offer, on the one hand, the advantage of reduced costs, and on the other hand, they mitigate against possible supply limitations that are inherent in the use of rare noble metals.

The purpose of using heavy-metal emitters such as iridium is to enable fast inter-system crossing, so that the ligand-based excited triplet states can be harvested in the form of emitted light. However, excited triplet states in close proximity are known to suffer from triple-triplet annihilation, reducing electroluminescence yield. In addition, many existing organometallic emitter materials suffer from strong concentration quenching. Dilution within the host matrix is therefore necessary to achieve efficient luminescence, and gradual migration and aggregation of emitter molecules leads to device failure. There is therefore a need to develop emitters with high quantum efficiency in the solid state, reducing the impact of aggregation.

There is a well-recognised need for emitters having high external quantum efficiency, preferably in excess of 15%, and devices incorporating them, e.g. OLEDs.

There is further a need to develop complexes that are readily soluble in common organic solvents in order to enable these complexes to be incorporated into the electronic device by cheap solution processing methods. Solution processing means in this context that the compound is capable of being dissolved, dispersed or suspended in a liquid medium. Such a solution, dispersion or suspension should be suitable for producing layer structures in OLED devices by coating or printing from a liquid phase, such as, for example, spin-coating, ink-jet printing or suitable alternative techniques.

Furthermore, there is a need for emitter materials that are simple and cheap to synthesize, keep their intended composition in solution and/or do not undergo ligand rearrangement reactions during processing.

Production costs of electroluminescent devices can be reduced using solution-based processing techniques, including a combination of solution processing and vacuum deposition techniques. With lowered production costs, the use of noble metal compounds as emitter materials can become economically attractive. Production of electroluminescent devices incorporating, as emitter materials, compounds of gold in the oxidation state +III and bonded to polydentate chelating aromatic ligands has been described, for example, in Chemistry A European Journal 2014, vol. 20, p. 15233-15241, in Advanced Materials 2014, vol. 26, p. 2540-2546, and in the Journal of the American Chemical Society 2014, vol. 136, p. 17861-17868, the contents of which are incorporated herein by reference. However, the external quantum efficiencies of these devices were below 10-15%.

Attempts to fabricate electroluminescent devices based on complexes of gold in the oxidation state +I by solution processing methods have also been reported, but were found to suffer from low quantum yields. This has been shown in devices incorporating binuclear gold(I) complexes of chelating phosphine ligands, reported in *Chem. Commun.*, 2000, 53-54, the contents of which are incorporated herein by reference, which gave quantum yields of only 0.1-0.2%. The use of tetranuclear gold(I) triphosphine complexes, was reported in Inorganic Chemistry 2014, vol. 53, p. 12720-12731, the contents of which are incorporated herein by reference, and the use of nanocrystals of metal-metal bonded gold salts of the composition $\{[Au(carbene)_2][Au(CN)_2]\}_n$, as emitter materials, was described in Chemical Science 2014, vol. 5, p. 1348-1353, the contents of which are incorporated herein by reference. The external quantum efficiencies of these devices did not exceed 4%.

There is therefore a need for emitter materials that do not suffer from concentration quenching, and which are capable of giving solution-processable electroluminescent devices with maximum external quantum efficiencies of 15% or higher.

Surprisingly, it has now been found that certain types of carbene complexes of copper, silver and gold in the oxidation state +I as described in further detail below are strongly photoemissive, which meet the performance requirements for emitter materials as outlined above and/or have solid-state quantum yields of 80% or higher. Unlike previously reported photoemissive copper complexes, these compounds have a linear, two-coordinate geometry. The complexes show excellent thermal stability and are soluble in all commonly used organic solvents. These characteristics render them suitable for use in solution processing and liquid deposition techniques for forming layered structures, for example OLEDs. Depending on their composition, these complexes may also be volatile and therefore may be suitable for gas or vapour phase processing in the production of devices such as OLEDs.

In *Chem. Commun.*, 2016, 52, 6379-6382, published on 12 Apr. 2016, the contents of which are incorporated herein by reference, certain photophysical properties of a group of linear two-coordinate copper and gold cyclic alkyl amino carbene (CAAC) halide complexes, defined as $^{Ad}L\text{-}M\text{-}X$ and individually designated 1a, 1b, 1c, 2a, 2b and 2c according to the following scheme:

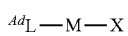

M = Cu (1), Au (2)
X = Cl (a), Br (b), I (c)

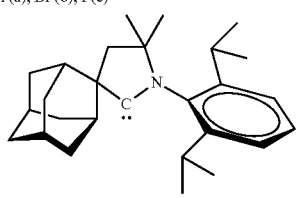

are described (see, for example, Tables 1 and 2, FIGS. 1 to 3).

It is reported in the said publication that the copper compounds show photoluminescence with solid-state quantum yields of up to 96%, the light emission being independent of temperature over the range T=4-300 K. The photoluminescence is reported to occur very efficiently by prompt rather than delayed fluorescence, with lifetimes in the sub-nanosecond range. The solid-state photoluminescence quantum yield of the copper compounds is: compound 1a 0.96 (96%); compound 1b 0.61 (61%); compound 1c 0.28 (28%). The solid-state photoluminescence quantum yield of the gold compounds is: compound 2a 0.09 (9%); compound 2b 0.13 (13%); compound 2c 0.18 (18%).

The said publication *Chem. Commun.*, 2016, 52, 6379-6382 is a disclosure made less than six months before the filing date and second priority date of the present patent application and the invention claimed herein, by at least one of the inventors of the present invention and/or by at least one other who obtained the disclosed subject-matter directly or indirectly from at least one of the inventors of the present invention. The invention embodied in the said publication is therefore being claimed in the present patent application for the purposes of patent or like protection in territories where such prior publications are excluded from the prior art for the analysis of novelty and inventive step.

BRIEF DESCRIPTION OF THE INVENTION

According to a first aspect, the present invention provides complexes of the following Formula I:

(L)M(X),  (I)

in which
A.
M is a metal atom selected from copper and silver;
L is a cyclic alkyl amino carbene (CAAC) ligand having a saturated cyclic structure in which the atoms of the ring which includes the carbene site consist of carbon atoms and one nitrogen atom;
and
X is a monoanionic ligand; or
B.
M is a gold atom;
L is a cyclic alkyl amino carbene (CAAC) ligand having a saturated cyclic structure in which the atoms of the ring which includes the carbene site consist of carbon atoms and one nitrogen atom;
and
X is a monoanionic organic amide ligand having the formula R'—N—R" or N

in which R' and R" are selected from hydrogen and organic groups, which when both organic groups may be the same or different;
and  represents a cyclic organic group which may contain one or more rings;
excluding the compound $^{Ad}$L-Au-NTf$_2$ in which $^{Ad}$L is

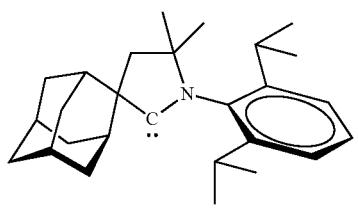

and Tf is $CF_3$—$SO_2$—.

The complexes have a coordination number of 2. They are preferably electrically neutral, that is to say the metal M is present in the oxidation state (+I) and the monoanionic ligand X balances that charge. The carbene ligand L preferably has a neutral charge but may optionally carry an anionic (negatively charged) substituent.

The carbene site of the ligand L provides a strong electron donating effect towards the metal atom M. The strong electron donation raises the energy of the d-orbitals on the metal atom M in the complex. Without wishing in any way to be bound by theory, it is hypothesized that this increase in the energy of the d-electrons of the metal facilitates the excitation process, for example facilitates metal-to-ligand charge transfer during the excitation process. The carbene C atom has an empty p-orbital which can act as electron acceptor. In copper complexes excited $S^1$ singlet and $T^1$ triplet states are close in energy, and there is the possibility that a thermal equilibrium between these two states is established. Population of the $S^1$ state enables the excited complex to return to the $S^0$ ground state without change in the electron spin, which is allowed by quantum theory, whereas relaxation from the triplet state would be spin-forbidden. Apart from increasing the quantum yield of copper complexes up to values approaching 100% by allowing an emission pathway from the $S^1$ state, this excitation-relaxation mechanism also reduces the lifetime of the excited state to a value of the order of 20 microseconds or less, which is crucial for efficient OLED devices. In previously known emitter complexes the excited $S^1$ singlet state is higher in energy than the excited $T^1$ triplet state. In an electroluminescent device the triplet energy is lost, unless the $S^1$ and $T^1$ states are close in energy, and the exciton energy can be harvested by a process known as thermally-activated delayed fluorescence, which is well documented in the art. It has now been found that compounds of the present invention may show properties which indicate that the excited $T^1$ state is at higher energy than the $S^1$ state, and that the two states are related by rotation of parts of the molecule. When these compounds are used as emitter materials in electroluminescent devices, this property allows all the exciton energy to be harvested and results in high internal quantum yields of up to 100%. Another beneficial aspect of this property is that the excited state lifetimes are very short, of the order of nanoseconds to low microseconds, so that emissive devices with high brightness can be constructed. Relaxation from triplet states, on the other hand, is typified by phosphorescence, with excited state lifetimes of the order of ten to hundreds of microseconds, for example of the order of 100 microseconds, or more.

According to a second aspect, the present invention provides a light-emitting device comprising, in sequence, an anode, optionally a hole-transporting zone, an emissive zone capable of emitting light when an electric current flows between the cathode and the anode, and a cathode, wherein the emissive zone capable of emitting light comprises at least one complex of the following Formula Ia:

(L)M(X),  (Ia)

in which
M is a metal atom selected from copper, silver and gold;
L is a cyclic alkyl amino carbene (CAAC) ligand having a saturated cyclic structure in which the atoms of the ring which includes the carbene site consist of carbon atoms and one nitrogen atom;
and
X is a monoanionic ligand.

In an example of the light-emitting device of the second aspect of the present invention, a hole-transporting zone is present.

In a further example of the light-emitting device of the second aspect of the present invention, a hole-transporting zone and an electron-transporting zone (also known as electron-injection zone) are present, the electron-transporting zone being disposed between the emissive zone and the cathode.

According to a third aspect, the present invention provides a method of preparing complexes of Formula I according to the first aspect of the invention or complexes of Formula Ia for use in a light-emitting device according to the second aspect of the invention, the method comprising:

A.
contacting a compound of Formula II:

M-X     (II)

with the CAAC compound L in a solvent;
and recovering the complex of Formula I or Ia;
wherein L, M and X are as defined for the first and second aspects of the present invention; or B.
when M is copper and X is optionally substituted arylacetylide, optionally substituted aryloxide, or optionally substituted aryl amide,
contacting a CAAC compound of Formula Ib:

L-Cu—X'     (Ib)

in which L is as defined for the first and second aspects of the present invention and X' is Cl, OH or O$^t$Bu
with a compound of formula V

X—H     (V)

in which X is optionally substituted arylacetylide, optionally substituted aryloxide, or optionally substituted aryl amide, in a solvent, and recovering the complex of Formula I or Ia; or C.
when M is gold,
contacting a CAAC compound of Formula Ic:

L-Au—X'     (Ic)

in which L is as defined for the first and second aspects of the present invention and X' is Cl or OH or O$^t$Bu
with a compound of formula Va

X—H     (Va)

in which X is optionally substituted aryl amide having the formula

R'—N—R" or N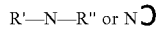

in which R' and R" are selected from hydrogen and organic groups, which when both organic groups may be the same or different; provided that at least one of R and R" is aryl;
and ⊃ represents a cyclic organic group which may contain one or more rings;
provided that the cyclic organic group is such that the compound of formula Va is an optionally substituted aryl amide;
in a solvent, and recovering the complex of Formula I or Ia.

In the method according to the third aspect of the present invention, M and X in the compound of Formula II each has the same exemplification and preferences as described below for the complex of Formula I or Ia. One preference for X in the compound of Formula II in which M is selected from copper, gold and silver is therefore halide. Suitable examples of such compounds of Formula II are copper (I) chloride, copper (I) bromide, copper (I) iodide, silver chloride, silver bromide and silver iodide. For details of preferences and exemplifications of M and X in the compound of Formula II, please see the description below, including the Examples below of the specific complexes that have been prepared.

The inventors have investigated the photoemissive properties of complexes of Formula I according to the first aspect of the present invention and complexes of Formula Ia as defined in the second aspect of the present invention.

We have found that certain complexes of the present invention exhibit a surprisingly high quantum efficiency of the photoemission, for example electroluminescence or photoluminescence, when the following combination of features occurs:

1. the complex is linear and two-coordinate, as in all complexes of the (L)M(X) geometry;
2. the monoanionic ligand X includes an atom A which is displaced from the linear axis of the complex defined by the (L)M(X) geometry, whereby a plane P1 of the ligand X is defined which includes M, the atom of X which is ionically bound to M on the linear axis of the complex, and A;
3. the plane P1 is rotatable in the solid state of the complex, relative to the plane P2 of the ring of the CAAC which includes the carbene site and consists of carbon atoms and one nitrogen atom, as a result of rotation of ligand X about the linear axis of the complex, the relative angle between the planes P1 and P2 being termed the dihedral angle;
4. the excited $S^1$ singlet state of the complex is associated with a different dihedral angle than the ground $S^0$ singlet state and the excited $T^1$ triplet state;
5. the excited $T^1$ triplet state of the complex is energetically higher than the excited $S^1$ singlet state; and
6. the energy gap $E_g$ between the highest occupied molecular orbital (HOMO) and the lowest unoccupied molecular orbital (LUMO) of the CAAC ligand is small relative to CAAC complexes of the same metal M with other CAACs, for example less than or equal to about 5.0 eV, more preferably less than or equal to about 3.5 eV, for example less than or equal to about 3.0 eV.

We have found that, with this combination of features 1 to 6, very high external quantum efficiencies of photoemissive materials and devices, particularly electroluminescent devices and OLEDs, can be obtained, in excess of about 10%, preferably 15%, for example in excess of 20%, with short excitation lifetimes. Short excitation lifetimes are desirable for OLEDs since this allows fast light output and hence bright OLEDs, and avoids saturation when a higher excitation density leads to lower efficiency. The internal quantum efficiencies of these photoemissive materials are believed to approach 100%.

Without wishing to be bound by theory, it is believed that the very high quantum yields arise by a mechanism which we term "rotationally accessed spin-state inversion" or RASI photoemission. We presently believe that RASI photoemission arises in the following manner:

in the ground $S^0$ state the CAAC and X ligands have a first dihedral angle between them; in the data presented in Example 29, for example, the first dihedral angle is about 0-20° (almost coplanar);

in the excited $T^1$ state the CAAC and X ligands have a second dihedral angle between them, which may be the same as or different from the first dihedral angle; in the data presented in Example 29, for example, the second dihedral angle is about 0-20° (almost coplanar), in other words about the same as the first dihedral angle;

in the excited $S^1$ state, the CAAC ligand and X ligands have a third dihedral angle between them, which may be the same as or different from the first and/or the second dihedral angle; in the data presented in Example 29, for example, the third dihedral angle is almost 90°, in other words almost orthogonal to the first and third dihedral angles;

when the molecule is energetically excited in the solid state (e.g. crystal or frozen at low temperatures, so that there is no continuous rotation of the X ligand), an electron will be promoted to a vibrationally excited $S^{1*}$ state which has the first dihedral angle and has a higher energy than $T^1$ and $S^1$;

without rotation, the vibrationally excited molecule has the option to relax, either directly to the ground $S^0$ state (fluorescence) or first to the $T^1$ state and subsequently to the ground $S^0$ state (phosphorescence); however, relaxation from the $S^{1*}$ to the $T^1$ state requires a change in spin, which is in principle quantum-mechanically forbidden, and relaxation from the $T^1$ state to ground $S^0$ state requires a further spin change and is typically a slow process;

in RASI photoemission the excited $S^1$ singlet state of the complex is accessed by geometrical relaxation of the molecule through rotation of the plane P2 to the third dihedral angle; this may be an energetically more favoured pathway than the options of the previous paragraph occurring without rotation;

photoemission by fluorescence results from the subsequent relaxation from the $S^1$ state to the ground $S^0$ state;

furthermore, as the dihedral angle changes from the first to the third, and the energy level of the molecule changes from $S^{1*}$ to $S^1$, the first being higher than the triplet state $T^1$ and the second being lower than the triplet state $T^1$, it follows that at an intermediate point in the process there is only a very small difference between energy levels of the excited singlet and excited triplet state of the molecule—in the data presented in Example 29, for example, this occurs at a dihedral angle of about 30°; at that point, inter-system crossing (ISC) can be very fast, so that triplet $T^1$ excitations can be efficiently converted to singlet $S^1$ and vice versa, providing near-100% quantum yields in electroluminescence and short excitation lifetimes. This ISC from normally non-emissive triplet excitons to the singlet state is believed to be assisted in the case of copper and gold complexes by spin-orbit coupling due to occupation of Cu or Au sites by the excited state wave functions, causing the different spin states to mix more effectively than normal.

As described in more detail in Example 29, the evidence supports this theoretical explanation. If $S^1$ in the tested molecules is of lower energy than $T^1$, as we believe, the population of $S^1$ will increase as the temperature is increased above 4K. This means that more and more of the emission is at a longer wavelength than that from $T^1$ (red-shift, or down-conversion). This is what is observed.

The RASI pathway for photoemission is generally applicable to organometallic complexes which have the required combination of features discussed as 1 to 6 above, and constitutes the basis for further aspects of the present invention.

According to a fourth aspect, the present invention provides a light-emitting device comprising an emissive zone capable of emitting light in response to introduced energy, wherein the emissive zone capable of emitting light comprises at least one organometallic complex which exhibits RASI photoemission.

In an embodiment, the light-emitting device according to the fourth aspect of the present invention may be an OLED. We term an OLED employing RASI photoemission a ROLED or a molecular rotation-based OLED.

According to a fifth aspect, the present invention provides a method of generating light comprising:

determining by specific investigation that at least one organometallic complex exhibits RASI photoemission;

providing a light-emitting device comprising an emissive zone capable of emitting light in response to introduced energy, wherein the emissive zone capable of emitting light comprises at least one organometallic complex which has been so determined to exhibit RASI photoemission; and introducing energy to the said light-emitting device to generate light.

According to a sixth aspect, the present invention provides the use of at least one organometallic complex which has been determined by specific investigation to exhibit RASI photoemission, in a light-emitting device for generating light.

In an embodiment of the fourth, fifth and/or sixth aspects of the present invention, the organometallic complex(es) which exhibit(s) RASI photoemission may have at least the following combination of features:

1. the complex is linear and two-coordinate, and consists of a carbene ligand L', a transition metal atom M' to which the carbene ligand L' is complexed via the carbene carbon atom, and a monoanionic ligand X' in a linear geometry;
2. the monoanionic ligand X' includes an atom A1 which is displaced from the linear axis of the complex defined by the linear (L')M'(X') geometry, whereby a plane P1 of the ligand X' is defined which includes M', the atom of X' which is ionically bound to M' on the linear axis of the complex, and A1;
3. the carbene ligand L' includes an atom A2 which is displaced from the linear axis of the complex defined by the linear (L')M'(X') geometry, whereby a plane P2 of the carbene ligand L' is defined which includes M', the atom of L' which is coordinated to M' on the linear axis of the complex, and A2;
4. the plane P1 is rotatable in the solid state of the complex, relative to the plane P2, the relative angle between the planes P1 and P2 being termed the dihedral angle;
5. the excited $S^1$ singlet state of the complex has been determined by specific investigation to be associated with a different dihedral angle than the ground $S^0$ singlet state and the excited $T^1$ triplet state;
6. the excited $T^1$ triplet state of the complex has been determined by specific investigation to be energetically higher than the excited $S^1$ singlet state; and
7. the energy gap $E_g$ between the highest occupied molecular orbital (HOMO) and the lowest unoccupied molecular orbital (LUMO) of the carbene ligand L' has been determined by specific investigation to be less than or equal to about 5.0 eV.

More preferably, the energy gap $E_g$ between the HOMO and the LUMO of the carbene ligand L' is less than or equal to about 3.5 eV, for example less than or equal to about 3.0 eV.

The organometallic complex used in the fourth, fifth and/or sixth aspects of the present invention can be or include any organometallic complex provided that it exhibits RASI photoemission.

In the organometallic complex used in the fourth, fifth and/or sixth aspects of the present invention the carbene ligand L' may be any carbene ligand that provides the required RASI photoemission. Without limitation, the carbene ligand L' may be as defined for L in relation to the complexes of Formula I or Ia of the present invention.

In the organometallic complex used in the fourth, fifth and/or sixth aspects of the present invention the metal atom M' may be any transition metal atom that provides the required RASI photoemission. Without limitation, the metal atom M' may be as defined for M in relation to the complexes of Formula I or Ia of the present invention.

In the organometallic complex used in the fourth, fifth and/or sixth aspects of the present invention the monoanionic ligand X' may be any monoanionic ligand that provides the required RASI photoemission. Without limitation, the monoanionic ligand X' may be as defined for X in relation to the complexes of Formula I or Ia of the present invention.

The at least one organometallic complex used in the fourth, fifth and/or sixth aspects of the present invention may be or comprise at least one complex according to Formula I or Ia as described herein.

In an embodiment of the fourth, fifth and/or sixth aspects of the present invention, the organometallic complex which exhibits RASI photoemission has been determined by specific investigation to be an organometallic complex in which, when the molecule is energetically excited in the solid state, an electron will be promoted to a vibrationally excited $S^1*$ state which has a higher energy than $T^1$ and $S^1$.

In a further embodiment of the fourth, fifth and/or sixth aspects of the present invention, the organometallic complex which exhibits RASI photoemission has been determined by specific investigation to be an organometallic complex in which the excited $S^1$ state of the complex is accessed from the vibrationally excited $S^1*$ state by geometrical relaxation of the molecule through rotation of the plane P2 to the third dihedral angle, whereby photoemission by fluorescence results from the subsequent relaxation from the $S^1$ state to the ground $S^0$ state.

In a still further embodiment of the fourth, fifth and/or sixth aspects of the present invention, the organometallic complex which exhibits RASI photoemission has been determined by specific investigation to be an organometallic complex in which, as the dihedral angle changes by rotation of the plane P2 to the third dihedral angle, and the energy level of the molecule changes from $S^1*$ to $S^1$, the first being higher than the triplet state $T^1$ and the second being lower than the triplet state $T^1$, at an intermediate point in the process the energy levels of the excited singlet and excited triplet state of the molecule are equal.

The at least one organometallic complex which exhibits RASI photoemission, used in the light-emitting device according to the fourth aspect of the present invention, provided in the method according to the fifth aspect of the present invention, or used in the sixth aspect of the present invention, may suitably be at least one complex according to the first aspect of the present invention.

The light-emitting device according to the fourth aspect of the present invention, provided in the method according to the fifth aspect of the present invention, or used in the sixth aspect of the present invention, may be a photoluminescent device or an electroluminescent device, for example a ROLED.

When the light-emitting device according to the fourth aspect of the present invention, provided in the method according to the fifth aspect of the present invention, or used in the sixth aspect of the present invention, is an electroluminescent device, it may suitably comprise, in sequence, an anode, optionally a hole-transporting zone, the emissive zone as defined in the fourth aspect of the present invention, and a cathode. In one embodiment of this device, an electron-transporting zone is provided between the emissive zone and the cathode.

Further, the present invention and the *Chem. Commun.*, 2016, 52, 6379-6382 reference cited above have shown that the complexes of Formula I exhibit prompt (lifetime up to about 0.3 ns) photoluminescence in potentially high quantum yield. This finding is surprising and provides a further aspect of the present invention. Furthermore, the photoluminescence is observed in complexes where X=halide, namely lacking a plane P1.

According to a seventh aspect, the present invention provides a light-emitting device comprising an emissive zone capable of emitting light in response to introduced energy, wherein the emissive zone capable of emitting light comprises at least one organometallic complex of Formula I or Ia as defined in the first and second aspects of the present invention.

According to an eighth aspect, the present invention provides the use of at least one organometallic complex of Formula I or Ia as defined in the first and second aspects of the present invention, in a light-emitting device for generating light.

The light-emitting device according to the seventh aspect of the present invention or used in the eighth aspect of the present invention may be a photoluminescent device or an electroluminescent device, for example a ROLED.

When the light-emitting device according to the seventh aspect of the present invention or used in the eighth aspect of the present invention is an electroluminescent device, it may suitably comprise, in sequence, an anode, optionally a hole-transporting zone, the emissive zone as defined in the fourth aspect of the present invention, and a cathode. In one embodiment of this device, an electron-transporting zone is provided between the emissive zone and the cathode.

For the purposes of territories which do not provide a grace period exempting the prior art effects of the *Chem. Commun.*, 2016, 52, 6379-6382 reference cited above, the light-emitting device referred to in connection with the seventh and eighth aspects of the present invention may exclude photoluminescent and optionally other devices in which the sole photoemissive organometallic complex of Formula I or Ia present in the device is one or more complex selected from complexes having the formula $^{Ad}$L-M-X and individually designated 1a, 1b, 1c, 2a, 2b and 2c according to the following scheme:

M = Cu (1), Au (2)
X = Cl (a), Br (b), I (c)

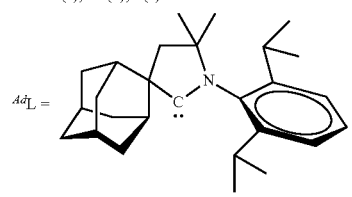

For the same territorial purposes as described in the preceding paragraph, the light-emitting device referred to in connection with the seventh and eighth aspects of the present invention may exclude photoluminescent and optionally other devices in which any photoemissive organometallic complex of Formula I or Ia present in the device is one or more complex selected from the said complexes having the formula $^{Ad}$L-M-X and individually designated 1a, 1b, 1c, 2a, 2b and 2c.

In the following detailed description of the invention, and in the claims, all embodiments, examples, preferences and details provided in relation to one aspect of the present invention shall, individually and in any combination of two or more, be understood as being equally applicable to, and as being described in relation to, any other aspect or any and all other aspects of the invention.

DETAILED DESCRIPTION OF THE INVENTION

Complexes of Formula I and Ia
Metal (M)

In the complexes of Formula I and Ia, the metal atom M may be selected from copper, silver and gold.

The oxidation state of M in the complexes may be (+I). The coordination number in the complexes is 2, that is, a linear configuration of metal and ligands.

CAAC Ligand (L)

In the definition of the ligand L, the expression "a cyclic alkyl amino carbene (CAAC) ligand having a saturated cyclic structure in which the atoms of the ring which includes the carbene site consist of carbon atoms and one nitrogen atom" does not exclude the possibility that cyclic or non-cyclic structures which are not saturated may be linked to the ring which includes the carbene site. Such additional cyclic or non-cyclic structures may, for example, include aromatic rings. The expression "the atoms of the ring which includes the carbene site consist of carbon atoms and one nitrogen atom" refers to the atoms actually forming the ring which includes the carbene site, and does not exclude the possibility that atoms other than carbon and nitrogen may be linked to one or more of those ring-forming atoms, for example in substituent groups.

The CAAC ligand L is preferably a compound of Formula III:

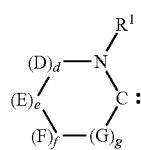

(III)

in which
R$^1$ is selected from an optionally substituted alkyl group, an optionally substituted alkenyl group, an optionally substituted aryl group, and an optionally substituted heteroaryl group;
D, E, F and G are independently selected from >CR'R", where R' and R" are, independently of each other and independently as between their occurrence as the different groups D, E, F and G, selected from hydrogen atoms or optionally substituted alkyl groups (for example, alkyl groups with 1-20 carbon atoms), or R' and R" are connected to form an optionally substituted saturated cyclic hydrocarbyl group, which may optionally contain more than one ring and/or one or more heteroatom; and
d, e, f and g, independently from one another, are selected from 0, 1, 2, 3, 4, 5 and 6; provided that the compound of Formula III is cyclic.

When R' and R" are connected to form an optionally substituted saturated cyclic hydrocarbyl group, which may optionally contain more than one ring and/or one or more heteroatom, a spiro compound L results.

When R$^1$ is an optionally substituted aryl or an optionally substituted heteroaryl group, it may for example be an optionally substituted phenyl, carbazole, indole, benzindole, benzofuran, dibenzofuran, benzothiophene, azacarbazole, azabenzofuran or azadibenzothiophene group. When substituted, the aryl or heteroaryl group may, for example, carry from 1 to 5 substituents, which may be chosen, independently of each other, from optionally substituted alkyl, for example unsubstituted alkyl; optionally substituted alkenyl, for example unsubstituted alkenyl; optionally substituted alkynyl, for example unsubstituted alkynyl; optionally substituted alkoxy, for example unsubstituted alkoxy; optionally substituted amino, for example unsubstituted amino; optionally substituted aryl, for example unsubstituted, mono- or di-substituted aryl; or optionally substituted heteroaryl, for example unsubstituted or N-substituted heteroaryl. The example of a disubstituted phenyl group carrying two substituents in the 2- and 6-positions is specifically mentioned. In that example, the two substituents may be the same. The two substituents may suitably be alkyl, for example selected from methyl, ethyl, n-propyl, isopropyl, n-butyl, sec-butyl iso-butyl and tert.-butyl, which two alkyl groups are suitably the same as each other. When R$^1$ is a substituted phenyl group it may suitably be substituted by two isopropyl groups at the 2- and 6-positions. Where the heteroaryl group contains a nitrogen atom, the nitrogen may suitably be substituted by an alkyl group. The example of a substituted carbazole group carrying an alkyl substituent at the N atom (N-alkylcarbazole) is specifically mentioned.

In the moiety >CR'R", the symbol > represents the two single bonds of the carbon atom C, one single bond to each of the two adjacent atoms of the ring system.

Where R' and R" are linked to form an optionally substituted saturated cyclic hydrocarbyl group which may optionally contain one or more heteroatom, the cyclic hydrocarbyl group may, for example, include one or more rings with 3-10 members, most preferably rings of six members, wherein the expression "members" refers to carbon atoms of the ring backbone and any heteroatoms present. The optionally substituted saturated cyclic hydrocarbyl group may, for example, be an optionally substituted C$_{3-8}$ cycloalkyl group; for example, >CR'R" may represent a cyclohexylidene moiety, otherwise known as a spirocyclohexane ring. Where more than one ring is present in the moiety >CR'R", they may be fused rings, which may if desired provide a cage structure; for example, >CR'R" may represent an adamantylidene moiety, otherwise known as a spiroadamantane ring system.

In one embodiment of Formula III, D, E, G, d, e, g, and f are as defined above and F is >CR$^f$R$^{ff}$, in which R$^f$ and R$^{ff}$, which may be the same or different, are selected from optionally substituted alkyl groups with 1-10 C atoms, or R$^f$, R$^{ff}$ and the carbon atom C to which they are linked form an optionally substituted cyclic hydrocarbyl group optionally containing one or more heteroatom in the ring. The optionally substituted saturated cyclic hydrocarbyl group may, for example, be an optionally substituted C$_{3-8}$ cycloalkyl group (for example, >C$R^fR^{ff}$ may represent a cyclohexylidene moiety or spirocyclohexane ring).

In another embodiment, D, E, G, d, e, g, and f are as defined above and F is >CMe$_2$.

In another embodiment, D, E, G, d, e, g, and f are as defined above and F is >C$R^fR^{ff}$, in which $R^f$ and $R^{ff}$ and the carbon atom C to which they are linked form an optionally substituted fused bi-, tri- or poly-cyclic hydrocarbyl group optionally containing one or more heteroatom in at least one of the rings, for example a cage structure. In an example of this, F is an optionally substituted cycloalkylidene group (spirocycloalkane ring), preferably an unsubstituted adamantylidene group (spiroadamantane ring system).

In a preferred embodiment of Formula III, d=e=f=1 and g=0.

In one embodiment of Formula III where d=e=f=1 and g=0, D=>C$R^dR^d$, where $R^d$=alkyl with 1-10 C atoms, preferably methyl, E=>CH$_2$, and F is >CR'R" or >C$R^fR^{ff}$ as defined above.

Particular embodiments of Formula III which may be mentioned are those in which:
$R^1$ is selected from an optionally substituted alkyl group, an optionally substituted alkenyl group, an optionally substituted aryl group and an optionally substituted heteroaryl group (for example an optionally substituted phenyl group; for example a disubstituted phenyl group carrying two alkyl substituents in the 2- and 6-positions, more preferably wherein the two substituents are the same, and more preferably wherein the two substituents in the 2- and 6-positions of the phenyl group are both isopropyl);
d=e=f=1 and g=0;
D=>C$R^dR^d$, where $R^d$=alkyl with 1-10 C atoms (for example methyl);
E=>CH$_2$; and
F is >C$R^fR^{ff}$, in which
  $R^f$ and $R^{ff}$, which may be the same or different, are selected from optionally substituted alkyl groups with 1-10 C atoms (for example unsubstituted methyl, ethyl, n-propyl, isopropyl, n-butyl, sec-butyl iso-butyl and tert.-butyl, and more preferably where $R^f$ and $R^{ff}$ are the same); or
  $R^f$, $R^{ff}$ and the carbon atom C to which they are linked form an optionally substituted cyclic hydrocarbyl group optionally containing one or more heteroatom in the ring (for example (i) a substituted or unsubstituted 6-membered ring, for example a substituted or unsubstituted cyclohexylidene group (spirocyclohexane ring), more preferably an unsubstituted cyclohexylidene group; or (ii) an optionally substituted fused bi-, tri- or poly-cyclic hydrocarbyl group optionally containing one or more heteroatom in at least one of the rings, for example a cage structure, more preferably an optionally substituted adamantylidene group (spiroadamantane ring system), for example an unsubstituted adamantylidene group).

The CAAC ligand L may, for example, be a compound of Formula IIIa:

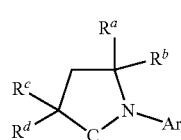

(IIIa)

wherein $R^a$, $R^b$, $R^c$ and $R^d$ are CH$_3$ groups, and Ar represents a substituted phenyl group, for example a substituted phenyl group in which the one or more substituents are independently selected from the options set out in the discussion of the term "optionally substituted" below (more preferably a 2,6-dialkyl substituted phenyl group, and most preferably a 2,6-diisopropylphenyl group).

In another embodiment, the CAAC ligand L may be a spiroadamantane compound of Formula IIIb:

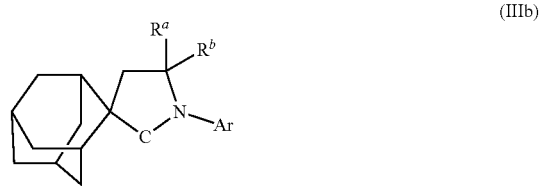

(IIIb)

wherein $R^a$ and $R^b$ are CH$_3$ groups and Ar represents a substituted phenyl group, for example a substituted phenyl group in which the one or more substituents are independently selected from the options set out in the discussion of the term "optionally substituted" below (more preferably a 2,6-dialkyl substituted phenyl group, and most preferably a 2,6-diisopropylphenyl group).

In further embodiments, the CAAC ligand L may be selected from the following group of compounds:

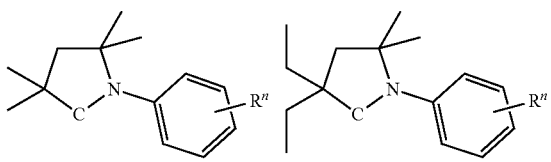

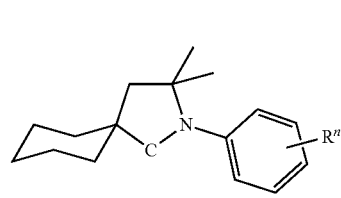

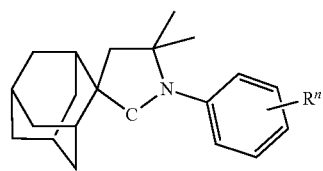

where $R^n$ represents a variable number n of 1-4 substituents, each of which is independently selected from the group comprising hydrogen, alkyl, alkenyl, alkynyl, alkoxy, amino, aryl and heteroaryl. Preferably, n=2 and the 2- and 6-positions in the N-bound aryl ring are occupied by substituents R, which substituents R are preferably the same. More preferably, the substituents in 2- and 6-positions are isopropyl groups.

In the Examples below which refer to the CAAC ligand L $^{Ad}$CAAC, this is

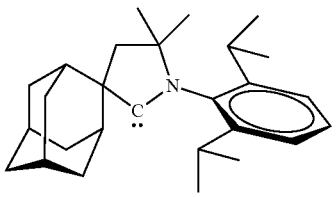

Please see below, for more detailed discussion of the expressions "optionally substituted", "alkyl", "alkenyl", "alkynyl", "aryl", "heteroaryl", "alkoxy" and "hydrocarbyl".

Where the carbene ligand L includes one or more chiral carbon atom, all individual stereoisomers and stereoisomeric mixtures, for example enantiomers and racemic mixtures, of the chiral forms are within the scope of the present invention. Tautomers of the ligand L are also encompassed within the scope of the definitions herein.

Monoanionic Ligand (X)

In the complexes of part A of the definition of Formula I of the present invention, and in the definition of Formula Ia, X is a monoanionic ligand. Any inorganic or organic monoanion can be used, provided that the required 2-coordination complex of Formula I is obtained.

The ligand X may, for example, be selected from a halide, pseudo-halide, optionally substituted alkoxide (for example unsubstituted alkoxide), optionally substituted aryloxide (for example unsubstituted aryloxide), optionally substituted arylacetylide (for example, unsubstituted phenylacetylide), optionally substituted amide (for example, unsubstituted amide), optionally substituted carboxylate (for example, unsubstituted carboxylate), optionally substituted anilide (for example, unsubstituted anilide), optionally substituted carbazole derivative, optionally substituted dihydroacridine, optionally substituted azepine, optionally substituted dibenzazepine, optionally substituted 10,11-dihydrodibenzazepine, optionally substituted phenazine, optionally substituted oxazine, optionally substituted acridone, optionally substituted phenoxazine, optionally substituted phenothiazine, optionally substituted phenothiazine 5,5-dioxide, optionally substituted dihydrophenazine, optionally substituted thiolate (for example, unsubstituted thiolate), optionally substituted thiophenolate (for example, unsubstituted thiophenolate), optionally substituted thiocarboxylate (for example, unsubstituted thiocarboxylate), optionally substituted phosphiniminate (for example, unsubstituted phosphiniminate), optionally substituted ketiminate (for example, unsubstituted ketiminate), optionally substituted guanidinate (for example, unsubstituted guanidinate), optionally substituted alkyl, optionally substituted alkenyl, optionally substituted aryl, optionally substituted heteroaryl (for example, pyrrolate, imidazolate, indolate and the like) and optionally substituted alkynyl.

Ligands X May be Compounds of Formula IV $$[E\text{-}Ar]^-  \qquad (IV)$$

wherein Ar is an optionally substituted aryl or optionally substituted heteroaryl group, and E– is selected from $C(R^1)(R^2)$—, O—, S—, Se—, Te—, N(R)—, P(R)—, As(R)— and Sb(R)—, in which R, $R^1$ and $R^2$ are independently chosen from hydrogen, optionally substituted alkyl, optionally substituted alkenyl, optionally substituted allyl, optionally substituted aryl and optionally substituted heteroaryl. R, $R^1$ and $R^2$ groups, when present, may optionally be directly linked to the Ar moiety by one or more linker species as well as via the said C, N, P, As or Sb atom. The said linker species may suitably be selected from optionally substituted hydrocarbyl (for example, optionally substituted >CH$_2$, optionally substituted —CH=CH—, optionally substituted —CH$_2$—CH$_2$-ethylene), optionally substituted aryl (for example, optionally substituted —C$_6$H$_4$—, for example unsubstituted —C$_6$H$_4$—), O, S, NR', SO, SO$_2$ and AsR', in which R' is selected from hydrogen, optionally substituted alkyl, optionally substituted alkenyl, optionally substituted allyl, optionally substituted aryl and optionally substituted heteroaryl.

Halides may suitably be selected from chlorides, bromides and iodides.

Examples of pseudo-halides are cyanide, thiocyanate (SCN), cyanate (OCN), isocyanate (NCO) and isothiocyanate (NCS), isoselenocyanate (NCSe).

Examples of $[N(R)\text{—}Ar]^-$ ligands X include NHPh and NPh$_2$ where Ph=phenyl, NH(3,5-bis(trifluoromethyl)phenyl), and carbazolate. Examples of $[O\text{—}Ar]^-$ ligands X include OPh where Ph=phenyl, O-(2,6-difluorophenyl), O-(2-tert.butyl-5-methylphenyl) and O-(3,5-di-tert.butylphenyl). An example of a suitable $[S\text{—}Ar]^-$ ligand X is SPh where Ph=phenyl.

In the Examples below, Cz refers to carbazolate and DTBCz refers to 3,6-di-$^t$butylcarbazolate.

Examples of alkoxides for use as ligand X include, but are not limited to, linear or branched chain alkoxides having from 1 to 20 carbon atoms.

Examples of aryl oxides for use as ligand X include, but are not limited to, phenolate, 2-methylphenolate, 2-tert.butyl-5-methylphenolate, 2,6-dimethylphenolate, 3,5-dimethylphenolate, 3.5-di-t-butylphenolate, 3,5-bis(trifluoromethyl)phenolate, 2-chlorophenolate, 2,6-dichlorophenolate, 2,6-difluorophenolate, 2,6-dibromophenolate, 2,6-diiodophenolate, 4-fluorophenolate, 4-trifluoromethylphenolate, 1-naphtholate, 2-naphtholate, and the like. Furthermore, the aryloxide ligand may be substituted by one or more of carbazolyl, (N-alkyl)carbazolyl or (N-aryl)carbazolyl substituents, where each carbazolyl moiety may carry one or more of prim.-, sec.- or tert.-alkyl substituents or any combination thereof.

Examples of thiolates for use as ligand X include, but are not limited to, linear or branched chain thiolates having from 1 to 20 carbon atoms.

Examples of thiophenolates for use as ligand X include, but are not limited to, thiophenolate, 2-methylthiophenolate, 2-tert.butyl-5-methylthiophenolate, 2,6-dimethylthiophenolate, 3,5-dimethylthiophenolate, 3.5-di-t-butylthiophenolate, 3,5-bis(trifluoromethyl) thiophenolate, 2-chlorothiophenolate, 2,6-dichlorothiophenolate, 2,6-difluorothiophenolate, 2,6-dibromothiophenolate, 2,6-diiodothiophenolate, 4-fluorothiophenolate, 4-trifluoromethylthiophenolate, 1-thionaphtholate, 2-thionaphtholate, and the like. Furthermore, the thiophenolate ligand may be substituted by one or more of carbazolyl, (N-alkyl)carbazolyl or (N-aryl)carbazolyl substituents, where each carbazolyl moiety may carry one or more prim.-, sec.- or tert.-alkyl substituents or any combination thereof.

When X is a carboxylate group represented by RCOO$^-$ or a thiocarboxylate group represented by RCSO$^-$, the group R in those representations may, for example, be chosen from alkyl, alkenyl, aryl and heteroaryl.

When X is a phosphiniminate represented by $R^{1'}R^{2'}R^{3'}PN^-$, $R^{1'}$, $R^{2'}$ and $R^{3'}$ in that representation may independently be chosen from alkyl, alkenyl, aryl and heteroaryl substituents, for example $R^{1'}$, $R^{2'}$, $R^{3'}$=alkyl or branched alkyl with 1-20 C atoms, and preferably $R^{1'}$=$R^{2'}$=$R^{3'}$=tert.-butyl.

In another embodiment of the invention, X can be a ketiminate represented by $R^{1''}R^{2''}CN^-$, in which $R^{1''}$ and $R^{2''}$ may independently be chosen from one or more alkyl, alkenyl, aryl and heteroaryl groups.

In another embodiment, X may be a guanidinate represented by $[(R^{1'''}R^{2'''}N)C(NR^{3'''})(NR^{4'''})]^-$, in which $R^{1'''}$, $R^{2'''}$, $R^{3'''}$ and $R^{4'''}$ are independently chosen from one or more alkyl, alkenyl, aryl and heteroaryl groups.

In another preferred embodiment of the present invention, the ligand X is an optionally substituted amide group having the following general formula in which the nitrogen atom N is an amide anionic nitrogen:

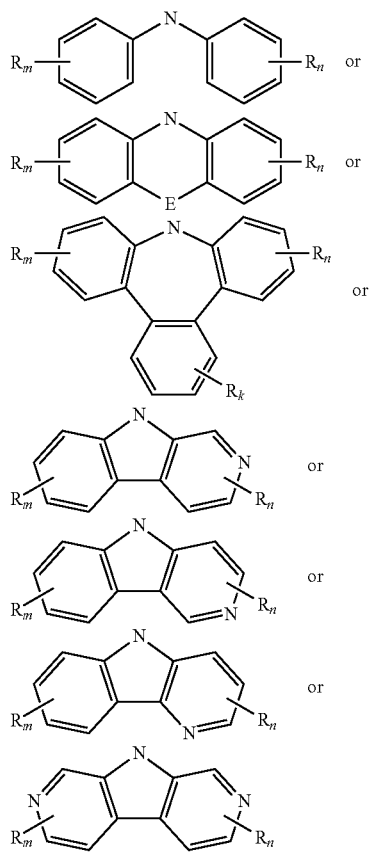

in which Rn, Rm and Rk represent optional substituents of the respective aromatic rings, in which n, m and k are numbers from 0 to the maximum available and in each case the presence, number, position and/or identity of the said substituents may be the same or different as between different aromatic ring moieties; and, where n, m or k is more than 1, the identity of each R group of the substituents of a particular aromatic ring moiety may be the same or different as between each other; and E is a bond or is a group selected from optionally substituted hydrocarbyl [for example, optionally substituted >CH$_2$, optionally substituted —CH=CH—, optionally substituted —CH$_2$—CH$_2$— ethylene, optionally substituted aryl (for example, optionally substituted —C$_6$H$_4$—, for example unsubstituted —C$_6$H$_4$—)], O, S, NR', SO, SO$_2$ and AsR', in which R' is selected from hydrogen, optionally substituted alkyl, optionally substituted alkenyl, optionally substituted allyl, optionally substituted aryl and optionally substituted heteroaryl.

In embodiments of such optionally substituted amide groups, the ligand X may be a diarylamide or carbazolate anion. The aryl groups in the diarylamide anion or the aromatic rings in the carbazolate anion may each be optionally substituted. The diarylamide anion may, for example, be a diphenylamide anion (NPh$_2^-$), in which the phenyl groups are each optionally substituted by one or more substituents, the presence, number, position and/or identity of which may be the same or different between the two phenyl groups. The substituent(s), when present, is/are suitably selected from the groups set out below in the discussion of the expression "Optionally substituted". An example of a preferred diarylamide ligand X is a diphenylamide anion. The carbazolate anion may, for example, be a carbazolate anion in which the aromatic rings are each optionally substituted by one or more substituents, the presence, number, position and/or identity of which may be the same or different between the two aromatic rings. The substituent(s), when present, is/are suitably selected from the groups set out below in the discussion of the expression "Optionally substituted". Examples of preferred carbazolate ligands X are the carbazolate anion and the 3,6-di-t.butyl-carbazolate anion.

Substituents within the definitions of Rn, Rm and Rk, and substituents of the diarylamide and carbazolate anions referred to above, may for example be selected from the group of alkyl, aryl, alkenyl, alkynyl, each of which may optionally be substituted (such substituted forms including, for example: haloalkyl (for example, fluoroalkyl containing one or more fluorine atoms, for example perfluoroalkyl), haloalkenyl (for example, fluoroalkenyl containing one or more fluorine atoms, for example perfluoroalkenyl), haloaryl (for example, fluoroaryl containing one or more fluorine atoms, for example perfluoroaryl)), NMe$_2$, NO$_2$, SO$_3$H and COOH.

One particular example of the ligand X according to the preferred embodiments mentioned above is the substituted amide group having the following general formula:

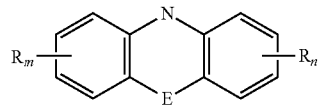

in which n and m are independently numbers from 1 to 4, for example n=m, and Rn and Rm are independently selected from fluoroalkyl, fluoroalkenyl and fluoroaryl, for example Rn is the same as Rm. In one example, Rn and Rm are the same as each other and are perfluoroalkyl.

In the complexes of part B of the definition of Formula I of the present invention, X is a monoanionic organic amide ligand having the formula

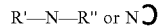

in which R' and R" are selected from hydrogen and organic groups, which when both organic groups may be the same or different;

and ⊃ represents a cyclic organic group which may contain one or more rings.

Any monoanionic organic amide ligand X according to this definition may be present, such as those monoanionic organic amide ligands described above in relation to part A of the definition of Formula I of the present invention.

Examples of complexes of Formula Ia used in the second aspect of the invention include those in which X is a monoanionic organic amide ligand having the formula

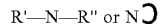

in which R' and R" are selected from hydrogen and organic groups, which when both organic groups may be the same or different;
and ⊃ represents a cyclic organic group which may contain one or more rings;
and more preferably those in which M is copper or gold and X is a monoanionic organic amide ligand having the formula

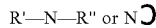

in which R' and R" are selected from hydrogen and organic groups, which when both organic groups may be the same or different;
and ⊃ represents a cyclic organic group which may contain one or more rings.

The expression "organic group" used herein refers to groups containing at least carbon covalently bonded to other atoms. When X in a complexes of Formula I or Ia is a monoanionic organic amide ligand having the formula

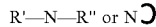

in which R' and R" are selected from hydrogen and organic groups, which when both organic groups may be the same or different;
and ⊃ represents a cyclic organic group which may contain one or more rings;
the organic group may preferably be an organic group containing at least carbon and hydrogen. Such an organic group may optionally contain one or more heteroatom, for example selected from B, N, O, P and S, and/or one or more halogen atom, for example selected from Cl, F and I.

In an embodiment of the complex of Formula Ia used in the second aspect of the present invention, M is copper;
L is a cyclic alkyl amino carbene (CAAC) ligand having a saturated cyclic structure in which the atoms of the ring which includes the carbene site consist of carbon atoms and one nitrogen atom;
and
X is a monoanionic organic amide ligand having the formula

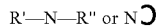

in which R' and R" are selected from hydrogen and organic groups, which when both organic groups may be the same or different;
and ⊃ represents a cyclic organic group which may contain one or more rings.

In another embodiment of the complex of Formula Ia used in the second aspect of the present invention, M is gold;
L is a cyclic alkyl amino carbene (CAAC) ligand having a saturated cyclic structure in which the atoms of the ring which includes the carbene site consist of carbon atoms and one nitrogen atom;
and
X is a monoanionic organic amide ligand having the formula

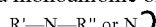

in which R' and R" are selected from hydrogen and organic groups, which when both organic groups may be the same or different;
and ⊃ represents a cyclic organic group which may contain one or more rings.

Please see below, for more detailed discussion of the expressions "optionally substituted", "alkoxide", "aryloxide", "amide", "thiolate", "phosphiniminate", "ketiminate", "guanidinate", "alkyl", "alkenyl", "aryl", "heteroaryl" and "alkynyl".

Alkyl

"Alkyl" means an aliphatic hydrocarbon group. The alkyl group may be straight or branched. "Branched" means that at least one carbon branch point is present in the group.

The alkyl group may suitably contain 1-20 carbon atoms, e.g. 2, 3, 4, 5, 6, 7, 8, 9, 10, 11, 12, 13, 14, 15, 16, 17, 18, 19 or 20 carbon atoms.

Exemplary alkyl groups include methyl, ethyl, n-propyl, i-propyl, n-butyl, t-butyl, s-butyl, n-pentyl, 2-pentyl, 3-pentyl, n-hexyl, 2-hexyl, 3-hexyl, n-heptyl, 2-heptyl, 3-heptyl, 4-heptyl, 2-methyl-but-1-yl, 2-methyl-but-3-yl, 2-methylpent-1-yl, 2-methylpent-3-yl.

The alkyl group may be optionally substituted, e.g. as exemplified below.

Derivative terms such as "alkoxy", "alkoxide" and "alkylidene" shall be understood correspondingly.

Cycloalkyl

"Cycloalkyl" means a cyclic non-aromatic hydrocarbon group. The cycloalkyl group may include non-aromatic unsaturation. Cycloalkyl groups may be mono- or polycyclic, and polycyclic cycloalkyl groups may be fused-ring, spiro, cage or combinations thereof.

The cycloalkyl group preferably has 3 to 20 carbon atoms, e.g. 3, 4, 5, 6, 7, 8, 9, 10, 11, 12, 13, 14, 15, 16, 17, 18, 19 or 20 carbon atoms.

Exemplary cycloalkyl groups include cyclopropyl, cyclobutyl, cyclopentyl, cyclohexyl, cyclopentenyl, cyclohexenyl norbornyl, adamantyl.

The cycloalkyl group may be optionally substituted, as defined below, e.g. as exemplified below.

Derivative terms such as "cycloalkylidene" shall be understood correspondingly.

Alkenyl

"Alkenyl" means an unsaturated aliphatic hydrocarbon group which contains one or more double bond. The alkenyl group may be straight or branched. "Branched" means that at least one carbon branch point is present in the group.

Any double bond may, independently of any other double bond in the group, be in either the (E) or the (Z) configuration.

The alkenyl group is preferably an alkenyl group, straight or branched, having 2 to 20 carbon atoms, e.g. 2, 3, 4, 5, 6, 7, 8, 9, 10, 11, 12, 13, 14, 15, 16, 17, 18, 19 or 20 carbon atoms.

Exemplary alkenyl groups include ethenyl, n-propenyl, i-propenyl, but-1-en-1-yl, but-2-en-1-yl, but-3-en-1-yl, pent-1-en-1-yl, pent-2-en-1-yl, pent-3-en-1-yl, pent-4-en-1-yl, pent-1-en-2-yl, pent-2-en-2-yl, pent-3-en-2-yl, pent-4-en-2-yl, pent-1-en-3-yl, pent-2-en-3-yl, pentadien-1-yl, pentadien-2-yl, pentadien-3-yl. Where alternative (E) and (Z) forms are possible, each is to be considered as individually identified.

The alkenyl group may be optionally substituted, e.g. as exemplified below.

Alkynyl

"Alkynyl" means an unsaturated aliphatic hydrocarbon group which contains one or more triple bond. The alkynyl group may be straight or branched. "Branched" means that at least one carbon branch point is present in the group.

The alkynyl group is preferably an alkynyl group, straight or branched, having 2 to 20 carbon atoms, e.g. 2, 3, 4, 5, 6, 7, 8, 9, 10, 11, 12, 13, 14, 15, 16, 17, 18, 19 or 20 carbon atoms.

Exemplary alkynyl groups include ethynyl, 1-propynyl, 1-butynyl, 2-butynyl.

The alkynyl group may be optionally substituted, e.g. as exemplified below.

Aryl

"Aryl" means any aromatic group, preferably having up to about 20 carbon atoms, e.g. 6, 7, 8, 9, 10, 11, 12, 13, 14, 15, 16, 17, 18, 19 or 20 carbon atoms. The aryl group may comprise one, two or more rings. Where two or more rings are present they may if desired be fused.

The aryl group preferably comprises one or more phenyl ring.

Exemplary aryl groups include phenyl, naphthyl, biphenyl.

The aryl group may be optionally substituted, e.g. as exemplified below.

Heteroaryl

"Heteroaryl" means any aromatic monocyclic, bicyclic, or tricyclic ring which comprises carbon atoms and one or more ring heteroatoms, e.g., 1, 2, 3, 4, 5 or 6 heteroatoms, preferably independently selected from the group consisting of nitrogen, oxygen, phosphorus, silicon and sulfur. Heteroaryl groups preferably have a ring system containing from 5 to 20 ring atoms, e.g. 5, 6, 7, 8, 9, 10, 11, 12, 13, 14, 15, 16, 17, 18, 19 or 20 ring atoms. Where two or more rings are present they may if desired be fused.

Exemplary heteroaryl groups include pyridyl, pyrazinyl, pyrimidinyl, furayl, thiophenyl, pyrrolyl, oxazole, thiazole, pyrazole, imidazole, 1,2,3-triazole, 1,2,4-triazole, tetrazole, indole, purine, carbazole, benzindole, benzufuran, dibenzofuran, benzothiphene, azacarbazole, azabenzofuran, azadibenzothiophene.

The heteroaryl group may be optionally substituted, e.g. as exemplified below.

Hydrocarbyl Group

"Hydrocarbyl group" means any group consisting only of carbon and hydrogen atoms, provided that if so specified it may optionally contain one or more heteroatom and/or be optionally substituted, as discussed below. Hydrocarbyl groups may be cyclic, straight or branched, and may be saturated, unsaturated or aromatic. Cyclic hydrocarbyl groups may be mono- or polycyclic, and polycyclic hydrocarbyl groups may be fused-ring, spiro, cage or combinations thereof.

The hydrocarbyl group may optionally contain one or more heteroatom, e.g., 1, 2, 3, 4, 5 or 6 heteroatoms, independently selected from the group consisting of nitrogen, oxygen, and sulfur.

The hydrocarbyl group may be optionally substituted, e.g. as exemplified below.

Aryloxide

The term "aryloxide" means an O-linked aryl group or the anionic form of the corresponding aryl-OH compound.

Examples of aryloxide compounds include, but are not limited to, phenolate, 2-methylphenolate, 2-t-butyl-5-methylphenolate, 2,6-dimethylphenolate, 3,5-dimethylphenolate, 3.5-di-t-butylphenolate, 3,5-bis(trifluoromethyl)phenolate, 2-chlorophenolate, 2,6-dichlorophenolate, 2,6-difluorophenolate, 2,6-dibromophenolate, 2,6-diiodophenolate, 4-fluorophenolate, 4-trifluoromethylphenolate, 1-naphtholate, 2-naphtholate.

Amide

The term "amide" refers for example to the [NRR']⁻ anion, where R and R' independently can be a hydrogen, alkyl, alkenyl, alkynyl, aryl, heteroaryl, aralkyl, cycloalkyl, halogenated alkyl, or heterocycloalkyl group described above. The groups R and R' may, for example, be connected to each other.

An amide group may be optionally substituted, e.g. as exemplified below.

The term "amide" includes, for example, an optionally substituted amide group having the following general formula in which the nitrogen atom N is an amide anionic nitrogen:

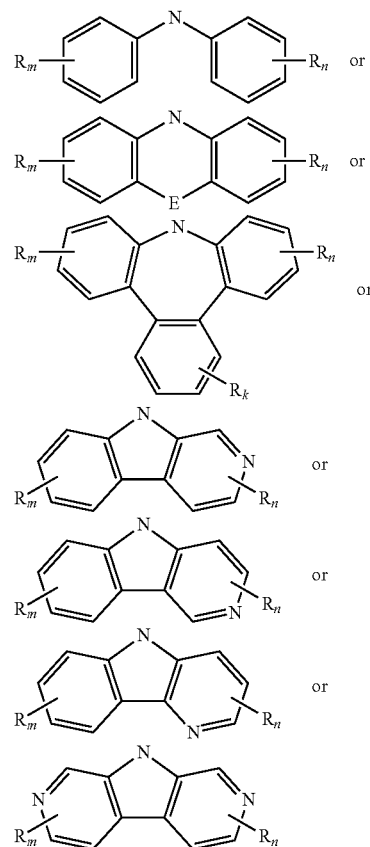

in which Rn, Rm and Rk represent optional substituents of the respective aromatic rings, in which n, m and k are numbers from 0 to the maximum available and in each case the presence, number, position and/or identity of the said substituents may be the same or different as between different aromatic ring moieties; and, where n, m or k is more than 1, the identity of each R group of the substituents of a particular aromatic ring moiety may be the same or different as between each other; and E is a bond or is a group selected from optionally substituted hydrocarbyl [for example, optionally substituted >CH$_2$, optionally substituted —CH=CH—, optionally substituted —CH$_2$—CH$_2$— ethylene, optionally substituted aryl (for example, optionally substituted —C$_6$H$_4$—, for example unsubstituted —C$_6$H$_4$—)], O, S, NR', SO, SO$_2$ and AsR', in which R' is selected from hydrogen, optionally substituted alkyl, optionally substituted alkenyl, optionally substituted allyl, optionally substituted aryl and optionally substituted heteroaryl.

In embodiments of such optionally substituted amide groups, the ligand X may be a diarylamide or carbazolate anion. The aryl groups in the diarylamide anion or the aromatic rings in the carbazolate anion may each be optionally substituted. The diarylamide anion may, for example, be a diphenylamide anion (NPh$_2^-$), in which the phenyl groups are each optionally substituted by one or more substituents, the presence, number, position and/or identity of which may be the same or different between the two phenyl groups. The substituent(s), when present, is/are suitably selected from the groups set out below in the discussion of the expression "Optionally substituted". An example of a preferred diarylamide ligand X is a diphenylamide anion. The carbazolate anion may, for example, be a carbazolate anion in which the aromatic rings are each optionally substituted by one or more substituents, the presence, number, position and/or identity of which may be the same or different between the two aromatic rings. The substituent(s), when present, is/are suitably selected from the groups set out below in the discussion of the expression "Optionally substituted". Examples of preferred carbazolate ligands X are the carbazolate anion and the 3,6-di-t.butyl-carbazolate anion.

Substituents within the definitions of Rn, Rm and Rk, and substituents of the diarylamide and carbazolate anions referred to above, may for example be selected from the group of alkyl, aryl, alkenyl, alkynyl, each of which may optionally be substituted (such substituted forms including, for example: haloalkyl (for example, fluoroalkyl containing one or more fluorine atoms, for example perfluoroalkyl), haloalkenyl (for example, fluoroalkenyl containing one or more fluorine atoms, for example perfluoroalkenyl), haloaryl (for example, fluoroaryl containing one or more fluorine atoms, for example perfluoroaryl)), $NMe_2$, $NO_2$, $SO_3H$ and COOH.

One particular example of the amide groups mentioned above is the substituted amide group having the following general formula:

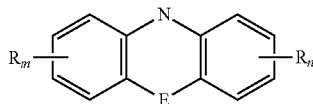

in which n and m are independently numbers from 1 to 4, for example n=m, and Rn and Rm are independently selected from fluoroalkyl, fluoroalkenyl and fluoroaryl, for example Rn is the same as Rm. In one example, Rn and Rm are the same as each other and are perfluoroalkyl.

Thiophenylates

The term "thiophenylate" refers to aryl thiolates.

The aryl portion of the thiophenylate group may be optionally substituted, e.g. as exemplified below.

Examples of thiophenylate compounds include, but are not limited to, thiophenolate, 2-methylthiophenolate, 2-t-butyl-5-methylthiophenolate, 2,6-dimethylthiophenolate, 3,5-dimethylthiophenolate, 3.5-di-t-butylthiophenolate, 3,5-bis(trifluoromethyl)thiophenolate, 2-chlorothiophenolate, 2,6-dichlorothiophenolate, 2,6-difluorothiophenolate, 2,6-dibromothiophenolate, 2,6-diiodothiophenolate, 4-fluorothiophenolate, 4-trifluoromethylthiophenolate, 1-thionaphtholate, 2-thionaphtholate.

Phosphiniminates

The term "phosphiniminate" refers to the anionic form of compounds containing the $[R^1R^2R^3PN]^-$ moiety, where $R^1$, $R^2$ and $R^3$ are independently chosen from organic groups optionally containing heteroatoms, preferably selected from Si, P, O, S or N. The organic groups may suitably be selected from alkyl, alkenyl, aryl or heteroaryl groups.

The phosphiniminate group may be optionally substituted, e.g. as exemplified below.

Ketiminates

The term "ketiminate" refers to the anionic form of compounds containing the $[R^1R^2C=N]^-$ moiety, where $R^1$ and $R^2$ are independently chosen from organic groups optionally containing heteroatoms, preferably selected from Si, P, O, S or N. The organic groups may suitably be selected from alkyl, alkenyl, aryl or heteroaryl groups.

The ketiminate group may be optionally substituted, e.g. as exemplified below.

Guanidinates

The term "guanidinate" refers to the anionic form of compounds of the formula $(R^1R^2N)C(NR^3)(NR^4)$, namely $[(R^1R^2N)C(NR^3)(NR^4)]^-$, where $R^1$, $R^2$, $R^3$ and $R^4$ are independently chosen from organic groups optionally containing heteroatoms, preferably selected from Si, P, O, S or N. The organic groups may suitably be selected from alkyl, alkenyl, aryl or heteroaryl groups.

The guanidinate group may be optionally substituted, e.g. as exemplified below.

Optionally Substituted

"Optionally substituted" as applied to any group means that the said group may if desired be substituted with one or more substituents, which may be the same or different, preferably one or more substituents which individually have a size which is small in relation to the parent group being substituted (e.g. less than about 20% of the largest molecular dimension).

A group cannot be a substituent of its own kind if it would thereby form a group of that kind which would then fall outside the definition of the compounds (e.g. an alkyl group cannot be a substituent of another alkyl group so that an alkyl group having too many carbon atoms would result). Examples of suitable substituents include halo (e.g. fluoro, chloro, bromo or iodo), $C_{1-20}$ alkyl, $C_{2-20}$ alkenyl, $C_{2-20}$ alkynyl, $C_{2-20}$ cycloalkyl, hydroxy, thiol, $C_{1-20}$ alkoxy, $C_{2-20}$ alkenyloxy, $C_{2-20}$ alkynyloxy, amino, nitro, $C_{1-20}$ alkylamino, $C_{2-20}$ alkenylamino, di-$C_{1-20}$ alkylamino, $C_{1-20}$ acylamino, di-$C_{1-20}$ acylamino, $C_{6-20}$ aryl, $C_{6-20}$ heteroaryl, $C_{6-20}$ arylamino, di-$C_{6-20}$ arylamino, $C_{6-20}$ aroylamino, di-$C_{6-20}$ aroylamino, $C_{6-20}$ arylamido, carboxy, $C_{1-20}$ alkoxycarbonyl or $(C_{6-20}$ ar)$(C_{1-20}$ alkoxy)carbonyl, carbamoyl, sulphoxy (e.g. sulphoxide, sulfone, sulphonyl, sulpho) or any of the above in which a hydrocarbyl moiety is itself substituted by halo, hydroxy, amino, nitro, carbamoyl or carboxy. Examples of suitable substituents include halo (e.g. fluoro, chloro, bromo or iodo), $C_{1-20}$ alkyl, $C_{2-20}$ alkenyl, $C_{2-20}$ alkynyl, $C_{2-20}$ cycloalkyl, hydroxy, thiol, $C_{1-20}$ alkoxy, $C_{2-20}$ alkenyloxy, $C_{2-20}$ alkynyloxy, amino, nitro, $C_{1-20}$ alkylamino, $C_{2-20}$ alkenylamino, di-$C_{1-20}$ alkylamino, $C_{1-20}$ acylamino, di-$C_{1-20}$ acylamino, $C_{6-20}$ aryl, $C_{6-20}$ heteroaryl, $C_{6-20}$ arylamino, di-$C_{6-20}$ arylamino, $C_{6-20}$ aroylamino, di-$C_{6-20}$ aroylamino, $C_{6-20}$ arylamido, carboxy, $C_{1-20}$ alkoxycarbonyl or $(C_{6-20}$ ar)$(C_{1-20}$ alkoxy)carbonyl, carbamoyl, or any of the above in which a hydrocarbyl moiety is itself substituted by halo, hydroxy, amino, nitro, carbamoyl or carboxy.

"Acyl" means an H—CO— or $C_{1-20}$ alkyl-CO— group wherein the alkyl group is as defined below. Preferred acyls contain an alkyl. Exemplary acyl groups include formyl, acetyl, propanoyl, 2-methylpropanoyl and butanoyl.

Exemplary substituted alkyl groups include mono- or poly-aryl-substituted alkyl groups such as phenylmethyl, naphthylmethyl, diphenylmethyl, phenylethyl, naphthylethyl, diphenylethyl, phenylpropyl, naphthylpropyl, diphenylpropyl.

Exemplary substituted cycloalkyl groups include mono- or poly-alkyl-substituted cycloalkyl groups such as 1-methylcyclopropyl, 1-methylcyclobutyl, 1-methylcyclopentyl, 1-methylcyclohexyl, 2-methylcyclopropyl, 2-methylcyclobutyl, 2-methylcyclopentyl, 2-methylcyclohexyl.

Exemplary substituted aryl groups include, at any substitution position or combination of positions, $C_{1-20}$ alkoxyphenyl such as methoxyphenyl, hydroxyphenyl, ($C_{1-20}$ alkoxy)(hydroxy)phenyl such as methoxy-hydroxyphenyl, $C_{1-20}$ alkylphenyl such as methylphenyl, ($C_{1-20}$ alkyl)(hydroxy)phenyl such as methyl-hydroxyphenyl, monohalophenyl such as monofluorophenyl or monochlorophenyl, dihalophenyl such as dichlorophenyl or chlorofluorophenyl, carboxyphenyl, $C_{1-20}$ alkoxycarbonylphenyl such as methoxycarbonylphenyl.

Complexes of Formula Ia

Within the differences in the definitions of the formulae, complexes of Formula Ia have the same examples, embodiments and preferences as the complexes of Formula I, with the exception that the compound $^{Ad}L$-Au-NTf$_2$ in which $^{Ad}L$ is

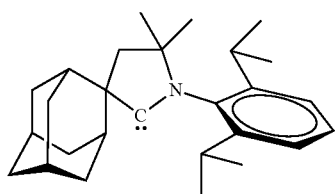

and Tf is $CF_3$—$SO_2$— is excluded from complexes of Formula Ia.

Examples of Complexes

Within the differences in the definitions of the formulae, examples and preferences expressed herein for the CAAC and for the monoanionic organic amide ligand X for the complexes of part A of the definition of Formula I of the present invention apply equally to complexes of part B of the definition of Formula I of the present invention unless specifically stated otherwise.

Examples of complexes of Formula I or Formula Ia according to the present invention are:

Complex 1Me

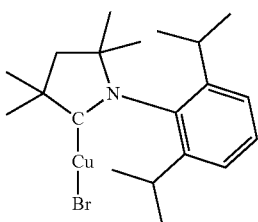

Complex 1Et

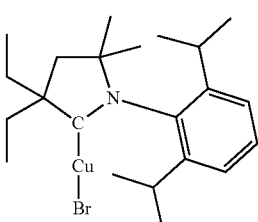

Complex 1Ad

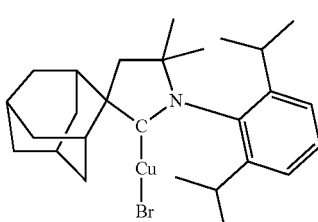

Complex 2Me

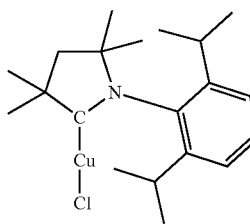

Complex 2Et

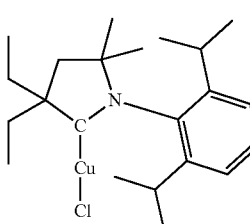

Complex 2Ad

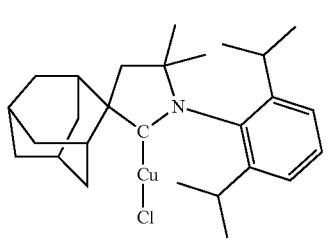

Complex 3Me

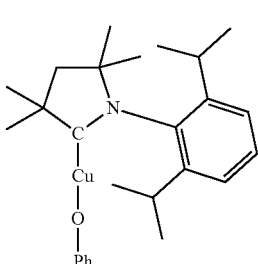

Complex 3Et

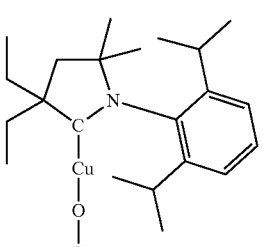

Complex 3Ad

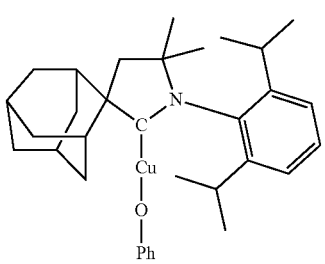

Complex 4Me
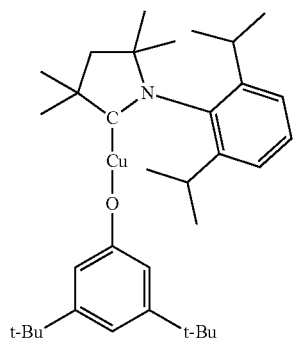
Complex 4Et
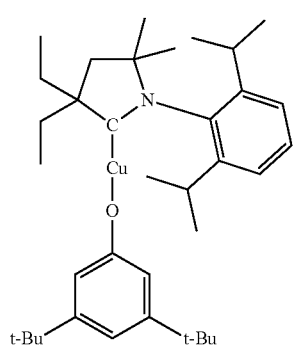
Complex 4Ad
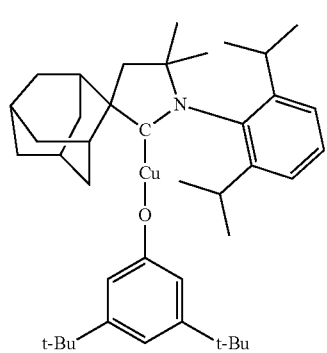
Complex 5Me
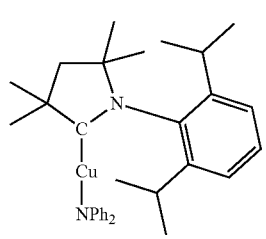
Complex 5Et
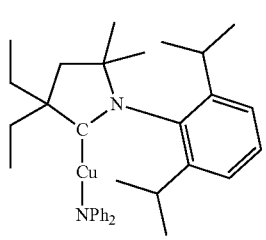
Complex 5Ad
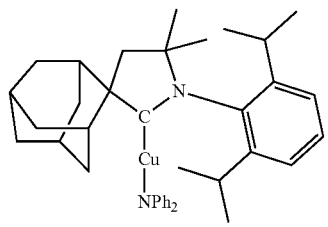
Complex 6Me
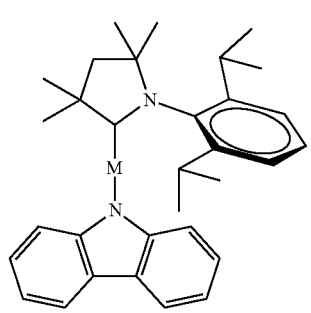
(M = Au or Cu)
Complex 6Et
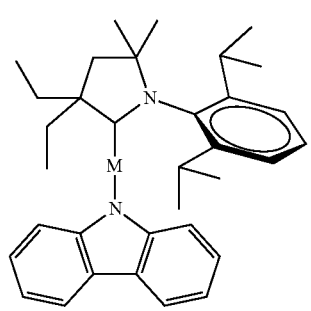
(M = Au or Cu)
Complex 6Ad
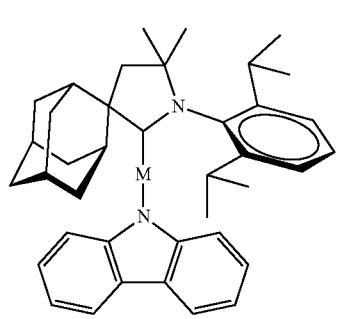
(M = Au or Cu)

Complex 7Me

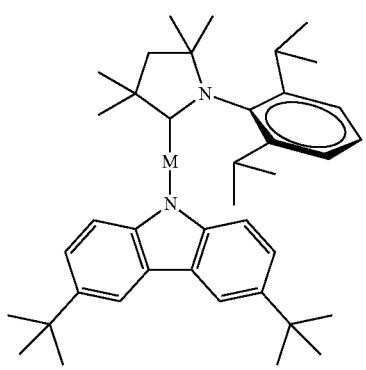

(M = Au or Cu)

Complex 7Et

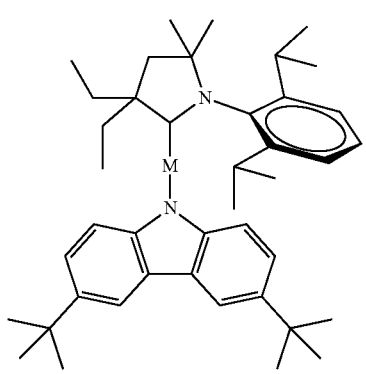

(M = Au or Cu)

Complex 7Ad

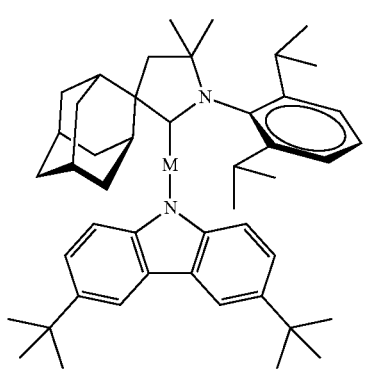

(M = Au or Cu)

Complex 8A

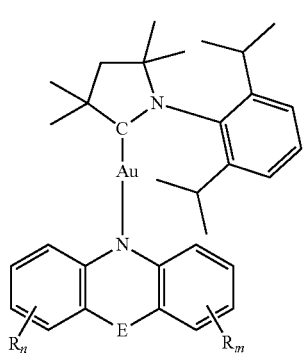

Complex 8B

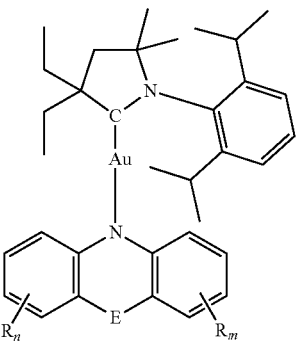

Complex 8C

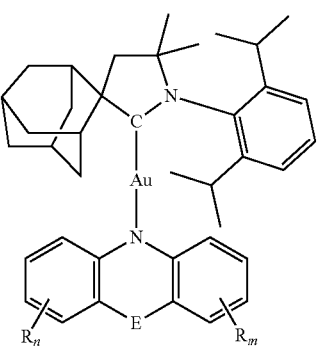

Complex 8D

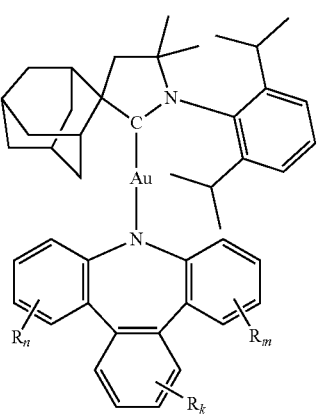

In complexes 8A, 8B, 8C and 8D, Rn, Rm and Rk represent optional substituents of the respective aromatic rings, in which n, m and k are numbers from 0 to the maximum available and in each case the presence, number, position and/or identity of the said substituents may be the same or different as between different aromatic ring moieties; and, where n, m or k is more than 1, the identity of each R group of the substituents of a particular aromatic ring moiety may be the same or different as between each other; and E is a bond or is a group selected from optionally substituted hydrocarbyl [for example, optionally substituted >CH$_2$, optionally substituted —CH=CH—, optionally substituted —CH$_2$—CH$_2$— ethylene, optionally substituted aryl (for example, optionally substituted —C$_6$H$_4$—, for example unsubstituted —C$_6$H$_4$—)], O, S, NR', SO, SO$_2$ and AsR', in which R' is selected from hydrogen, optionally substituted alkyl, optionally substituted alkenyl, optionally substituted allyl, optionally substituted aryl and optionally substituted heteroaryl.

Specific examples of complexes 8A, 8B and 8C which may be mentioned include:

Complex 8A(a), the embodiment of complex 8A in which E is N—CH₃, Rn is H and Rm is H; Complex 8A(b) (=6Me (M=Au)), the embodiment of complex 8A in which E is a bond, Rn is H and Rm is H;

Complex 8A(c), the embodiment of complex 8A in which E is —CH₂—CH₂—, Rn is H and Rm is H;

Complex 8A(d), the embodiment of complex 8A in which E is —O—, Rn is H and Rm is H;

Complex 8A(e), the embodiment of complex 8A in which E is —S—, Rn and Rm are —NO₂ at each of the 3 and 7 positions of the phenothiazine moiety;

Complex 8B(a), the embodiment of complex 8B in which E is N—CH₃, Rn is H and Rm is H;

Complex 8B(b) (=6Et (M=Au)), the embodiment of complex 8B in which E is a bond, Rn is H and Rm is H;

Complex 8B(c), the embodiment of complex 8B in which E is —CH₂—CH₂—, Rn is H and Rm is H;

Complex 8B(d), the embodiment of complex 8B in which E is —O—, Rn is H and Rm is H;

Complex 8B(e), the embodiment of complex 8B in which E is —S—, Rn and Rm are —NO₂ at each of the 3 and 7 positions of the phenothiazine moiety;

Complex 8C(a), the embodiment of complex 8C in which E is N—CH₃, Rn is H and Rm is H;

Complex 8C(b) (=6Ad (M=Au)), the embodiment of complex 8C in which E is a bond, Rn is H and Rm is H;

Complex 8C(c), the embodiment of complex 8C in which E is —CH₂—CH₂—, Rn is H and Rm is H;

Complex 8C(d), the embodiment of complex 8C in which E is —O—, Rn is H and Rm is H;

Complex 8C(e), the embodiment of complex 8C in which E is —S—, Rn and Rm are —NO₂ at each of the 3 and 7 positions of the phenothiazine moiety.

Additional examples of complexes of Formula I or Ia according to the present invention include:

Complex S1=Complex 2Ad, iodide analogue (i.e. X=I);

Complex S2=Complex 2Ad, thiocyanate analogue (i.e. X=SCN);

Complex S3=Complex 2Ad, cyano analogue (i.e. X=CN);

Complex S4=Complex 2 Ad, phenylacetylide analogue (i.e. X=phenylacetylene);

Complex S5=Complex 3Ad, thiophenol analogue (i.e. X=SPh);

Complex S6=Complex 4Ad, 2,6-difluorophenol analogue (i.e. X=O-(2,6-difluorophenyl));

Complex S7=Complex 4Ad, 2-tert.butyl-5-methylphenol analogue (i.e. X=O-(2-tert.butyl-5-methylphenyl));

Complex S8=Complex 4Ad, 3,5-di(tert.butyl)phenol analogue (i.e. X=O-(3,5-di(tert.butyl)phenyl));

Complex S9=Complex 5Ad, carbazolate analogue (i.e. X=carbazole);

Complex S10=Complex 5Ad, aniline analogue (i.e. X=NHPh);

Complex S11=Complex 5Ad, 3,5-bis(trifluoromethyl) aniline analogue (i.e X=NH{3,5-(CF₃)₂Ph})

Complex S12=Complex 6Me copper analogue (i.e. M=Cu);

Complex S13=Complex 6Et copper analogue (i.e. M=Cu);

Complex S14=Complex 6Ad copper analogue (i.e. M=Cu);

Complex S15=Complex 7Me copper analogue (i.e. M=Cu);

Complex S16=Complex 7Et copper analogue (i.e. M=Cu);

Complex S17=Complex 7Ad copper analogue (i.e. M=Cu);

Complex S18=Complex 8A copper analogue (i.e. M=Cu);

Complex S19=Complex 8B copper analogue (i.e. M=Cu);

Complex S20=Complex 8C copper analogue (i.e. M=Cu);

Complex S21=Complex 8D copper analogue (i.e. M=Cu);

Complexes S22 to S36=respectively the copper analogues of each of complexes 8A(a) to 8C(e);

Complex S37=Complex 1Me, gold analogue (i.e. M=Au);

Complex S38=Complex 1Et, gold analogue (i.e. M=Au);

Complex S39=Complex 1Ad, gold analogue (i.e. M=Au);

Complex S40=Complex 2Me, gold analogue (i.e. M=Au);

Complex S41=Complex 2Et, gold analogue (i.e. M=Au);

Complex S42=Complex 2Ad, gold analogue (i.e. M=Au);

Complex S43=Complex 3Me, gold analogue (i.e. M=Au);

Complex S44=Complex 3Et, gold analogue (i.e. M=Au);

Complex S45=Complex 3Ad, gold analogue (i.e. M=Au);

Complex S46=Complex 4Me, gold analogue (i.e. M=Au);

Complex S47=Complex 4Et, gold analogue (i.e. M=Au);

Complex S48=Complex 4Ad, gold analogue (i.e. M=Au);

Complex S49=Complex 5Me, gold analogue (i.e. M=Au);

Complex S50=Complex 5Et, gold analogue (i.e. M=Au);

Complex S51=Complex 5Ad, gold analogue (i.e. M=Au).

Examples of complexes of Formula I and Ia are those wherein:

M is selected from copper, silver and gold, more preferably copper and gold;

L is selected from compounds of Formula IIIa:

(IIIa)

wherein $R^a$, $R^b$, $R^c$ and $R^d$ are CH₃ groups, and Ar represents a substituted phenyl group, for example a 2,6-dialkyl substituted phenyl group, for example a 2,6-diisopropylphenyl group;

or $R^a$ and $R^b$ are methyl groups and $R^c$ and $R^d$ are ethyl groups, and Ar represents a substituted phenyl group, for example a 2,6-dialkyl substituted phenyl group, for example a 2,6-diisopropylphenyl group;

or $R^a$ and $R^b$ are methyl groups and $R^c$ and $R^d$ together form an optionally substituted cycloalkylidene (spirocycloalkyl) group, for example cyclohexylidene (spiro-cyclohexyl), and Ar represents a substituted phenyl group, for example a 2,6-dialkyl substituted phenyl group, for example a 2,6-diisopropylphenyl group;

or L is a spiroadamantane compound of Formula IIIb:

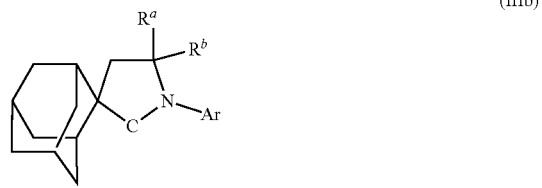

(IIIb)

wherein $R^a$ and $R^b$ are CH₃ groups and Ar represents a substituted phenyl group, for example a 2,6-dialkyl substituted phenyl group, for example a 2,6-diisopropylphenyl group;

and
X is a monoanionic organic amide ligand having the formula

R'—N—R" or N⊃ in which R' and R" are selected from hydrogen and organic groups, which when both organic groups may be the same or different;
and ⊃ represents a cyclic organic group which may contain one or more rings;
preferably having the following general formula in which the nitrogen atom N is an amide anionic nitrogen:

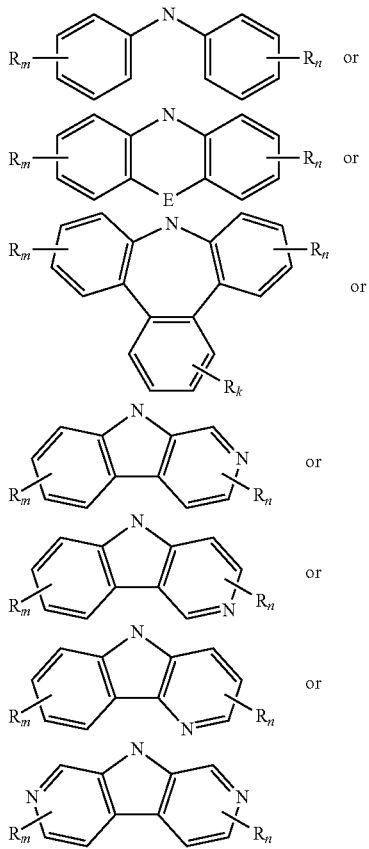

in which Rn, Rm and Rk represent optional substituents of the respective aromatic rings, in which n, m and k are numbers from 0 to the maximum available and in each case the presence, number, position and/or identity of the said substituents may be the same or different as between different aromatic ring moieties; and, where n, m or k is more than 1, the identity of each R group of the substituents of a particular aromatic ring moiety may be the same or different as between each other; and
E is a bond or is a group selected from optionally substituted hydrocarbyl [for example, optionally substituted >CH$_2$, optionally substituted —CH=CH—, optionally substituted —CH$_2$—CH$_2$— ethylene, optionally substituted aryl (for example, optionally substituted —C$_6$H$_4$—, for example unsubstituted —C$_6$H$_4$—)], O, S, NR', SO, SO$_2$ and AsR', in which R' is selected from hydrogen, optionally substituted alkyl, optionally substituted alkenyl, optionally substituted allyl, optionally substituted aryl and optionally substituted heteroaryl;
and preferably X is a diarylamide or carbazolate anion in which the aryl groups in the diarylamide anion or the aromatic rings in the carbazolate anion may each be optionally substituted, for example an unsubstituted diphenylamide anion (NPh$_2$$^-$) or a diphenylamide anion in which the phenyl groups are each substituted by one or more substituents; for example an unsubstituted diphenylamide anion; or an unsubstituted carbazolate anion or a carbazolate in which the aromatic rings are each substituted by one or more substituents, for example an unsubstituted carbazolate anion or a 3,6-di-t.butyl-carbazolate anion.

Light-Emitting Devices

The present invention provides a light-emitting device comprising, in sequence, an anode, optionally a hole-transporting zone, an emissive zone capable of emitting light when an electric current flows between the cathode and the anode, and a cathode. The emissive zone capable of emitting light comprises at least one complex of Formula I or Formula Ia.

The light-emitting device is preferably constructed as a multilayer according to techniques known in the art. The basic layer arrangement stated above may be modified in a variety of ways known in the art, for example by incorporation of one or more additional layers or sub-layers, and by the provision of electrical conductors and means for housing and supporting the device in the desired position and orientation.

The present invention also provides a light-emitting device comprising an emissive zone capable of emitting light in response to introduced energy, wherein the emissive zone capable of emitting light comprises at least one organometallic complex which exhibits RASI photoemission.

Therefore, in another aspect the present invention provides a method of preparing a component for use in a light-emitting device according to the present invention, which comprises depositing on a substrate a layer of an organic emissive zone component from a solution thereof in a solvent, with the optional provision of one or more additional layers, components or combinations thereof on the substrate before, simultaneously with, and/or after the said deposition; and removing any solvent at any desired time to provide a component for use in a light emitting device.

In an embodiment of the method, the component for use in the light-emitting device comprises at least the hole-transporting zone and emissive zone of the light-emitting device. Preferably the component for use in the light-emitting device can comprise layers or parts of the anode, the hole-transporting zone, the emissive zone and the cathode, optionally also an electron-injection layer.

In a preferred embodiment, the depositions are simultaneous, sequential, or some of the layers are deposited simultaneously and some are deposited sequentially.

The layers of the device according to the present invention may be deposited by any suitable method. For the organic layers, preferred methods include thermal evaporation, ink-jet deposition (for example, as described in U.S. Pat. Nos. 6,013,982 and 6,087,196, the contents of which are incorporated herein by reference), organic vapour phase deposition (OVPD) (for example, as described in U.S. Pat. No. 6,337,102, the content of which is incorporated herein by reference), or deposition by organic vapour jet printing (OVJP). Other suitable deposition methods include spin coating and other solution based processes. Solution based processes are preferably carried out in nitrogen or an inert gas atmosphere. For the other layers, preferred methods include thermal evaporation. Preferred patterning methods include deposition through a mask, cold welding such as described in U.S. Pat. Nos. 6,294,398 and 6,468,819 (the contents of which are incorporated herein by reference), and patterning associated with some of the deposition methods such as ink-jet and OVJD. Other methods may also be used.

The materials to be deposited may be selected to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbon atoms or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Examples of solvents in which the complexes of the present invention may be dissolved or suspended for deposition in the manufacture of light-emitting devices include without limitation halogenated alkanes (for example, chloroform, dichloromethane, 1,2-dichloroethane or trichloroethane); aromatic solvents (for example, benzene, toluene, chlorobenzene, fluorobenzene, difluorobenzene or dichlorobenzene); ethers (for example, diethyl ether, tetrahydrofuran or methylated tetrahydrofuran); ketones (for example, acetone or methyl ethyl ketone); alcohols (for example, methanol or higher alcohols); acetonitrile; nitromethane; nitrobenzene; esters (for example, ethyl acetate); or any combination of one or more thereof.

Examples of light-emitting devices according to the present invention include organic light-emitting diodes (OLEDs), organic phototransistors, organic photovoltaic cells and organic photodetectors. OLEDs, for example, are of interest for flat panel displays, illumination and backlighting. Examples of configurations and constructions of OLEDs are given in U.S. Pat. Nos. 5,844,363, 6,303,238 and 5,707,745, the contents of which are incorporated herein by reference.

Light-emitting devices in accordance with the present invention may be incorporated into a wide variety of consumer products, including without limitation flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theatre or stadium screen, or a sign. Pixel control systems and technologies may be used in known manner with the devices of the present invention, to control the images presented to the viewer. Such pixel control systems include without limitation passive matrix and active matrix technologies.

Preparation of the Complexes

The complexes of the present invention may, for example, be made by solution processing.

The present invention provides a method of preparing the complexes, the method comprising contacting a compound of Formula II:

M-X  (II)

with the CAAC compound L in a solvent, and recovering the complex of Formula I or Ia.

M and X in the compound of Formula II each has the same exemplification and preferences as described herein for the complex of Formula I or Ia. One preference for X in the compound of Formula II is therefore halide. Suitable examples of compounds of Formula II are copper (I) chloride, copper (I) bromide, copper (I) iodide, silver chloride, silver bromide and silver iodide. For details of preferences and exemplifications of M and X in the compound of Formula II, please see the description above and below, including the Examples below of the specific complexes that have been prepared.

The contacting of the reagents suitably takes place in water-free conditions, and preferably under an inert atmosphere (for example, nitrogen or argon). The complexing solvent may suitably be selected from halogenated alkanes (for example, chloroform, dichloromethane, 1,2-dichloroethane or trichloroethane); aromatic solvents (for example, benzene, toluene, chlorobenzene, fluorobenzene, difluorobenzene or dichlorobenzene); ethers (for example, diethyl ether, tetrahydrofuran or methylated tetrahydrofuran); ketones (for example, acetone or methyl ethyl ketone); alcohols (for example, methanol or higher alcohols); acetonitrile; nitromethane; nitrobenzene; esters (for example, ethyl acetate); and any combination of one or more thereof.

Recovery of the complex from the solvent may suitably be achieved by evaporation of the solvent or by the use of an appropriate countersolvent, for example an alkane (for example, hexane or light petroleum ether). The recovered complex may be dried, suitably under vacuum, to recover the dry material.

The CAAC starting materials L may be readily prepared by methods known in the art. For example, the following general synthetic route, and variations thereof, is described in WO-A-2006/138166, the content of which is incorporated herein by reference:

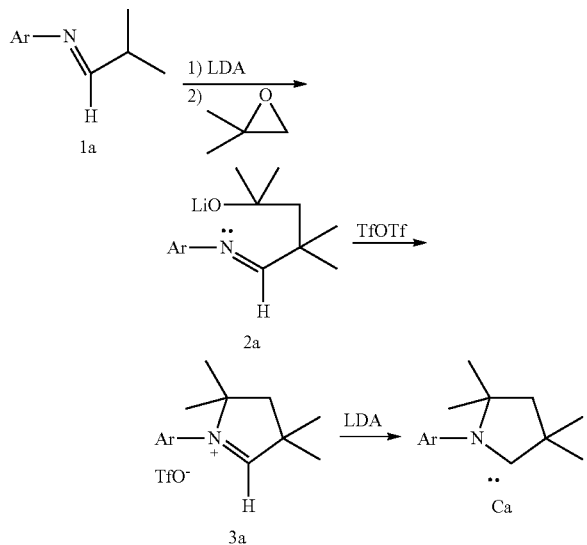

(Ar = aryl; LDA = lithium di-isopropylamide; TfOTf = trifluoromethane sulfonic anhydride).

An alternative synthetic route has been published in US Patent Application Publication No. US 2010/0113791, the content of which is incorporated herein by reference. The ligands L for use in the present invention can be prepared via this alternative route starting from the amine $R^1$—$NH_2$, wherein $R^1$ is as defined for L.

Further information on CAAC preparative methods can be found in M. Soleilhavoup and G. Bertrand: "Cyclic (Alkyl)(Amino)Carbenes (CAACs): Stable Carbenes on the Rise", *Accounts of Chemical Research* 2015, 48, 256-266; and O. Back, M. Henry-Ellinger, C. D. Martin, D. Martin, and G. Bertrand: "$^{31}$P NMR Chemical Shifts of Carbene—Phosphinidene Adducts as an Indicator of the π-Accepting Properties of Carbenes", *Angew. Chem. Int. Ed.* 2013, 52, 2939-2943. The contents of these publications are incorporated herein by reference.

The application of the published routes to obtain the CAACs for use in the present invention is well within the skill of the reader. Further structures and properties of carbenes are for example described by D. J. Nelson and S. P. Nolan in Chemical Society Reviews 2013, vol. 42, p. 6723-6753, the content of which is hereby incorporated by reference.

When M is copper and X is optionally substituted arylacetylide, optionally substituted aryloxide, or optionally substituted aryl amide, the compound of Formula I or Ia may be prepared by a method comprising contacting a CAAC compound of Formula Ib:

L-Cu—X'     (Ib)

in which L is as defined for Formula I and X' is Cl, OH or O$^t$Bu
with a compound of formula V

X—H     (V)

in which X is optionally substituted arylacetylide, optionally substituted aryloxide, or optionally substituted aryl amide, in a solvent, and recovering the complex of Formula I or Ia.

When M is gold, the present invention provides a further method of preparing the complexes, the method comprising contacting a CAAC compound of Formula Ic:

L-Au—X'     (Ic)

in which L is as defined for Formula I or Ia and X' is Cl or OH or O$^t$Bu
with a compound of formula Va X—H     (Va)

in which X is optionally substituted aryl amide having the formula

R'—N—R" or N⊃ in which R' and R" are selected from hydrogen and organic groups, which when both organic groups may be the same or different; provided that at least one of R and R" is aryl;
and ⊃ represents a cyclic organic group which may contain one or more rings; provided that the cyclic organic group is such that the compound of formula Va is an optionally substituted aryl amide;
in a solvent, and recovering the complex of Formula I or Ia.

The method of contacting the compound of Formula Ib or Ic with the compound of Formula V or Va may, for example, be carried out in dry tetahydrofuran, optionally containing or sodium tert-butoxide, under an inert atmosphere, for example under an argon atmosphere. The mixture may, for example, be centrifuged and the solution containing the product separated.

Discussion
Contrasts with Known NHCs

For comparison only, formula VI below shows the most common type of prior art N-heterocyclic carbene (NHC) compound, based on the imidazole or imidazolidine ring, which contains two nitrogen atoms in an unsaturated ring system:

(VI)

wherein R$^w$, R$^x$, R$^y$ and R$^z$ are the variable groups known from the prior art in these molecules.

The known NHCs, such as those of Formula VI mentioned above, form a large and important class of ligands for metal complexes. Although generally regarded as strongly electron-donating, different types of carbene ligands differ significantly in their electronic properties. The structures, electronic and steric properties of carbenes and their coordination to metal centres have been summarised in several literature reviews, see for example: F. E. Hahn, M. C. Jahnke: "Heterocyclic Carbenes—Synthesis and Coordination Chemistry", *Angewandte Chemie International Edition* 2008, 47, 3122-3172; M. N. Hopkinson, C. Richter, M. Schedler, F. Glorius: "An Overview of N-Heterocyclic Carbenes", *Nature* 2014, 510, 485-496; G. Ciancaleoni et al.: "When the Tolman Electronic Parameter fails: a comparative DFT charge displacement study of [(L)Ni(CO)$_3$]$^{0/-}$ and [(L)Au(Co)$_3$]$^{0/-}$", *Inorganic Chemistry* 2014, 53, 9907-9916; and D. J. Nelson, S. P. Nolan: "Quantifying and understanding the electronic properties of N-heterocyclic carbenes", *Chemical Society Reviews* 2013, 42, 6723-6753. The contents of these publications are incorporated herein by reference.

By way of further example, dicationic binuclear copper complexes, where each metal centre is coordinated to two connected imidazole-type NHC ligands which hold the metal centres in close proximity, have been reported to show photoluminescent behaviour, with moderate quantum yield [K. Matsumoto et al., *Dalton Transactions* 2009, 6795-6801, which is incorporated herein by reference]. For the purpose of constructing OLEDs, however, charged complexes are undesirable, and linked bis(carbene) ligands involve an undesirable level of synthetic complexity. Three-coordinate copper complexes involving one NHC ligand per metal centre are also known to be photoemissive and have been described in detail for example in U.S. Pat. 2014/125221, which is incorporated here in its entirety by reference.

The complexes in the present invention differ from these prior known NHC-copper complexes in that they have a coordination number of 2, the carbene species contains only one ring nitrogen atom, and only one carbene species is present.

Furthermore, as discussed above the complexes of the present invention have the potential to emit light via RASI photoemission, offering the possibility of light-emitting devices with high quantum efficiency.

The Complexes of the Present Invention

The complexes of Formula I and Ia offer certain unexpected properties.

Copper halide complexes of the type of carbenes of formula VI do not show photoluminescence behaviour, unless the imidazolium salts from which the carbene ligands of formula VI are generated are themselves emissive or carry luminescent substituents. By contrast, the iminium salt precursors of carbenes of formulae IIIa and IIIb are not emissive. Carbenes of formulae IIIa and IIIb are characterised by strong electron donation [for a discussion of the bonding characteristics of these carbene ligands see M. Soleilhavoup and G. Bertrand: "Cyclic (Alkyl)(Amino)Carbenes (CAACs): Stable Carbenes on the Rise", *Accounts of Chemical Research* 2015, 48, 256-266, and O. Back, M. Henry-Ellinger, C. D. Martin, D. Martin, and G. Bertrand: "$^{31}$P NMR Chemical Shifts of Carbene—Phosphinidene Adducts as an Indicator of the π-Accepting Properties of Carbenes", *Angew. Chem. Int. Ed.* 2013, 52, 2939-2943]. The same applies to carbenes of formula III with larger rings.

In addition, the substituents on the CAAC ring carbon atom that is adjacent to the carbene centre (for example, carbon centre G in Formula III, assuming that g is 1) provide steric hindrance. The steric hindrance is further increased by using a bulky N-substituent $R^1$. This applies in particular to carbenes of formula IIIb and its congeners. As described herein, further substituents may, if desired be introduced to make the steric effects even more pronounced.

The strong electron donation raises the energy of the d-orbitals on the metal atom M, for example copper. Without wishing in any way to be bound by theory, it is hypothesized that this increase in the energy of the d-electrons of the metal facilitates metal-to-ligand charge transfer during the excitation process. The carbene C atom has an empty p-orbital which can act as electron acceptor. As described in WO 2014/108430, for example, the content of which is incorporated herein by reference, in copper complexes excited $S^1$ singlet and $T^1$ triplet states are close in energy, and there is the possibility that a thermal equilibrium between these two states is established. Population of the $S^1$ state enables the excited complex to return to the $S^0$ ground state without change in the electron spin, which is allowed by quantum theory, whereas relaxation from the triplet state would be spin-forbidden. Apart from increasing the quantum yield of copper complexes up to values approaching 100% by allowing an emission pathway from the $S^1$ state, this excitation-relaxation mechanism also reduces the lifetime of the excited state to a value of the order of 20 microseconds or less, which is crucial for efficient OLED devices. Relative relaxation from triplet states, on the other hand, is typified by phosphorescence, with excited state lifetimes of the order of 100 microseconds or more.

The emission pathways from $S^1$ or $T^1$ states may, for example, include the RASI photoemission pathway described herein.

Unlike prior art Cu(I) phosphine halides, in the complexes of the present invention there are no halide bridges to form dimeric or oligomeric assemblies. For this reason, the complexes according to the present invention offer good solubility in organic solvents. Organic solvents are used during the construction of printed OLED devices, for example, and adequate solubility of the emissive complexes is important for their incorporation.

The complexes of the present invention enable materials which potentially have very high internal quantum efficiency, for example equal to or greater than about 75%, e.g. equal to or greater than about 80%, equal to or greater than about 85%, equal to or greater than about 90%, equal to or greater than about 95%, equal to or greater than about 96%, equal to or greater than about 97% or equal to or greater than about 98%.

BRIEF DESCRIPTION OF THE DRAWINGS

The accompanying drawings and the following Examples are provided for further illustration of the present invention without limitation.

EXAMPLES

Example 1. Synthesis of ($^{Ad}$CAAC)CuCl

Figure 1:
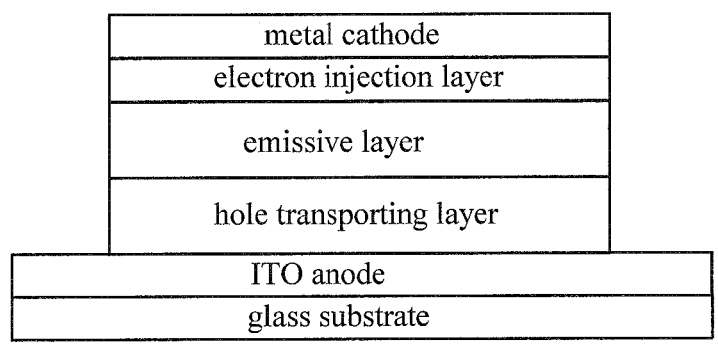
FIG. 1. Schematic representation of the OLED device structure. Additional electron transport and confinement layers may be added as required.

To $^{Ad}$CAAC (1.58 g, 4.2 mmol) in a Schlenk flask under a dry nitrogen atmosphere was added 0.42 g (4.2 mmol) of CuCl. The mixture was dissolved in 20 mL of dry THF and stirred overnight. The solvent was removed, the residue dissolved in CH$_2$Cl$_2$ and filtered through short pad of silica (1 cm). The filtrate was concentrated and hexane was added to precipitate the copper complex. The solvents were decanted and the residue was dried in vacuum. Yield: 1.86 g (3.9 mmol, 93%).
$^1$H NMR (300 MHz, CD$_2$Cl$_2$): δ 7.46 (t, J=7.2 Hz, 1H, aromatic CH), 7.30 (d, J=7.2 Hz, 2H, aromatic CH) 3.52 (d, J=11.4 Hz, 2H, CH$_2$) 2.81 (sept, J=6.6 Hz, 2H, CH(CH$_3$)$_2$) 2.23-1.78 (m, 14H, adamantyl CH and CH$_2$), 1.33 (s, 6H, C(CH$_3$)$_2$) 1.30 (d, J=6.6 Hz, 6H, CH(CH$_3$)$_2$) 1.29 (d, J=6.6 Hz, 6H, CH(CH$_3$)$_2$). $^{13}$C NMR (75 MHz, CD$_2$Cl$_2$): δ 253.0 (C carbene), 145.4 (o-C), 135.8 (ipso-C), 129.9 (p-CH), 125.1 (m-CH), 78.9 (C$_q$), 64.9 (C$_q$), 48.1 (CH$_2$), 38.9 (CH$_2$), 37.5 (CH), 36.2 (CH$_2$), 34.5 (CH$_2$), 29.54 (CH), 29.40, 28.4, 27.6, 27.0, 22.6 (CH$_3$). Anal. Calcd. for C$_{27}$H$_{39}$NCuCl (476.60): C, 68.04; H, 8.25; N, 2.94. Found: C, 67.91; H, 8.35; N, 3.07.

Example 2. Synthesis of ($^{Ad}$CAAC)CuBr

Prepared as described in Example 1 from 217 mg (0.58 mmol) of $^{Ad}$CAAC and 82.5 mg (0.58 mmol) of CuBr as a white solid. Yield: 0.193 g (0.37 mmol, 64%).
$^1$H NMR (300 MHz, CDCl$_3$) δ 7.40 (t, J=7.2 Hz, 1H, aromatic CH), 7.25 (d, J=7.2 Hz, 2H, aromatic CH), 3.57 (d, J=12.6 Hz, 2H, CH$_2$), 2.79 (sept, J=6.6 Hz, 2H, CH(CH$_3$)$_2$), 2.22-1.77 (m, 14H, adamantyl CH, CH$_2$), 1.34 (s, 6H, CH(CH$_3$)$_2$), 1.32 (d, J=6.6 Hz, 6H, CH(CH$_3$)$_2$), 1.29 (d, J=6.6 Hz, 6H, CH(CH$_3$)$_2$). $^{13}$C NMR (75 MHz, CDCl$_3$): δ 253.3 (C carbene), 144.9 (o-C), 135.2 (ipso-C), 129.8 (p-CH), 124.9 (m-CH), 78.5 (C$_q$), 64.8 (C$_q$), 48.1 (CH$_2$), 38.7 (CH$_2$), 37.3 (CH), 36.0 (CH$_2$), 34.4 (CH$_2$), 29.5 (CH), 29.2, 27.8, 27.23, 27.20, 22.7 (CH$_3$). Anal. Calcd. for C$_{27}$H$_{39}$NCuBr (521.05): C, 62.24; H, 7.54; N, 2.69. Found: C, 62.15; H, 7.68; N, 2.75.

Example 3. Synthesis of ($^{Ad}$CAAC)CuI

Prepared as described in Example 1 from 199 mg (0.53 mmol) of $^{Ad}$CAAC: and 100 mg (0.53 mmol) of CuI as a white solid. Yield: 0.170 g (0.30 mmol, 56%).

¹H NMR (300 MHz, CDCl₃) δ 7.41 (t, J=7.5 Hz, 1H, aromatic CH), 7.26 (d, J=7.5 Hz, 2H, aromatic CH), 3.59 (d, J=12.6 Hz, 2H, CH₂), 2.79 (sept, J=6.6 Hz, 2H, C$\underline{H}$(CH₃)₂), 2.23-1.79 (m, 14H, adamantyl CH, CH₂), 1.36 (s, 6H, C(C$\underline{H}_3$)₂), 1.35 (d, J=6.6 Hz, 6H, CH(C$\underline{H}_3$)₂), 1.29 (d, J=6.6 Hz, 6H, CH(CH₃)₂). ¹³C NMR (75 MHz, CDCl₃): δ 254.1 (C carbene), 145.0 (o-C), 135.2 (ipso-C), 129.8 (p-CH), 124.9 (m-CH), 78.6 (C$_q$), 65.0 (C$_q$), 48.2 (CH₂), 38.8 (CH₂), 37.4 (CH), 36.0 (CH₂), 34.4 (CH₂), 29.5 (CH), 29.2, 27.9, 27.4, 27.2, 22.9 (CH₃). Anal. Calcd. for C₂₇H₃₉NCuI (568.05): C, 57.09; H, 6.92; N, 2.47. Found: C, 57.50; H, 7.09; N, 2.68.

Further Data on the Products of Examples 1 to 3

Figure 2:
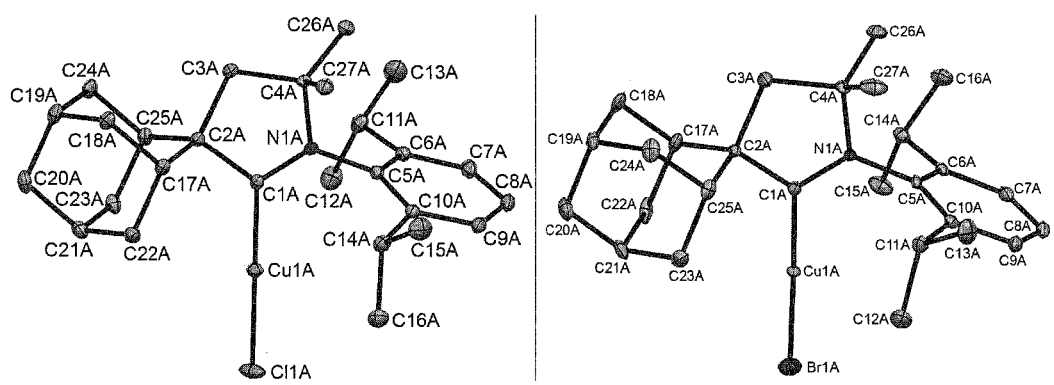
FIG. 2. Crystal structure of independent molecules for ($^{Ad}$CAAC)CuCl/($^{Ad}$CAAC)CuBr. Ellipsoids are shown at the 50% level. Hydrogen atoms are omitted for clarity. Selected bond lengths [Å] and angles [°]: Cu1A-C1A 1.883(2)/1.893(4), Cu1A-Hal1A 2.1099(5)/2.2176(6), C1A-C2A 1.530(2)/1.523(5), C1A-N1A 1.305(2)/1.301(5), C1A-Cu1A-Hal1A 175.33(5)/177.59(11).

The crystal structures of (^{Ad}CAAC)CuCl and (^{Ad}CAAC)CuBr are shown in FIG. 2.

Figure 3:
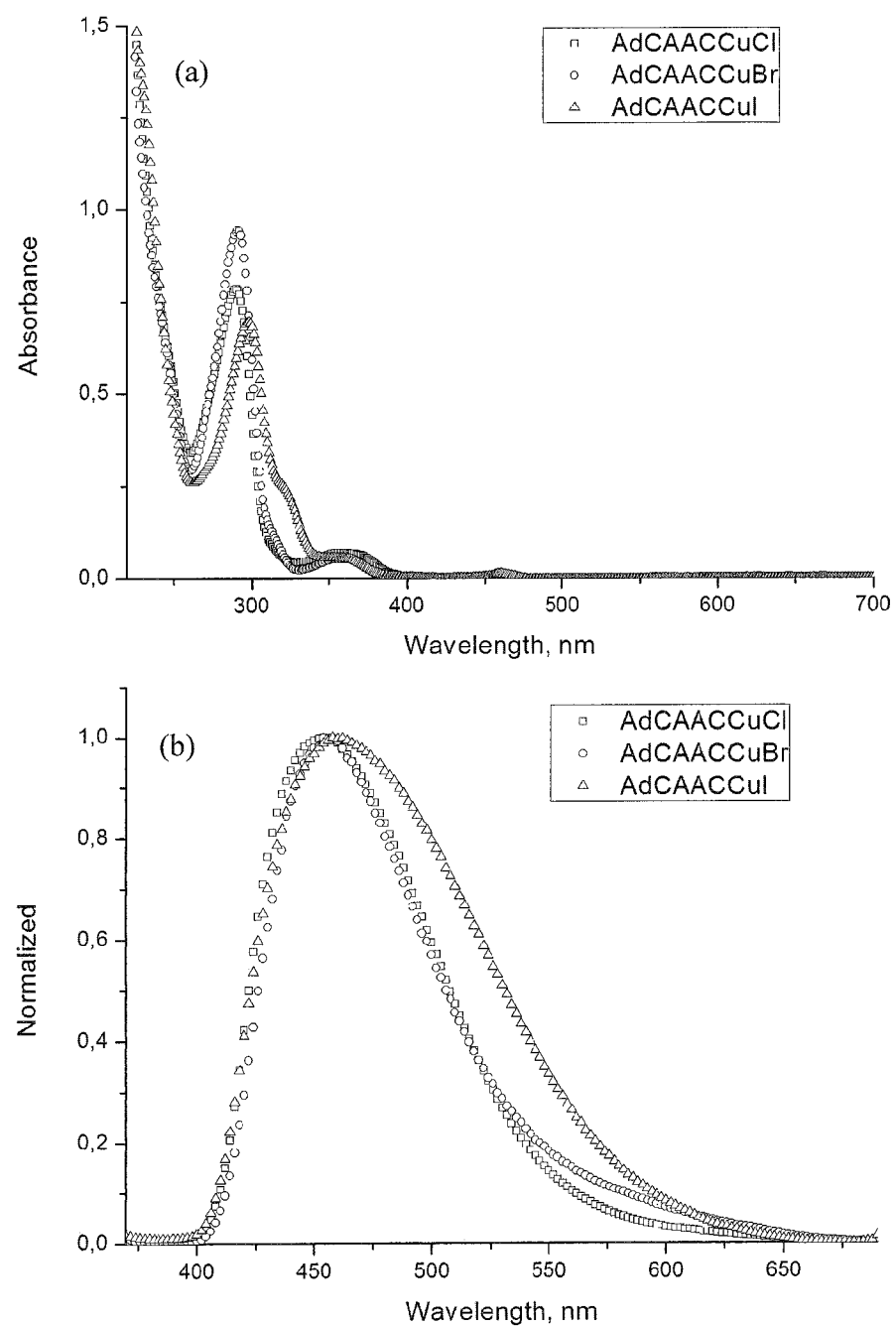
FIG. 3. (a) UV-vis spectra (left) for tetrahydrofuran (THF) solutions of carbene complexes ($^{Ad}$CAAC)CuX (X=Cl, Br, I). (b) Emission spectra (right) for ($^{Ad}$CAAC)CuX (X=Cl, Br, I) in the solid state (excited at $\lambda_{ex}$=365 nm).

FIG. 3 shows the UV/vis and emission spectra of (^{Ad}CAAC)CuX (X=Cl, Br, I) in the solid state.

Figure 4:
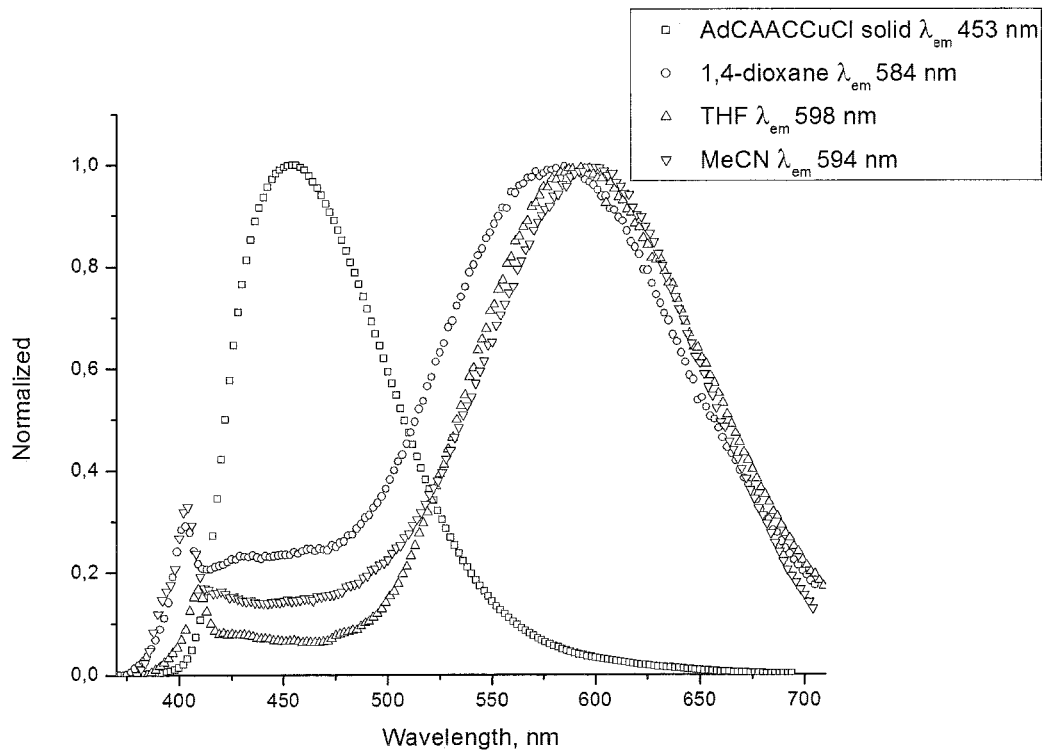
FIG. 4. Comparison of emission spectra for ($^{Ad}$CAAC)CuCl in solid state (excited at 365 nm) and in THF, acetonitrile and 1,4-dioxane solutions.
Figure 5:
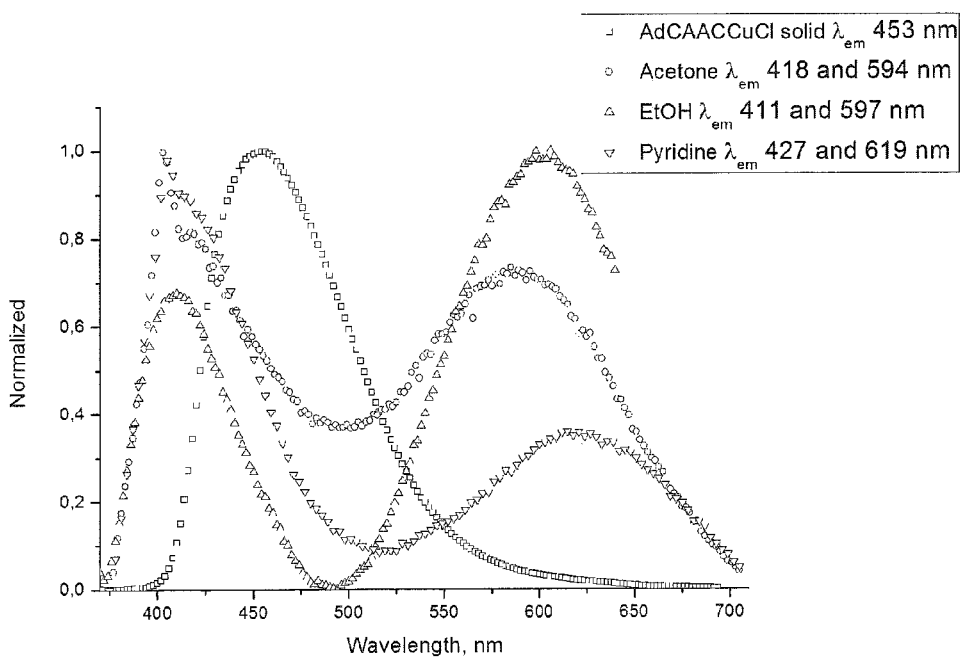
FIG. 5. Comparison of emission spectra for ($^{Ad}$CAAC)CuCl in solid state (excited at 365 nm) and in ethanol, pyridine and acetone solutions.

FIGS. 4 and 5 show the emission spectra of (^{Ad}CAAC)CuCl in different solvents (tetrahydrofuran (THF), acetonitrile, 1,4-dioxane, ethanol, pyridine and acetone).

Example 4. Synthesis of (^{Ad}CAAC)CuCN

The complex was prepared as described for Example 1 from ^{Ad}CAAC: (0.32 g, 0.86 mmol) and CuCN (77 mg, 0.86 mmol) as a white powder. Yield: 0.34 g (0.73 mmol, 86%).

¹H NMR (300 MHz, CD₂Cl₂): δ 7.48 (t, J=7.5 Hz, 1H, aromatic CH), 7.31 (d, J=7.5 Hz, 2H, aromatic CH), 3.24 (d, J=12.9 Hz, 2H, CH₂), 2.77 (sept, J=6.8 Hz, 2H, C$\underline{H}$(CH₃)₂), 2.22-1.79 (m, 14H, adamantyl CH, CH₂), 1.34 (s, 6H, C(C$\underline{H}_3$)₂), 1.31 (d, J=6.8 Hz, 6H, CH(C$\underline{H}_3$)₂), 1.26 (d, J=6.8 Hz, 6H, CH(CH₃)₂). ¹³C NMR (75 MHz, CD₂Cl₂) δ 254.1 (C carbene), 145.3 (o-C), 135.4 (ipso-C), 130.2 (p-CH), 125.2 (m-CH), 79.6 (C$_q$), 65.4 (C$_q$), 48.1 (CH₂), 38.9 (CH₂), 37.6 (CH), 36.6 (CH₂), 34.4 (CH₂), 29.5, 29.4, 28.5, 27.5, 27.0, 22.6 (CH₃). IR (ATR, cm⁻¹): 2969, 2901, 2129 (C≡N), 1519, 1449, 1372, 1097, 934, 807, 778, 730, 432. Anal. Calcd. for C₂₈H₃₉N₂Cu (467.17): C, 71.99; H, 8.41; N, 6.00. Found: C, 69.22; H, 9.19; N, 5.99.

Example 5. Synthesis of (^{Ad}CAAC)CuNCS

Figure 6:
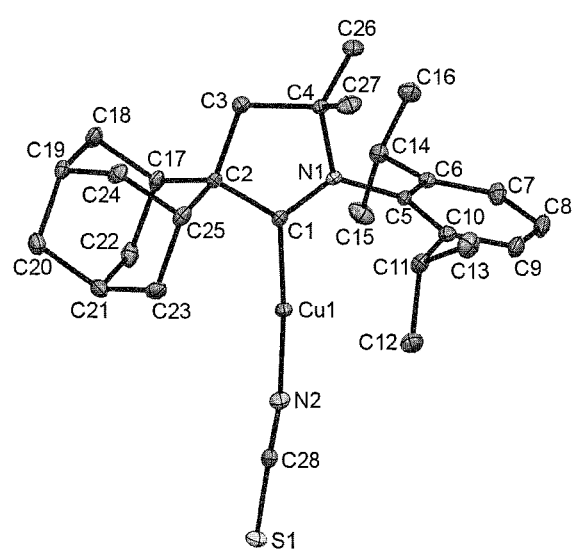
FIG. 6. Crystal structure of ($^{Ad}$CAAC)CuNCS. Ellipsoids are shown at the 50% level. Hydrogen atoms are omitted for clarity. Selected bond lengths [Å] and angles [°]: Cu1-C1 1.8817(14), Cu1-N2 1.8297(13), C1-C2 1.5262(18), C1-N1 1.3011(17), N2-C28 1.161(2), C28-S1 1.6195(15), C1-Cu1-N2 174.96(6), N2-C28-S1 178.96(14), Cu1-N2-C28 171.50(13).

The complex was prepared as described for Example 1 from ^{Ad}CAAC: (0.30 g, 0.80 mmol) and CuSCN (96 mg, 0.80 mmol) as a white powder. Yield 0.34 g (0.68 mmol, 86%). The crystal structure is shown in FIG. 6.

Figure 7:
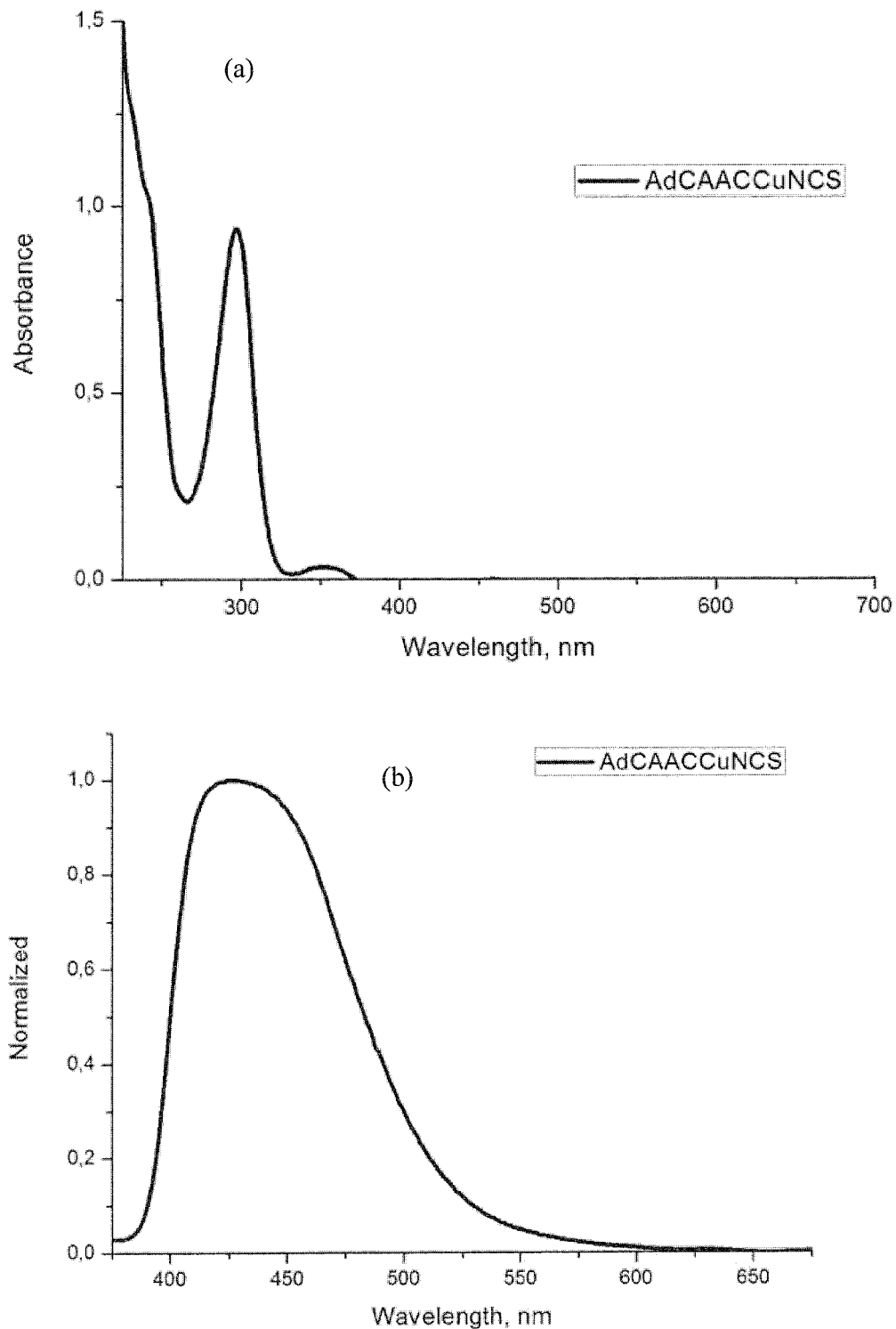
FIG. 7. Left: (a) UV-vis spectrum of ($^{Ad}$CAAC)CuNCS in THF solution. Right: (b) Emission spectrum of ($^{Ad}$CAAC)CuNCS in the solid state (excited at $\lambda_{ex}$=351 nm).

¹H NMR (300 MHz, CD₂Cl₂): δ 7.48 (t, J=7.5 Hz, 1H, aromatic CH), 7.32 (d, J=7.5, 2H, aromatic CH), 3.29 (d, J=13.2 Hz, 2H, CH₂), 2.76 (sept, J=6.9 Hz, 2H, C$\underline{H}$(CH₃)₂), 2.23-1.79 (m, 14H, adamantyl CH, CH₂), 1.33 (s, 6H, C(C$\underline{H}_3$)₂), 1.31 (d, J=6.9 Hz, 6H, CH(C$\underline{H}_3$)₂), 1.26 (d, J=6.9 Hz, 6H, CH(CH₃)₂). ¹³C NMR (75 MHz, CD₂Cl₂) δ 252.4 (C carbene), 145.2 (o-C), 135.7 (C, N=C=S), 135.5 (ipso-C), 130.3 (p-CH), 125.2 (m-CH), 79.4 (C$_q$), 65.0 (C$_q$), 48.1 (CH₂), 38.9 (CH₂), 37.5 (CH), 36.5 (CH₂), 34.4 (CH₂), 29.5, 29.4, 28.4, 27.5, 26.9, 22.6 (CH₃). IR (ATR, cm⁻¹): 2973, 2891, 2081 (Cu—N≡C), 1524, 1458, 1367, 1095, 937, 820 (S=C), 807, 777, 432. Anal. Calcd. for C₂₈H₃₉N₂CuS (499.23): C, 67.36; H, 7.87; N, 5.61. Found: C, 67.22; H, 7.99; N, 5.70. The UV/vis and emission spectra of (^{Ad}CAAC)CuNCS are shown in FIG. 7.

Example 6. Synthesis of (^{Ad}CAAC)Cu(phenylacetylide)

(a) (^{Ad}CAAC)CuOH

To ^{Ad}CAACCuCl (0.3 g, 0.63 mmol) in a Schlenk flask under argon was added an excess of KOH (0.35 g, 6.3 mmol), followed by 15 mL of dry THF and three drops of ᵗBuOH. The mixture was stirred for 36 h and filtered through celite under an argon atmosphere. After washing the celite pad with 8 mL of THF, the filtrate was concentrated in vacuum and distilled water (10 mL) was added to give a yellow precipitate. All volatiles were removed in vacuum. The product was dissolved in dry toluene, filtered through celite, concentrated, and precipitated with light petroleum ether to give a yellow powder. Yield: 0.25 g (0.55 mmol, 88%).

¹H NMR (300 MHz, C₆D₅Br): δ 7.55 (t, J=8.1 Hz, 2H, aromatic CH), 7.43 (d, J=8.1 Hz, 2H, aromatic CH), 4.21 (d, J=12.2 Hz, 2H, CH₂), 3.07 (sept, J=6.0 Hz, 2H, C$\underline{H}$(CH₃)₂), 2.17-1.89 (m, 14H adamantyl CH and CH₂) 1.71 (d, J=6.0 Hz, 6H, CH(C$\underline{H}_3$)₂), 1.51 (d, J=6.0 Hz, 6H, CH(C$\underline{H}_3$)₂), 1.35 (s, 6H, C(CH₃)₂), 0.15 (s, 1H, OH). ¹³C NMR (75 MHz, C₆D₅Br) δ 254.4 (C carbene), 145.0 (o-C), 135.8 (ipso-C), 129.6 (p-C overlapping with residual solvent signal), 124.7 (m-C), 77.3 (C$_q$), 64.3 (C$_q$), 48.0 (CH₂), 39.0 (CH₂), 37.2 (CH), 35.5 (CH₂), 34.4 (CH₂), 29.1, 29.0, 28.0, 27.5, 27.0, 22.8 (CH₃). Anal. Calcd. for C₂₈H₄₀NCuO: (470.17): C, 71.53; H, 8.57; N, 2.98. Found: C, 71.43; H, 8.72; N, 2.96.

(b) (^{Ad}CAAC)Cu(C≡CPh)

To ^{Ad}CAACCuOH (60 mg, 0.13 mmol) in dry THF was added phenylacetylene (20 μL, 0.18 mmol). The mixture was stirred overnight and evaporated to yield a light-yellow solid which was washed with light petroleum and dried in vacuum. Yield 60 mg, (0.11 mmol, 85%).

¹H NMR (300 MHz, CD₂Cl₂): δ 7.48 (t, J=7.2 Hz, 1H aromatic CH), 7.33 (d, J=7.2 Hz, 2H aromatic CH), 7.20 (br d, J=7.4 Hz, 2H, aromatic o-CH, C₆H₅), 7.12 (br t, J=7.4 Hz, 2H, aromatic m-CH, C₆H₅), 7.12 (br t, J=7.4 Hz, 1H, aromatic p-CH, C₆H₅), 3.57 (d, J=12.6 Hz, 2H, CH₂), 2.83 (sept, J=6.6 Hz, 2H C$\underline{H}$(CH₃)₂), 2.21-1.79 (m, 14H, adamantyl CH and CH₂), 1.36 (d, J=6.6 Hz, 6H CH(C$\underline{H}_3$)₂), 1.32 (s, 6H, C(CH₃)₂), 1.31 (d, J=6.6 Hz, 6H, CH(C$\underline{H}_3$)₂). ¹³C NMR (75 MHz, CD₂Cl₂): δ 256.0 (C carbene), 145.4 (o-C), 135.5 (ipso-C), 131.7 (o-C, C₆H₅), 129.7 (p-CH), 128.0 (m-C, C₆H₅), 127.9 (Cu—C$_q$, acetylide), 125.5 (p-CH, C₆H₅), 124.9 (m-CH), 121.7 (ipso-C, C₆H₅), 107.3 (C$_q$, acetylide), 78.9 (C$_q$), 65.6 (C$_q$), 48.1 (CH₂), 39.0 (CH₂), 37.6 (CH), 36.4 (CH₂), 34.5 (CH₂), 29.47 (CH), 29.42, 28.6, 27.6, 27.1, 22.5 (CH₃). IR (ATR, cm⁻¹): 2970, 2897, 2087 (C≡C), 1595, 1505, 1463, 1365, 1096, 808, 755, 692, 528. Anal. Calcd. for C₃₅H₄₄NCu (542.28): C, 72.52; H, 8.18; N, 2.58. Found: C, 72.56; H, 8.33; N, 2.68.

Figure 8:
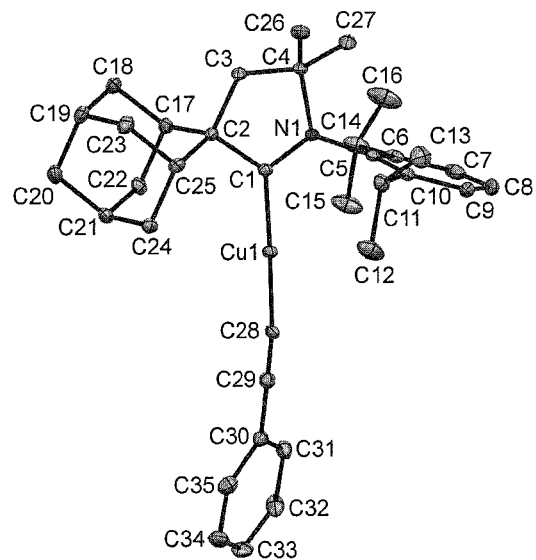
FIG. 8. Crystal structure of ($^{Ad}$CAAC)CuCCPh. Ellipsoids are shown at the 50% level. Hydrogen atoms are omitted for clarity. Selected bond lengths [Å] and angles [°]: Cu1-C1 1.9005(16), Cu1-C28 1.9044(17), C1-C2 1.526(2), C1-N1 1.308(2), C28-C29 1.172(3), C29-C30 1.144(3), C1-Cu1-C28 175.44(7), Cu1-C28-C29 172.75(17).
Figure 9:
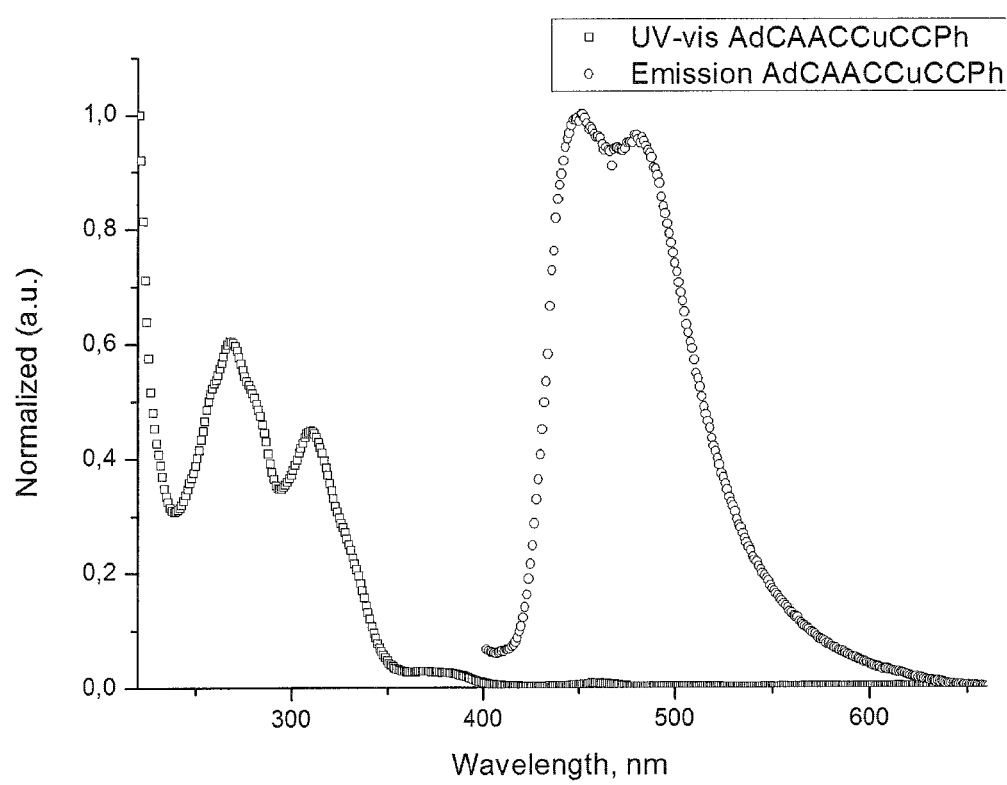
FIG. 9. UV-vis spectrum (left) for THF solution of ($^{Ad}$CAAC)CuCCPh; Emission spectrum (right) for ($^{Ad}$CAAC)CuCCPh in the solid state (excited at $\lambda_{ex}$=374 nm).

FIG. 8 shows the crystal structure of the complex.
FIG. 9 shows the UV/vis and emission spectra of (^{Ad}CAAC)Cu(CCPh).

Example 7. Synthesis of (^{Ad}CAAC)CuOPh

A mixture of ^{Ad}CAACCuCl (0.20 g, 0.42 mmol), NaOᵗBu (40 mg, 0.42 mmol) and phenol (39 mg, 0.42 mmol) were placed in a Schlenk flask under argon. Dry THF (10 mL) was added to and the mixture was stirred overnight. All volatiles were removed in vacuum. The residue was dissolved in dry toluene, centrifuged and decanted. A slightly yellow solution was evaporated to give a white solid. Yield 0.20 g (0.38 mmol, 91%).

¹H NMR (300 MHz, CD₂Cl₂): δ 7.54 (t, J=7.8 Hz, 1H, CH aromatic), 7.37 (d, J=7.8 Hz, 2H, CH aromatic), 6.76 (br t, J=6.0 Hz, 2H, m-C₆H₅), 6.30 (t, J=6.0 Hz, 1H, p-C₆H₅), 5.79 (d, J=6.0 Hz, 2H, o-C₆H₅), 3.57 (d, J=12.3 Hz, 2H, CH₂), 2.87 (sept, J=6.6 Hz, 2H, CH(CH₃)₂), 2.27-1.80 (m, 14H, adamantyl CH and CH$_2$), 1.37 (s, 6H, C(CH$_3$)$_2$), 1.32 (d, J=6.6 Hz, 6H, CH(CH$_3$)$_2$), 1.26 (d, J=6.6 Hz, 6H, CH(CH$_3$)$_2$). $^{13}$C NMR (75 MHz, CD$_2$Cl$_2$): δ 253.5 (carbene C), 167.8 (ipso-C$_{phenol}$), 145.7 (o-C), 136.4 (ipso-C), 129.9 (para-CH), 128.9 (meta-CH$_{phenol}$), 125.4 (m-CH), 119.6 (ortho-C$_{phenol}$), 113.8 (para-C$_{phenol}$) 78.7 (C$_q$), 64.8 (C$_q$), 48.4 (CH$_2$), 39.0 (CH$_2$), 37.6 (CH), 36.3 (CH$_2$), 34.6 (CH$_2$), 29.6 (CH), 29.5, 28.4, 27.6, 26.6, 22.8 (CH$_3$). Anal. Calc. for C$_{33}$H$_{44}$NCuO (534.25): C, 74.19; H, 8.30; N, 2.62. Found: C, 74.33; H, 8.41; N, 2.57.

Figure 10:
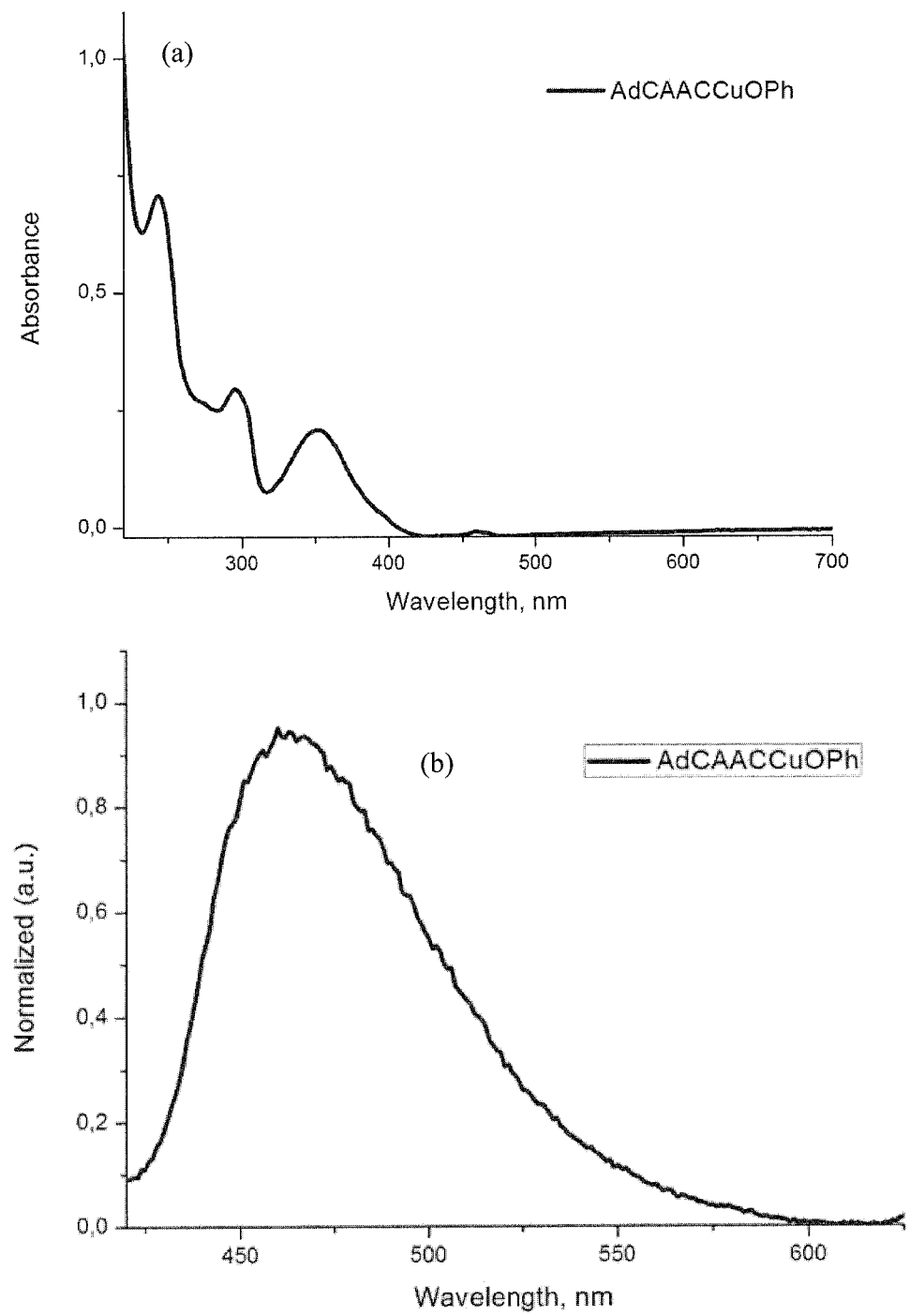
FIG. 10. (a) UV-vis spectrum of a THF solution of ($^{Ad}$CAAC)CuOPh. (b) Emission spectrum of ($^{Ad}$CAAC)CuOPh in the solid state (excited at $\lambda_{ex}$=352 nm).

FIG. 10 shows the UV/vis and emission spectra of ($^{Ad}$CAAC)CuOPh.

Example 8. Synthesis of ($^{Ad}$CAAC)Cu-2-tert-butyl-5-methylphenolate

Following the procedure described in Example 7, the compound was made from ($^{Ad}$CAAC)CuCl (0.2 g, 0.42 mmol), NaO$^t$Bu (40 mg, 0.42 mmol) and 2-tert-butyl-5-methylphenol (71 μL, 69 mg, 0.42 mmol) as a white powder. Yield: 0.25 g (0.41 mmol, 96%).

$^1$H NMR (300 MHz, CD$_2$Cl$_2$) δ 7.47 (t, 1H, J=7.2 Hz, aromatic CH), 7.32 (d, J=7.2 Hz, 2H, aromatic CH), 6.78 (s, 1H, meta-CH phenol), 6.07 (s, 1H, para-CH phenol), 5.61 (s, 1H, ortho-CH phenol), 3.70 (d, J=11.4 Hz, 2H, CH$_2$), 2.86 (sept, J=6.6 Hz, 2H, CH(CH$_3$)$_2$), 2.26-1.80 (m, 17H, adamantyl CH and CH$_2$ overlapping with CH$_3$ phenol), 1.36 (s, 6H, C(CH$_3$)$_2$), 1.31 (d, J=6.6 Hz, 6H, CH(CH$_3$)$_2$), 1.29 (d, J=6.6 Hz, 6H, CH(CH$_3$)$_2$), 1.20 (s, 9H, $^t$Bu phenol). $^{13}$C NMR (75 MHz, CD$_2$Cl$_2$) δ 253.9 (C carbene), 166.6 (ipso-OC$_{phenol}$), 145.5 (o-C), 136.3 (ipso-C), 135.9 (ipso-C$_{phenol}$), 135.0 (ipso-C$_{phenol}$) 129.8 (para-CH), 125.3 (meta-CH phenol), 125.1 (meta-CH), 122.8 (ortho-CH phenol), 113.9 (para-CH phenol), 78.4 (C$_q$), 64.6 (C$_q$), 48.3 (CH$_2$), 39.0 (CH$_2$), 37.6 (CH), 35.9 (CH$_2$), 34.63 (CH$_2$), 34.60 (C$^t$Bu), 29.57, 29.52, 29.46, 28.5, 27.6, 26.7, 22.8 (CH$_3$), 20.9 (CH$_3$). Anal. Calcd. for C$_{38}$H$_{54}$NCuO (604.39): C, 75.52; H, 9.01; N, 2.32. Found: C, 75.38; H, 8.86; N, 2.21.

Figure 11:
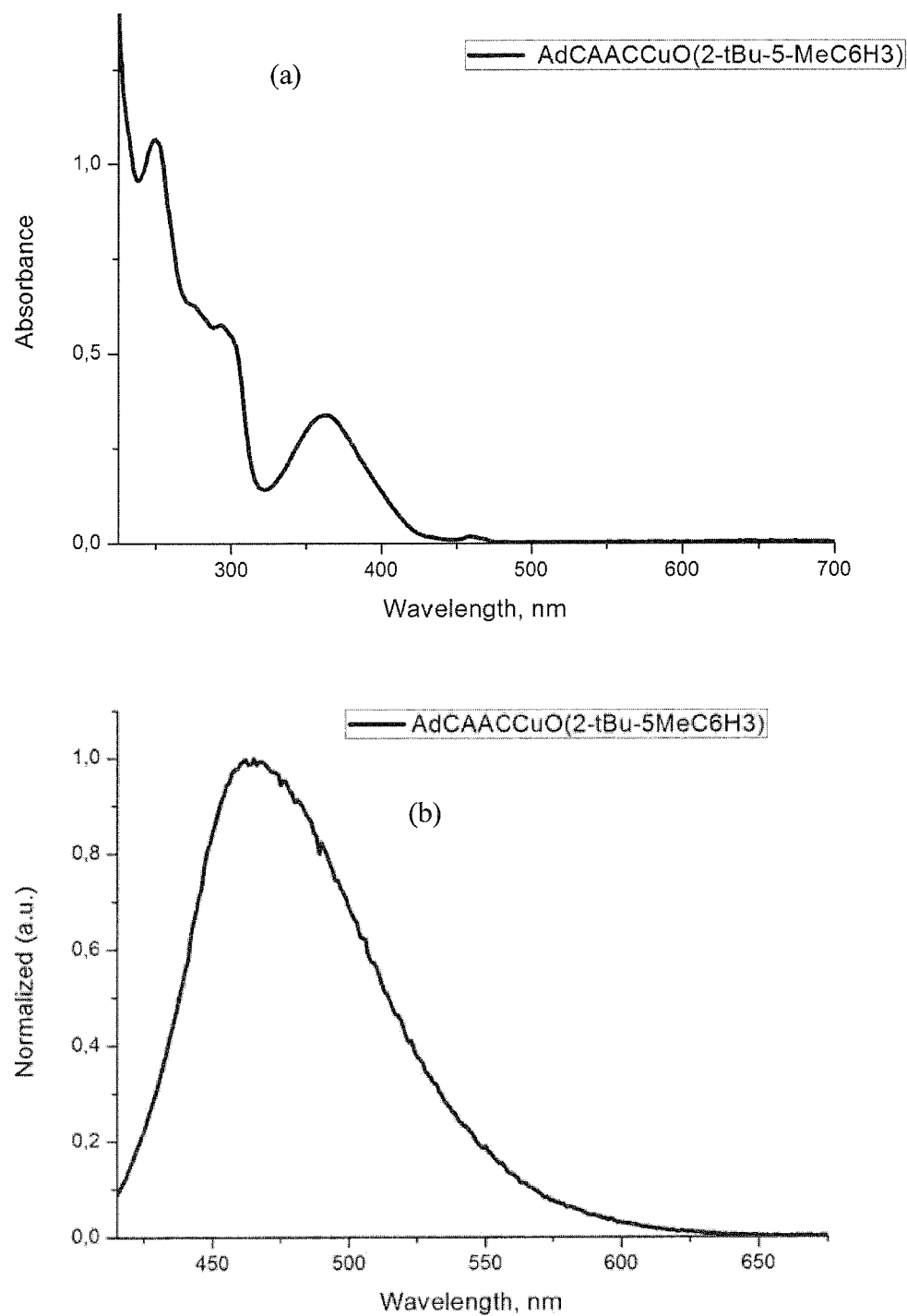
FIG. 11. Left: UV-vis spectrum of a THF solution of ($^{Ad}$CAAC)CuO(2-$^t$Bu-5-MeC$_6$H$_3$). Right: Emission spectrum of ($^{Ad}$CAAC)CuO(2-$^t$Bu-5-MeC$_6$H$_3$) in the solid state (excited at $\lambda_{ex}$=381 nm).

FIG. 11 shows the UV/vis and emission spectra of this complex.

Example 9. Synthesis of ($^{Ad}$CAAC)CuNHPh

A mixture of ($^{Ad}$CAAC)CuCl (0.2 g, 0.42 mmol), NaO$^t$Bu (40 mg, 0.42 mmol) and aniline (38 μL, 39 mg, 0.42 mmol) in dry THF under an argon atmosphere was stirred overnight. All volatiles were evaporated. The residue was dissolved in toluene and centrifuged under argon. The supernatant was decanted and evaporated in vacuum to give a bright lime-coloured solid. Yield: 0.21 g (0.40 mmol, 94%).

$^1$H NMR (300 MHz, CD$_2$Cl$_2$): δ 7.53 (t, J=7.8 Hz, 1H, aromatic CH), 7.35 (d, J=7.8 Hz, 2H, aromatic CH), 6.57 (t, J=8.1 Hz, 2H, meta-CH aniline), 5.96 (t, J=8.1 Hz, 1H, para-CH aniline), 5.54 (d, J=8.1 Hz, 2H, ortho-CH aniline), 3.61 (d, J=12.1 Hz, 2H, CH$_2$), 3.20 (s, 1H, NH), 2.87 (sept, J=6.6 Hz, 2H, CH(CH$_3$)), 2.25-1.80 (m, 14H, adamantyl), 1.37 (s, 6H C(CH$_3$)), 1.32 (d, J=6.6 Hz, 6H, CH(CH$_3$)), 1.28 (d, J=6.6 Hz, 6H, CH(CH$_3$)). $^{13}$C NMR (75 MHz, CD$_2$Cl$_2$) δ 254.6 (carbene C), 159.9 (ipso-C$_{aniline}$), 145.9 (o-C), 136.4 (ipso-C), 129.5 (p-CH), 128.6 (meta-C$_{aniline}$), 125.2 (m-CH), 115.8 (ortho-C$_{aniline}$), 109.9 (para-C$_{aniline}$), 78.2 (C$_q$), 64.9 (C$_q$), 48.4 (CH$_2$), 39.0 (CH$_2$), 37.5 (CH), 36.3 (CH$_2$), 34.5 (CH$_2$), 29.5, 29.4, 28.5, 27.7, 26.3, 22.9 (CH$_3$). Anal. Calcd. for C$_{33}$H$_{45}$N$_2$Cu (533.27) C, 74.33; H, 8.51; N, 5.25. Found: C, 74.20; H, 8.61; N, 5.11.

Example 10. Synthesis of ($^{Ad}$CAAC)CuNPh$_2$

Following the procedure described for Example 9, the complex was made from ($^{Ad}$CAAC)CuCl (0.2 g, 0.42 mmol), NaO$^t$Bu (40 mg, 0.42 mmol) and diphenylamine (71 mg, 0.42 mmol) as a lime powder. Yield: 0.25 g (0.41 mmol, 98%).

$^1$H NMR (300 MHz, CD$_2$Cl$_2$): δ 7.59 (t, J=7.8 Hz, 1H, aromatic CH), 7.39 (d, J=7.8 Hz, 2H, aromatic CH), 6.83 (t, J=8.1 Hz, 4H, meta-CH aniline), 6.42 (t, J=8.1 Hz, 2H, para-CH aniline), 6.26 (d, J=8.1 Hz, 4H, ortho-CH aniline), 3.38 (d, J=12.3 Hz, 2H, CH$_2$), 2.87 (sept, J=6.9 Hz, 2H, CH(CH$_3$)), 2.22-1.68 (m, 14H, adamantyl CH and CH$_2$), 1.35 (s, 6H C(CH$_3$)), 1.32 (d, J=6.9 Hz, 6H, CH(CH$_3$)), 1.26 (d, J=6.9 Hz, 6H CH(CH$_3$)). $^{13}$C NMR (75 MHz, CD$_2$Cl$_2$) δ 253.9 (carbene C), 156.5 (ipso-C aniline), 145.7 (o-C), 136.3 (ipso-C), 129.8 (p-CH), 128.8 (meta-C$_{aniline}$), 125.5 (m-CH), 121.4 (ortho-C$_{aniline}$), 116.1 (para-C$_{aniline}$), 78.4 (C$_q$), 65.1 (C$_q$), 48.4 (CH$_2$), 38.9 (CH$_2$), 37.5 (CH), 35.8 (CH$_2$), 34.5 (CH$_2$), 29.59, 29.53, 28.2, 27.5, 26.2, 22.9 (CH$_3$). Anal. Calcd. for C$_{39}$H$_{49}$N2Cu (609.3) C, 76.87; H, 8.10; N, 4.60. Found: C, 76.77; H, 8.23; N, 4.59.

Example 11. Synthesis of ($^{Ad}$CAAC)Cu(carbazolate) (CMA2)

Following the procedure described for Example 9, the complex was made from ($^{Ad}$CAAC)CuCl (0.2 g, 0.42 mmol), NaO$^t$Bu (40 mg, 0.42 mmol) and carbazole (70 mg, 0.42 mmol) as a yellow powder. Yield: 0.22 g (0.36 mmol, 86%).

$^1$H NMR (300 MHz, CD$_2$Cl$_2$): δ 7.90 (d, J=7.4 Hz, 2H, carbazole CH$^4$), 7.72 (t, J=7.8 Hz, 1H, aromatic CH), 7.49 (d, J=7.8 Hz, 2H, aromatic CH), 7.04 (t, J=7.4 Hz, 2H, carbazole CH$^2$), 6.89 (t, J=7.4 Hz, 2H, carbazole CH$^3$), 6.33 (d, J=7.4 Hz, 2H, carbazole CH$^1$), 3.89 (d, J=12.3 Hz, 2H, CH$_2$), 2.97 (sept, J=6.6 Hz, 2H, CH(CH$_3$)), 2.33-1.88 (m, 14H, adamantyl CH and CH$_2$), 1.42 (s, 6H, C(CH$_3$)), 1.35 (d, J=6.6 Hz, 6H, CH(CH$_3$)), 1.18 (d, J=6.6 Hz, 6H, CH(CH$_3$)). $^{13}$C NMR (75 MHz, CD$_2$Cl$_2$) δ 254.1 (C carbene), 150.3 (ipso-CN carbazole), 146.1 (o-C), 136.4 (ipso-C), 129.9 (p-CH), 125.6 (m-CH), 124.4 (ipso-C carbazole), 123.4 (carbazole CH$^2$), 119.2 (carbazole CH$^4$), 115.5 (carbazole CH$^3$), 114.8 (carbazole CH$^1$), 79.1 (C$_q$), 65.4 (C$_q$), 48.4 (CH$_2$), 38.9 (CH$_2$), 37.7 (CH), 36.5 (CH$_2$), 34.5 (CH$_2$), 29.64, 29.62, 28.7, 27.5, 26.5, 22.7 (CH$_3$). Anal. Calcd. for C$_{39}$H$_{47}$N$_2$Cu (607.35): C, 77.13; H, 7.80; N, 4.61. Found: C, 77.07; H, 7.89; N, 4.70.

Figure 12:
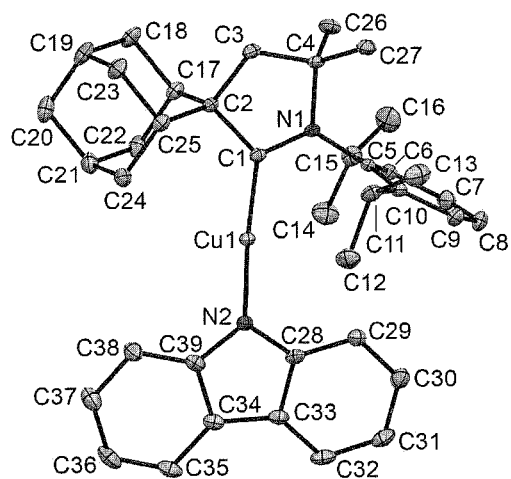
FIG. 12. X-ray structure of ($^{Ad}$CAAC)CuCz (CMA2). Ellipsoids are shown at the 50% level. Hydrogen atoms are omitted for clarity. Selected bond lengths [Å] and angles [°]: Cu—C1 1.8846(15), Cu—N2 1.8626(14), C1-C2 1.527(2), C1-N1 1.305(2), C1-Cu—N2 174.34(6); dihedral angle between best planes C1-C2-C3-C4-N1 and C28-N2-C39-C33-C34=2.8°.

FIG. 12 shows the X-ray structure of this complex (data given in the summary of FIG. 12 above).

Example 12. Synthesis of ($^{Ad}$CAAC)CuNH{3,5-(CF$_3$)$_2$C$_6$H$_3$}

Following the procedure described for Example 9, the complex was made from ($^{Ad}$CAAC)CuCl (0.2 g, 0.42 mmol), NaO$^t$Bu (40 mg, 0.42 mmol) and 3,5-bis(trifluoromethyl)aniline (96 mg, 0.42 mmol) as a yellow-green powder. Yield: 0.25 g (0.37 mmol, 90%).

$^1$H NMR (300 MHz, CD$_2$Cl$_2$): δ 7.49 (t, J=7.8 Hz, 1H, aromatic CH), 7.32 (d, J=7.8, 2H, aromatic CH), 6.41 (br s, 1H, p-CH aniline), 6.18 (br s, 2H, o-CH), 3.63 (s, 1H, NH), 3.53 (d, J=12.3 Hz, 2H, CH$_2$), 2.85 (sept, J=6.9 Hz, 2H, CH(CH$_3$)), 2.25-1.80 (m, 14H, adamantyl CH and CH$_2$), 1.35 (s, 6H, C(CH$_3$)), 1.31 (d, J=6.9 Hz, 6H, CH(CH$_3$)), 1.27 (d, J=6.9 Hz, 6H, CH(CH$_3$)). $^{13}$C NMR (75 MHz, CD$_2$Cl$_2$): δ 254.1 (carbene C), 160.6 (ipso-C$_{aniline}$), 145.4 (ipso-C), 135.8 (para-C), 131.5 (quart, $^2$J$_{CF}$=29.2 Hz, meta-C$_{aniline}$), 130.2 (meta-C), 125.1 (ortho-C), 124.7 (quart, $^1$J$_{CF}$=270 Hz, CF$_{3aniline}$), 114.8 (ortho-C$_{aniline}$), 102.2 (para-C$_{aniline}$), 78.60 (C$_q$), 65.0 (C$_q$), 48.3 (CH$_2$), 38.9 (CH$_2$), 37.5 (CH), 36.3 (CH$_2$), 34.5 (CH$_2$), 29.5, 29.4, 28.4, 27.6, 26.5, 22.7 (CH$_3$). $^{19}$F NMR (282 MHz, CD$_2$Cl$_2$) δ −63.19. Anal. Calcd. for C$_{35}$H$_{43}$N$_2$CuF$_6$ (669.26): C, 62.81; H, 6.48; N, 4.19. Found: C, 62.98; H, 6.53; N, 4.31.

Figure 13:
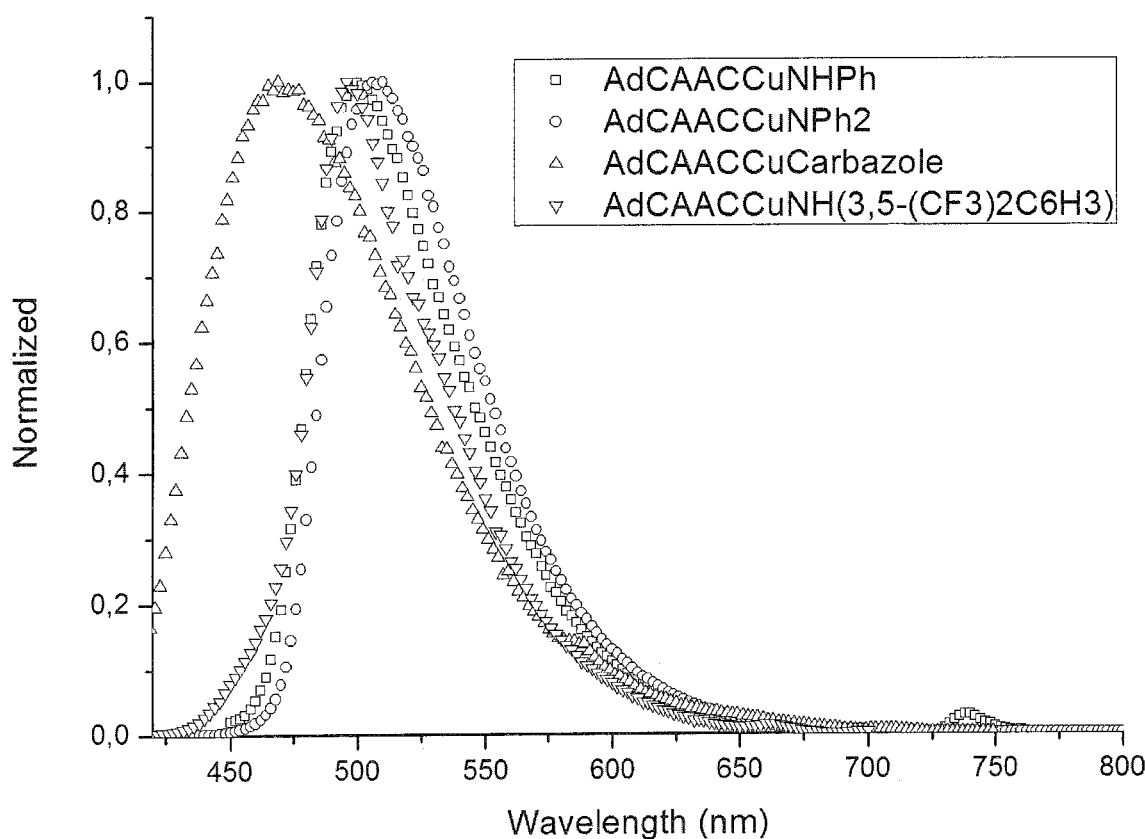
FIG. 13. Superimposed emission spectra of several ($^{Ad}$CAAC)Cu anilides in the solid state.

FIG. 13 shows a comparison of the emission spectra of the anilide complexes ($^{Ad}$CAAC)CuX, where X=NHPh, NPh$_2$, carbazolate and NH(3,5-(CF$_3$)$_2$C$_6$H$_3$).

Example 13. Photophysical Data on Complexes

The complexes according to the present invention offer several advantages for use in OLED devices, such as short excitation lifetimes in the range of nanoseconds to tens of microseconds. The photophysical properties of representative examples were determined and are shown in Table 1 below. It should be noted that some of the quantum yields were measured in air, which explains surprisingly low yields in some cases.

150.0 (ipso-CN carbazole), 146.2 (o-C), 136.7 (ipso-C), 129.9 (p-CH), 125.7 (m-CH), 124.4 (ipso-C carbazole), 123.7 (carbazole CH$^2$), 119.4 (carbazole CH$^4$), 116.2 (carbazole CH$^3$), 114.2 (carbazole CH$^1$), 77.4 (C$_q$), 64.5 (C$_q$), 49.2 (CH$_2$), 39.4 (CH$_2$), 37.7 (CH), 35.8 (CH$_2$), 34.8 (CH$_2$), 29.5, 28.6, 27.8, 26.5, 23.4 (CH$_3$). Anal. Calcd. for C$_{39}$H$_{47}$N$_2$Au (740.76): C, 63.23; H, 6.39; N, 3.78. Found: C, 63.34; H, 6.43; N, 3.71.

Figure 14:
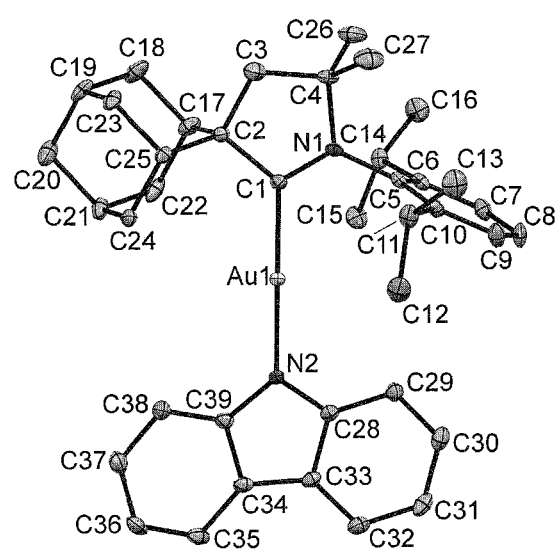
FIG. 14. X-ray structure of ($^{Ad}$CAAC)AuCz (CMA1). Ellipsoids are shown at the 50% level. Hydrogen atoms are omitted for clarity. Selected bond lengths [Å] and angles [°]: Au1-C1 1.991(3), Au1-N2 2.026(2), C1-C2 1.528(4), C1-N1 1.299(4), N2-C28 1.379(4), N2-C39 1.381(4), C1-Au1-N2 178.78(11); dihedral angle between best planes C1-C2-C3-C4-N1 (CAAC) and C28-N2-C39-C33-C34 (carbazole)=16.5°.

FIG. 14 shows the X-ray structure of this complex (data given in the summary of FIG. 14 above).

Example 15. Synthesis of ($^{Ad}$CAAC)Au(3,6-di-t-butylcarbazolate) (CMA4)

Following the procedure described in Example 14, the complex was made from (CAAC)AuCl (0.2 g, 0.33 mmol), NaO$^t$Bu (33 mg, 0.34 mmol) and 3,6-di-$^t$Bu-carbazole (92 mg, 0.33 mmol) as a yellow powder. Yield: 0.255 g (0.33 mmol, 91%).

TABLE 1

| Complex | Absorption/nm (10$^3$ ε/M$^{-1}$ cm$^{-1}$) in THF | Solid state emissions | | |
|---|---|---|---|---|
| | | λ$_{em}$ (λ$_{ex}$) (nm) | τ$^a$ | Φ$^b$ |
| ($^{Ad}$CAAC)CuCl | 290 (2.2), 365 (0.2) | 453 (300-420) | 2.9 ns 22.9 μs | 0.93 |
| ($^{Ad}$CAAC)CuBr | 291 (7.8), 357 (0.4) | 454 (300-420) | 3.0 ns 20.3 μs | 0.61 |
| ($^{Ad}$CAAC)CuI | 298 (5.8), 352 (0.4) | 460 (300-420) | 2.3 ns 10.1 μs | 0.28 |
| ($^{Ad}$CAAC)CuNCS | 297 (11.7), 354 (0.4) | 429 (290-410) | 2.7 ns 10.4 μs | 0.31 |
| ($^{Ad}$CAAC)CuNHPh | 240 (15.6), 291 (6.5), 342 (2.2), 408 (sh, 1.0) | 500 (300-470) | 10.1 ns 2.0 μs | 0.11 |
| ($^{Ad}$CAAC)CuNPh$_2$ | 286 (13.9), 332 (1.5), 413 (0.4) | 502 (300-470) | 3.6 ns 5.4 μs | 0.20 |
| ($^{Ad}$CAAC)Cu(carbazole) | 235 (26.2), 273 (18), 308 (5.2), 352 (3.9), 372 (5.1), 390 (3.2) | 469 (300-440) | 18.8 ns 1.4 μs | 0.09 |
| ($^{Ad}$CAAC)CuOPh | 244 (7.5), 295 (3.1), 352 (2.2) | 467 (300-450) | 2.3 ns 9.4 μs | 0.57 |
| ($^{Ad}$CAAC)CuSPh | 248 (7.3), 277 (6.9), 363 (3.2) | 484 (300-425) | 12.6 ns 5.4 μs | 0.62 |
| ($^{Ad}$CAAC)CuO(2,6-C$_6$H$_3$F$_2$) | 238 (10.6), 281 (4.4), 326 (2.2), 370 (sh, 0.5) | 385 (281) 460 (381) | 9.3 ns 2.4 μs | 0.22 |
| ($^{Ad}$CAAC)CuO(2-$^t$Bu-5-MeC$_6$H$_3$) | 250 (12.1), 285 (6.4), 362 (3.8) | 465 (300-450) | 2.1 ns 10.4 μs | 0.38 |
| ($^{Ad}$CAAC)CuO(3,5-C$_6$H$_3$($^t$Bu)$_2$) | 247 (7.3), 279 (4.1), 290 (3.8), 362 (1.6) | 466 (300-450) | 2.4 ns 10.7 μs | 0.57 |

$^a$At 298K, measured at λ$_{max}$.
$^b$Solid state quantum yield.

Example 14. Synthesis of ($^{Ad}$CAAC)Au(carbazolate) (CMA1)

A mixture of (CAAC)AuCl (0.2 g, 0.33 mmol), NaO$^t$Bu (33 mg, 0.34 mmol) and carbazole (57 mg, 0.33 mmol) in dry THF (20 mL) under an argon atmosphere was stirred for 6 h. The mixture was centrifuged and solution of the product was decanted. All volatiles were evaporated in vacuum to give an off-white powder. Yield: 0.23 g (0.31 mmol, 94%). Product usually contains THF as a solvate and therefor was kept under vacuum for 2 h at 80° C. to remove solvate molecules.

$^1$H NMR (300 MHz, CD$_2$Cl$_2$): δ 7.92 (d, J=7.8 Hz, 2H, carbazole CH$^4$), 7.69 (t, J=7.8 Hz, 1H, aryl), 7.46 (d, J=7.8 Hz, 2H, aryl), 7.08 (t, J=7.8 Hz, 2H, carbazole CH$^2$), 6.90 (t, J=7.8 Hz, 2H, carbazole CH$^3$), 6.65 (d, J=7.8 Hz, 2H, carbazole CH$^1$), 4.34 (d, J=13.5 Hz, 2H, CH$_2$), 2.92 (sept, J=6.6 Hz, 2H, CHMe$_2$), 2.44-1.82 (m, 14H, adamantyl CH and CH$_2$), 1.44 (s, 6H, C(CH$_3$)), 1.34 (d, J=6.6 Hz, 12H, CHMe$_2$). $^{13}$C NMR (75 MHz, CD$_2$Cl$_2$) δ 244.6 (C carbene), $^1$H NMR (300 MHz, CD$_2$Cl$_2$): δ 7.93 (d, J=2.1 Hz, 2H, carbazole CH$^4$), 7.69 (t, J=8.0 Hz, 1H, aromatic CH), 7.46 (d, J=8.0 Hz, 2H, aryl), 7.15 (dd, J=8.8 and 2.1 Hz, 2H, carbazole CH$^2$), 6.58 (d, J=8.8 Hz, 2H, carbazole CH$^1$), 4.34 (d, J=11.8 Hz, 2H, CH$_2$), 2.90 (sept, J=7.2 Hz, 2H, CHMe$_2$), 2.34-1.87 (m, 14H, adamantyl CH and CH$_2$), 1.42 (s, 6H, CMe$_2$), 1.39 (s, 18H, $^t$Bu), 1.35 (d, J=7.2 Hz, 6H, CHMe$_2$) overlapping with 1.34 (d, J=7.2 Hz, 6H, CHMe$_2$). $^{13}$C NMR (75 MHz, CD$_2$Cl$_2$) δ 244.6 (C carbene), 148.4 (ipso-CN carbazole), 146.1 (o-C), 146.0 (ipso-C), 138.7 (ipso-C$^3$ carbazole $^t$Bu), 136.6 (ipso-C), 129.8 (p-CH), 125.5 (m-CH), 124.0 (ipso-C carbazole), 121.4 (carbazole CH$^2$), 115.3 (carbazole CH$^4$), 113.3 (carbazole CH$^1$), 77.2 (C$_q$), 64.4 (C$_q$), 49.1 (CH$_2$), 39.3 (CH$_2$), 37.5 (CH), 35.7 (CH$_2$), 34.7 (C, $^t$Bu), 34.6 (CH$_2$), 29.49, 28.5, 27.7, 26.4, 23.3 (CH$_3$). Anal. Calcd. for C$_{47}$H$_{63}$N$_2$Au (852.98): C, 66.18; H, 7.44; N, 3.28. Found: C, 66.27; H, 7.56; N, 3.22.

Figure 25:
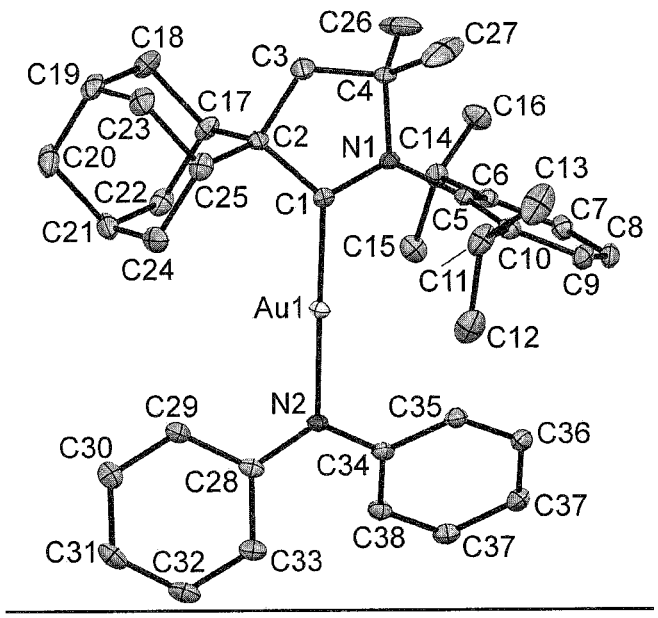
FIG. 25. Crystal structures of a. (CAAC)AuNPh$_2$ (CMA3) and b. (CAAC)AuDTBCz (CMA4). Ellipsoids are shown at the 50% level. Hydrogen atoms are omitted for clarity. Selected bond lengths (Å) and angles (°): CMA3: Au1-C1 1.985(2), Au1-N2 2.040(2), C1-C2 1.532(3), C1-N1 1.304(3), N2-C28 1.393(3), N2-C34 1.401(3), C1-Au1-N2 177.27(9); dihedral angle between best plane C1-C2-C3-C4-N1 (CAAC) and C28-N2-C34=14.9°. CMA4: Au1-C1 1.997(3), Au1-N2 2.020(2), C1-C2 1.536(4), C1-N1 1.307(4), N2-C28 1.395(4), N2-C39 1.384(4), C1-Au1-N2 178.25(11); dihedral angle between best planes C1-C2-C3-C4-N1 (CAAC) and C28-N2-C39-C33-C34 (carbazole)=14.7°.
Figure 25:
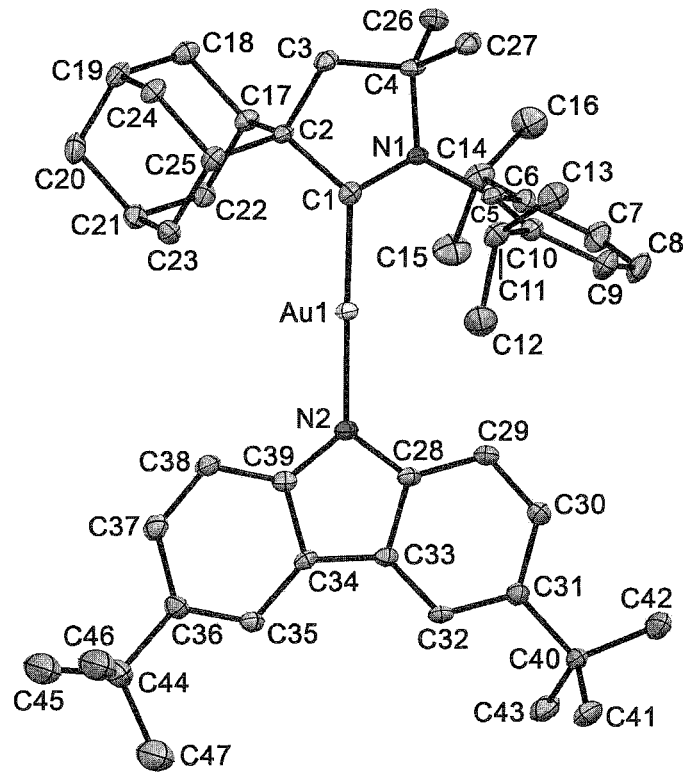

FIG. 25b shows the X-ray structure of this complex (data given in the summary of FIG. 25b above).

Example 16. Synthesis of ($^{Ad}$CAAC)AuNPh$_2$ (CMA3)

Following the procedure described in Example 14, the complex was made from (CAAC)AuCl (0.2 g, 0.33 mmol), NaO$^t$Bu (33 mg, 0.33 mmol) and diphenylamine (56 mg, 0.33 mmol) as a yellow powder. Yield: 0.24 g (0.32 mmol, 98%).

1H NMR (300 MHz, CD$_2$Cl$_2$): δ 7.58 (t, J=7.8 Hz, 1H, aryl), 7.34 (d, J=7.8 Hz, 2H, aryl), 6.87 (t, J=7.2 Hz, 4H, m-CH aniline), 6.60 (d, J=7.2 Hz, 4H, o-CH aniline), 6.46 (t, J=8.1 Hz, 2H, p-CH aniline), 4.05 (d, J=13.8 Hz, 2H, CH$_2$), 2.81 (sept, J=6.6 Hz, 2H, CHMe$_2$), 2.35-1.74 (m, 14H, adamantyl CH and CH$_2$), 1.36 (s, 6H CMe$_2$), 1.31 (d, J=6.6 Hz, 6H, CHMe$_2$), 1.30 (d, J=6.6 Hz, 6H, CHMe$_2$). $^{13}$C NMR (75 MHz, CD$_2$Cl$_2$) δ 242.6 (carbene C), 155.5 (i-C$_a$mide), 145.7 (o-C), 136.5 (i-C), 129.7 (p-CH), 128.6 (m-C$_{amide}$), 125.5 (m-CH), 120.9 (o-C$_{amide}$), 116.9 (p-C$_{amide}$), 76.8 (C$_q$), 64.3 (C$_q$), 49.2 (CH$_2$), 39.4 (CH$_2$), 37.4 (CH), 35.2 (CH$_2$), 34.8 (CH$_2$), 29.4, 28.3, 27.7, 26.2, 23.4 (CH$_3$). Anal. Calcd. for C$_{39}$H$_{49}$N$_2$Au (742.78) C, 63.06; H, 6.65; N, 3.77. Found: C, 63.19; H, 6.71; N, 3.72.

Figure 15:
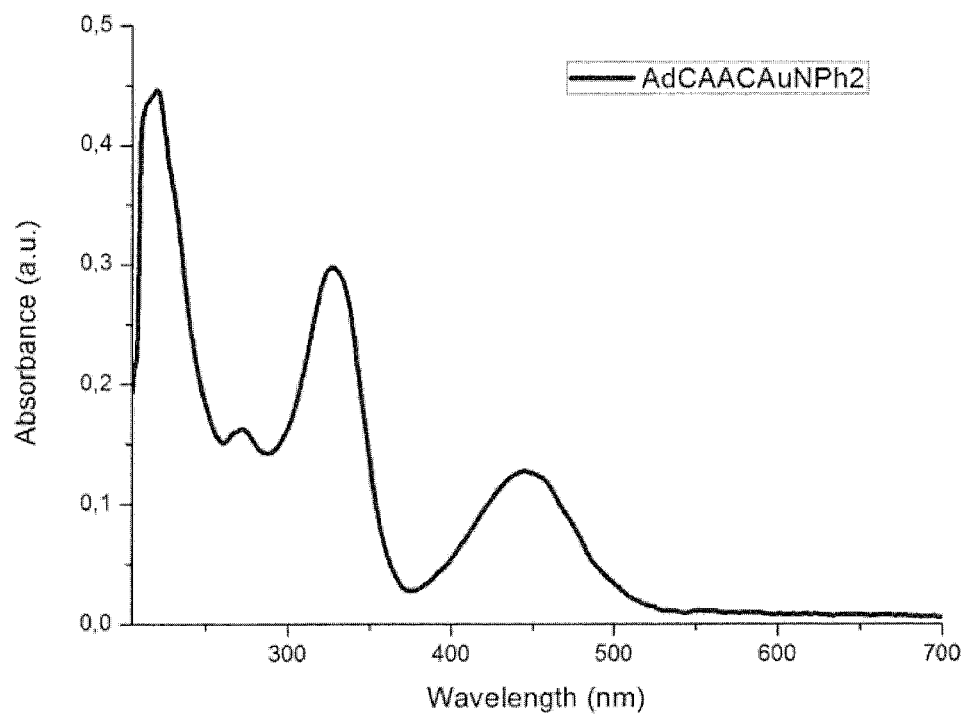
FIG. 15. Left: UV-vis spectrum of ($^{Ad}$CAAC)Au(NPh$_2$) (CMA3) in THF solution. Right: Emission spectrum of ($^{Ad}$CAAC)Au(NPh$_2$) in the solid state excited at 467 nm.
Figure 15:
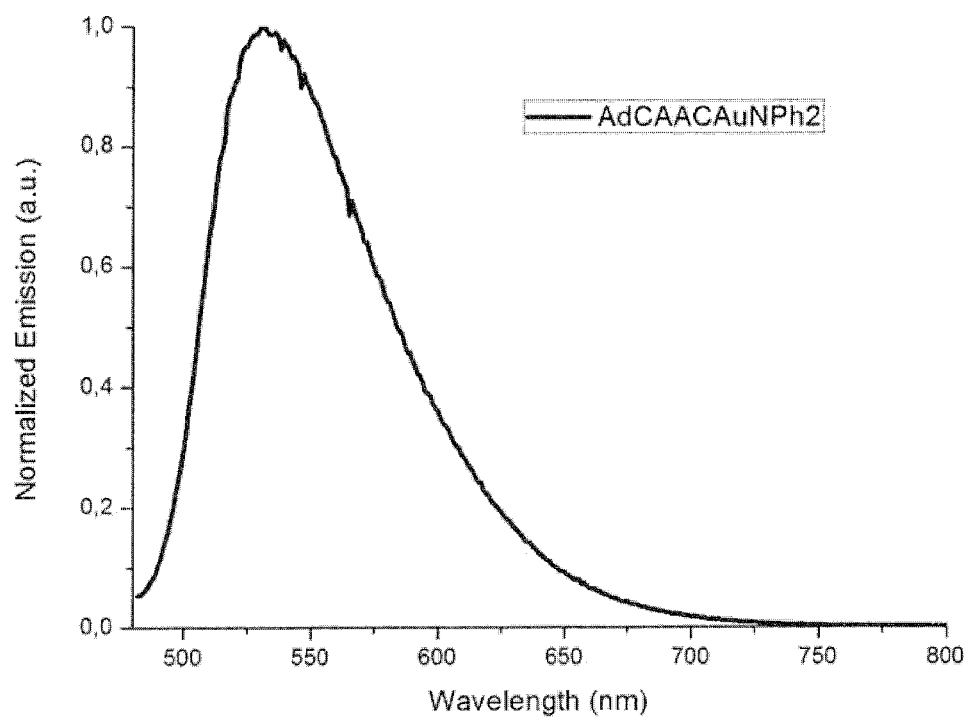

FIG. 15 shows the UV/vis and emission spectra of this complex and FIG. 25a shows the X-ray structure of this complex (data given in the summary of FIG. 25a above).

Example 17. Synthesis of ($^{Ad}$CAAC)AuNHPh

A mixture of ($^{Ad}$CAAC)AuCl (0.2 g, 0.33 mmol), NaO$^t$Bu (33 mg, 0.33 mmol) and aniline (30 μL, 31 mg, 0.33 mmol) in dry THF under an argon atmosphere was stirred overnight. All volatiles were evaporated. The residue was dissolved in toluene and centrifuged under argon. The supernatant was decanted and evaporated in vacuum to give a yellow solid. According to $^1$H NMR the complex was obtained as a toluene solvate C$_{33}$H$_{45}$N$_2$Au.0.5C$_6$H$_5$CH$_3$. To remove toluene the solid was dissolved in 2 mL of dry CH$_2$Cl$_2$ and precipitated with 8 mL of pentane. Solvent mixture was removed in vacuum to give pure yellow complex. Yield: 0.21 g (0.31 mmol, 94%). In case of the formation of oily product pentane (4 mL) needs to be added; the suspension is then sonicated and the volatiles are removed in vacuum.

$^1$H NMR (300 MHz, CD$_2$Cl$_2$): δ 7.53 (t, J=7.8 Hz, 1H, aryl), 7.33 (d, J=7.8 Hz, 2H, aryl), 6.65 (t, J=8.4 Hz, 2H, m-CH aniline), 6.06 (t, J=8.4 Hz, 1H, p-CH aniline), 5.80 (d, J=8.4 Hz, 2H, o-CH aniline), 4.04 (d, J=11.1 Hz, 2H, CH$_2$), 3.63 (s, 1H, NH), 2.84 (sept, J=6.6 Hz, 2H, CHMe$_2$), 2.35-1.80 (m, 14H, adamantyl), 1.39 (d, J=6.6 Hz, 6H, CHMe$_2$), 1.35 (s, 6H CMe$_2$), 1.31 (d, J=6.6 Hz, 6H, CHMe$_2$). $^{13}$C NMR (75 MHz, CD$_2$Cl$_2$) δ 244.8 (carbene C), 159.0 (i-C$_{aniline}$), 146.0 (o-C), 136.4 (i-C), 129.4 (p-CH), 128.4 (m-C$_{aniline}$), 125.3 (m-CH), 115.4 (o-C$_{aniline}$), 111.4 (p-C$_{aniline}$), 76.5 (C$_q$), 64.3 (C$_q$), 49.1 (CH$_2$), 39.3 (CH$_2$), 37.3 (CH), 35.5 (CH$_2$), 34.7 (CH$_2$), 29.38, 29.35, 28.3, 27.7, 26.2, 23.3 (CH$_3$). Anal. Calcd. for C$_{33}$H$_{45}$N$_2$Au (666.68) C, 59.45; H, 6.80; N, 4.20. Found: C, 59.63; H, 6.91; N, 4.16.

Example 18. Synthesis of ($^{Ad}$CAAC)Au-2,6-dimethylphenolate

Following the procedure described in Example 14, the compound was made from $^{Ad}$CAACAuCl (0.182 g, 0.30 mmol), NaO$^t$Bu (31 mg, 0.32 mmol) and 2,6-dimethylphenol (37 mg, 0.3 mmol) as a white powder. Yield: 0.195 g (0.28 mmol, 93%).

$^1$H NMR (300 MHz, CD$_2$Cl$_2$): δ 7.47 (t, J=7.8 Hz, 1H, CH aromatic), 7.27 (d, J=7.8 Hz, 2H, CH aromatic), 6.72 (d, J=7.2 Hz, 2H, m-CH phenol), 6.30 (t, 1H, p-CH phenol), 4.01 (d, J=12.6 Hz, 2H, CH$_2$), 2.74 (sept, J=6.8 Hz, 2H, CH(CH$_3$)$_2$), 2.33-1.72 (m, 14H, adamantyl CH and CH$_2$) overlaps with 1.94 (s, 6H, CH$_3$ phenol), 1.32 (s, 6H, C(CH$_3$)$_2$), 1.30 (d, J=6.8 Hz, 6H, CH(CH$_3$)$_2$), 1.28 (d, J=6.8 Hz, 6H, CH(CH$_3$)$_2$). $^{13}$C NMR (75 MHz, CD$_2$Cl$_2$): δ 235.3 (carbene C), 165.5 (ipso-OC$_{phenol}$), 145.4 (o-C), 136.4 (ipso-C), 129.9 (para-CH), 127.7 (o-C$_{phenol}$), 127.5 (m-CH$_{phenol}$), 125.4 (m-CH), 115.6 (p-CH$_{phenol}$), 76.7 (C$_q$), 63.9 (C$_q$), 48.9 (CH$_2$), 39.4 (CH$_2$), 37.4 (CH), 35.3 (CH$_2$), 34.9 (CH$_2$), 29.4 (CH), 29.4, 28.3, 27.7, 26.5, 23.2 (CH$_3$), 17.3 (CH$_3$ phenol). Anal. Calc. for C$_{35}$H$_{48}$NAuO (695.72): C, 60.42; H, 6.95; N, 2.01. Found: C, 60.59; H, 7.03; N, 2.08.

Example 19. Synthesis of ($^{Ad}$CAAC)Au(3,7-dinitrophenothiazine)

Following the procedure described for ($^{Ad}$CAAC)Au(carbazolate) (Example 14), the complex was made from ($^{Ad}$CAAC)AuCl (0.2 g, 0.33 mmol), NaO$^t$Bu (33 mg, 0.33 mmol) and 10-H-3,7-dinitrophenothiazine (95.2 mg, 0.33 mmol) as a dark red powder. Yield: 0.275 g (0.32 mmol, 97%).

$^1$H NMR (300 MHz, CD$_2$Cl$_2$): δ 7.67 (t, J=7.9 Hz, 1H, aryl), 7.47 (d, J=2.1 Hz, 2H, phenothiazine CH$^4$), 7.43 (dd, J=9.0 and 2.1 Hz, 2H, phenothiazine CH$^2$) overlapping with 7.40 (d, J=7.9 Hz, 2H, aryl), 6.15 (d, J=9.0 Hz, 2H, phenothiazine CH$^1$), 3.85 (d, J=12.8 Hz, 2H, CH$_2$), 2.82 (sept, J=6.6 Hz, 2H, CHMe$_2$), 2.42-1.81 (m, 14H, adamantyl CH and CH$_2$), 1.41 (s, 6H, C(CH$_3$)), 1.33 (d, J=6.6 Hz, 12H, CHMe$_2$). $^{13}$C NMR (75 MHz, CD$_2$Cl$_2$) δ 240.1 (C carbene), 156.6 (ipso-CN phenothiazine), 145.7 (o-C), 141.6 (ipso-C$^3$—NO$_2$ phenothiazine), 136.1 (ipso-C), 130.3 (p-CH), 125.9 (m-CH), 124.1 (phenothiazine CH$^2$), 121.9 (phenothiazine CH$^4$), 120.7 (ipso-CS phenothiazine), 118.8 (phenothiazine CH$^1$), 78.0 (C$_q$), 64.4 (C$_q$), 48.7 (CH$_2$), 39.1 (CH$_2$), 37.4 (CH), 35.3 (CH$_2$), 34.6 (CH$_2$), 29.5, 29.4, 28.1, 27.4, 26.4, 23.3 (CH$_3$). Anal. Calcd. for C$_{39}$H$_{45}$N$_4$AuSO$_4$ (862.82): C, 54.29; H, 5.26; N, 6.49. Found: C, 54.43; H, 5.34; N, 6.52.

Example 20. Synthesis of ($^{Ad}$CAAC)Au(N-methylphenazine)

Following the procedure described for ($^{Ad}$CAAC)Au(carbazolate) (Example 14), the complex was made from ($^{Ad}$CAAC)AuCl (0.2 g, 0.33 mmol), NaO$^t$Bu (33 mg, 0.33 mmol) and 10-H—N-methylphenazine (65 mg, 0.33 mmol) as a deep violet powder. Yield: 0.222 g (0.29 mmol, 87%).

$^1$H NMR (300 MHz, THF-d$^8$): δ 7.52 (t, J=7.6 Hz, 1H, aryl), 7.35 (d, J=7.6 Hz, 2H, aryl), 6.01-5.90 (m, phenazine CH$^3$ and CH$^2$), 5.77 (dd, J=7.3 and 1.4 Hz, 2H, phenazine CH$^4$), 5.58 (dd, J=7.3 and 1.4 Hz, 2H, phenazine CH$^1$), 4.09 (d, J=12.3 Hz, 2H, CH$_2$), 2.88 (sept, J=6.6 Hz, 2H, CHMe$_2$), 2.60 (s, 3H, NMe), 2.44-1.79 (m, 14H, adamantyl CH and CH$_2$), 1.38 (s, 6H, C(CH$_3$)), 1.36 (d, J=6.6 Hz, 6H, CHMe$_2$), 1.30 (d, J=6.6 Hz, 6H, CHMe$_2$). $^{13}$C NMR (75 MHz, THF-d$^8$) δ 242.9 (C carbene), 147.5 (ipso-CN phenazine), 146.0 (o-C), 140.0 (ipso-CNMe phenazine), 136.6 (ipso-C), 130.0 (p-CH), 125.8 (m-CH), 120.6 (phenazine CH), 117.9 (phenazine CH), 114.9 (phenazine CH$^1$), 109.5 (phenazine CH$^4$), 77.2 (C$_q$), 64.6 (C$_q$), 49.0 (CH$_2$), 39.8 (CH$_2$), 37.8 (CH), 35.4 (CH$_2$), 35.1 (CH$_2$), 31.3 (NMe), 29.7, 29.1, 28.7, 28.3, 26.3, 23.4 (CH$_3$). Anal. Calcd. for C$_{40}$H$_{50}$N$_3$Au (769.81): C, 62.41; H, 6.55; N, 5.46. Found: C, 62.61; H, 6.70; N, 5.56.

Example 21. Synthesis of ($^{Ad}$CAAC)Au(oxazine)

Following the procedure described for ($^{Ad}$CAAC)Au(carbazolate) (Example 14), the complex was made from ($^{Ad}$CAAC)AuCl (0.2 g, 0.33 mmol), NaO$^t$Bu (33 mg, 0.33 mmol) and oxazine (61.5 mg, 0.33 mmol) as a red powder. Yield: 0.229 g (0.30 mmol, 91%).

$^1$H NMR (300 MHz, CD$_2$Cl$_2$): δ 7.55 (t, J=7.9 Hz, 1H, aryl), 7.34 (d, J=7.9 Hz, 2H, aryl), 6.24 (t, J=7.6 Hz, 2H, oxazine CH$^2$), 6.19-6.11 (m, 4H, oxazine CH$^3$ and CH$^4$), 5.71 (d, J=7.6 Hz, 2H, oxazine CH$^1$), 4.01 (d, J=12.8 Hz, 2H, CH$_2$), 2.82 (sept, J=6.6 Hz, 2H, CHMe$_2$), 2.37-1.81 (m, 14H, adamantyl CH and CH$_2$), 1.36 (s, 6H, C(CH$_3$)) overlapping with 1.35 (d, J=6.6 Hz, 6H, CHMe$_2$), 1.31 (d, J=6.6 Hz, 6H, CHMe$_2$). $^{13}$C NMR (75 MHz, CD$_2$Cl$_2$) δ 242.3 (C carbene), 146.1 (ipso-CN oxazine), 145.7 (o-C), 142.8 (ipso-CO oxazine), 136.1 (ipso-C), 129.7 (p-CH), 125.5 (m-CH), 122.9 (oxazine CH$^2$), 117.4 (oxazine CH$^1$), 116.6 (oxazine CH), 114.0 (oxazine CH), 77.2 (C$_q$), 64.4 (C$_q$), 49.0 (CH$_2$), 39.3 (CH$_2$), 37.5 (CH), 35.2 (CH$_2$), 34.7 (CH$_2$), 29.46, 29.43, 28.2, 27.6, 26.3, 23.3 (CH$_3$). Anal. Calcd. for C$_{39}$H$_{47}$N$_2$AuO (756.76): C, 61.90; H, 6.26; N, 3.70. Found: C, 62.08; H, 6.35; N, 3.76.

Example 22. Synthesis of ($^{Ad}$CAAC)Cu(oxazine)

Following the procedure described for ($^{Ad}$CAAC)Au(carbazolate) (Example 14), the complex was made from ($^{Ad}$CAAC)CuCl (0.2 g, 0.42 mmol), NaO$^t$Bu (40 mg, 0.42 mmol) and diphenylamine (77 mg, 0.42 mmol) as an orange powder. Yield: 0.248 g (0.40 mmol, 95%).

$^1$H NMR (300 MHz, CD$_2$Cl$_2$): δ 7.54 (t, J=7.9 Hz, 1H, aryl), 7.35 (d, J=7.9 Hz, 2H, aryl), 6.20 (t, J=7.6 Hz, 2H, oxazine CH$^2$), 6.15-6.06 (m, 4H, oxazine CH$^3$ and CH$^4$), 5.23 (d, J=7.6 Hz, 2H, oxazine CH$^1$), 3.46 (d, J=12.8 Hz, 2H, CH$_2$), 2.86 (sept, J=6.6 Hz, 2H, CHMe$_2$), 2.26-1.80 (m, 14H, adamantyl CH and CH$_2$), 1.35 (s, 6H, C(CH$_3$)), 1.31 (d, J=6.6 Hz, 6H, CHMe$_2$), 1.22 (d, J=6.6 Hz, 6H, CHMe$_2$). $^{13}$C NMR (75 MHz, CD$_2$Cl$_2$) δ 252.8 (C carbene), 146.1 (ipso-CN oxazine), 145.2 (o-C), 143.8 (ipso-CO oxazine), 135.6 (ipso-C), 129.6 (p-CH), 125.1 (m-CH), 123.0 (oxazine CH$^2$), 117.0 (oxazine CH$^1$), 116.3 (oxazine CH), 113.4 (oxazine CH), 78.4 (C$_q$), 65.0 (C$_q$), 48.0 (CH$_2$), 38.5 (CH$_2$), 37.2 (CH), 35.5 (CH$_2$), 34.1 (CH$_2$), 29.1, 27.9, 27.1, 26.1, 22.4 (CH$_3$). Anal. Calcd. for C$_{39}$H$_{47}$N$_2$CuO (623.34): C, 75.15; H, 7.60; N, 4.49. Found: C, 75.23; H, 7.65; N, 4.45.

Example 23. Synthesis of ($^{Ad}$CAAC)Au(acridone)

Following the procedure described for ($^{Ad}$CAAC)Au(carbazolate) (Example 14), the complex was made from ($^{Ad}$CAAC)AuCl (0.2 g, 0.33 mmol), NaO$^t$Bu (33 mg, 0.33 mmol) and acridone (64.3 mg, 0.33 mmol) as a yellow powder. Yield: 0.235 g (0.31 mmol, 94%).

$^1$H NMR (300 MHz, CD$_2$Cl$_2$): δ 8.33 (d, J=7.3 Hz, 2H, acridone CH$^4$), 7.72 (t, J=7.7 Hz, 1H, aryl), 7.46 (d, J=7.7 Hz, 2H, aryl), 7.27 (t, J=7.3 Hz, 2H, acridone CH$^2$), 7.15 (d, J=7.3 Hz, 2H, acridone CH$^1$), 7.00 (t, J=7.3 Hz, 2H, acridone CH$^3$), 4.19 (d, J=12.2 Hz, 2H, CH$_2$), 2.87 (sept, J=6.6 Hz, 2H, CHMe$_2$), 2.13-1.86 (m, 14H, adamantyl CH and CH$_2$), 1.42 (s, 6H, C(CH$_3$)), 1.33 (d, J=6.6 Hz, 6H, CHMe$_2$), 1.29 (d, J=6.6 Hz, 6H, CHMe$_2$). $^{13}$C NMR (75 MHz, CD$_2$Cl$_2$) δ 241.2 (C carbene), 177.6 (C=O), 150.5 (ipso-CN acridone), 145.7 (o-C), 135.9 (ipso-C), 131.0 (acridone CH$^2$), 130.3 (p-CH), 126.3 (acridone CH$^4$), 125.8 (m-CH), 123.5 (acridone CH$^1$), 123.3 (acridone ipso-C), 119.2 (acridone CH$^3$), 77.9 (C$_q$), 64.7 (C$_q$), 48.9 (CH$_2$), 39.3 (CH$_2$), 37.5 (CH), 35.1 (CH$_2$), 34.7 (CH$_2$), 29.55, 29.50, 28.3, 27.5, 26.3, 23.3 (CH$_3$). Anal. Calcd. for C$_{40}$H$_{47}$N$_2$AuO (768.77): C, 62.49; H, 6.16; N, 3.64. Found: C, 62.58; H, 6.23; N, 3.69.

Example 24. Synthesis of ($^{Ad}$CAAC)Cu(acridone)

Following the procedure described for ($^{Ad}$CAAC)Au(carbazolate) (Example 14), the complex was made from ($^{Ad}$CAAC)CuCl (0.2 g, 0.42 mmol), NaO$^t$Bu (40 mg, 0.42 mmol) and acridone (82 mg, 0.42 mmol) as an yellow powder. Yield: 0.248 g (0.39 mmol, 93%).

$^1$H NMR (300 MHz, CD$_2$Cl$_2$): δ 8.30 (d, J=8.5 Hz, 2H, acridone CH$^4$), 7.69 (t, J=7.7 Hz, 1H, aryl), 7.47 (d, J=7.7 Hz, 2H, aryl), 7.21 (t, J=7.3 Hz, 2H, acridone CH$^2$), 6.96 (d, J=7.3 Hz, 2H, acridone CH$^1$), 6.68 (t, J=7.3 Hz, 2H, acridone CH$^3$), 3.61 (d, J=12.2 Hz, 2H, CH$_2$), 2.94 (sept, J=6.6 Hz, 2H, CHMe$_2$), 2.23-1.81 (m, 14H, adamantyl CH and CH$_2$), 1.41 (s, 6H, C(CH$_3$)), 1.34 (d, J=6.6 Hz, 6H, CHMe$_2$), 1.16 (d, J=6.6 Hz, 6H, CHMe$_2$). $^{13}$C NMR (75 MHz, CD$_2$Cl$_2$) δ 252.5 (C carbene), 177.6 (C=O), 151.0 (ipso-CN acridone), 145.6 (o-C), 135.9 (ipso-C), 131.1 (acridone CH$^2$), 130.7 (p-CH), 126.4 (acridone CH$^4$), 125.8 (m-CH), 124.4 (acridone CH$^1$), 123.0 (acridone ipso-C), 118.9 (acridone CH$^3$), 79.6 (C$_q$), 65.9 (C$_q$), 48.3 (CH$_2$), 39.8 (CH$_2$), 37.6 (CH), 36.0 (CH$_2$), 34.5 (CH$_2$), 29.6, 29.5, 28.3, 27.3, 26.6, 22.8 (CH$_3$). Anal. Calcd. for C$_{40}$H$_{47}$N$_2$CuO (635.35): C, 75.62; H, 7.46; N, 4.41. Found: C, 75.79; H, 7.54; N, 4.48.

Example 25. Synthesis of ($^{Ad}$CAAC)Au(10,11-dihydrodibenz[b,f]azepine)

Following the procedure described for ($^{Ad}$CAAC)Au(carbazolate) (Example 14), the complex was made from ($^{Ad}$CAAC)AuCl (0.2 g, 0.33 mmol), NaO$^t$Bu (33 mg, 0.33 mmol) and 10,11-dihydro-5H-dibenz[b,f]azepine (64.3 mg, 0.33 mmol) as an orange powder. Yield: 0.230 g (0.30 mmol, 91%).

$^1$H NMR (300 MHz, CD$_2$Cl$_2$): δ 7.53 (t, J=7.6 Hz, 1H, aryl), 7.30 (d, J=7.6 Hz, 2H, aryl), 6.75 (d, J=7.4 Hz, 2H, azepine CH$^4$), 6.69 (d, J=7.4 Hz, 2H, azepine CH$^1$), 6.62 (t, J=7.4 Hz, 2H, azepine CH$^3$), 6.43 (t, J=7.4 Hz, 2H, azepine CH$^2$), 3.95 (d, J=13.2 Hz, 2H, CH$_2$), 2.89 (s, 4H, CH$_2$ azepine), 2.83 (sept, J=6.6 Hz, 2H, CHMe$_2$), 2.14-1.69 (m, 14H, adamantyl CH and CH$_2$), 1.36 (s, 6H, C(CH$_3$)), 1.34 (d, J=6.6 Hz, 6H, CHMe$_2$), 1.30 (d, J=6.6 Hz, 6H, CHMe$_2$). $^{13}$C NMR (75 MHz, CD$_2$Cl$_2$) δ 242.3 (C carbene), 153.9 (ipso-CN azepine), 145.4 (o-C), 136.4 (ipso-C), 129.8 (p-CH), 129.5 (azepine CH$^4$), 127.0 (azepine ipso-C), 125.7 (azepine CH$^3$), 125.4 (m-CH), 124.5 (azepine CH$^1$), 116.7 (azepine CH$^2$), 76.6 (C$_q$), 64.1 (C$_q$), 48.8 (CH$_2$), 39.3 (CH$_2$), 37.2 (CH), 36.4 (CH$_2$), 35.0 (CH$_2$), 34.8 (azepine CH$_2$), 29.3, 28.0, 27.6, 26.0, 23.4 (CH$_3$). Anal. Calcd. for C$_{41}$H$_{51}$N$_2$Au (768.82): C, 64.05; H, 6.69; N, 3.64. Found: C, 64.27; H, 6.83; N, 3.51.

Example 26. Synthesis of ($^{Ad}$CAAC)Cu(10,11-dihydrodibenz[b,f]azepine)

Following the procedure described for ($^{Ad}$CAAC)Au(carbazolate) (Example 14), the complex was made from ($^{Ad}$CAAC)CuCl (0.2 g, 0.42 mmol), NaO$^t$Bu (40 mg, 0.42 mmol) and 10,11-dihydro-5H-dibenz[b,f]azepine (82 mg, 0.42 mmol) as an orange powder. Yield: 0.240 g (0.38 mmol, 90%).

$^1$H NMR (300 MHz, CD$_2$Cl$_2$): δ 7.45 (t, J=7.6 Hz, 1H, aryl), 7.29 (d, J=7.6 Hz, 2H, aryl), 7.07-7.01 (m, 4H, azepine), 6.77-6.72 (m, 4H, azepine), 3.57 (d, J=13.2 Hz, 2H, CH$_2$), 3.05 (s, 4H, CH$_2$ azepine), 2.80 (sept, J=6.6 Hz, 2H, CHMe$_2$), 2.22-1.77 (m, 14H, adamantyl CH and CH$_2$), 1.32 (s, 6H, C(C$\underline{H}_3$)), 1.29 (d, J=6.6 Hz, 12H, CHMe$_2$). $^{13}$C NMR (75 MHz, CD$_2$Cl$_2$) δ 252.9 (C carbene), 145.0 (o-C), 142.5 (ipso-CN azepine), 135.4 (ipso-C), 130.5 (azepine CH), 129.4 (p-CH), 128.6 (azepine ipso-C), 126.7 (m-CH), 124.7 (azepine CH), 119.2 (azepine CH), 117.8 (azepine CH), 78.4 (C$_q$), 64.5 (C$_q$), 47.8 (CH$_2$), 38.6 (CH$_2$), 37.1 (CH), 35.7 (CH$_2$), 34.9 (CH$_2$), 34.1 (azepine CH$_2$), 29.1, 29.0, 28.0, 27.2, 26.6, 22.2 (CH$_3$). Anal. Calcd. for C$_{41}$H$_{51}$N$_2$Cu (635.40): C, 77.50; H, 8.09; N, 4.41. Found: C, 77.62; H, 8.16; N, 4.50.

Example 27. Photoluminescence Spectra

Figure 27:
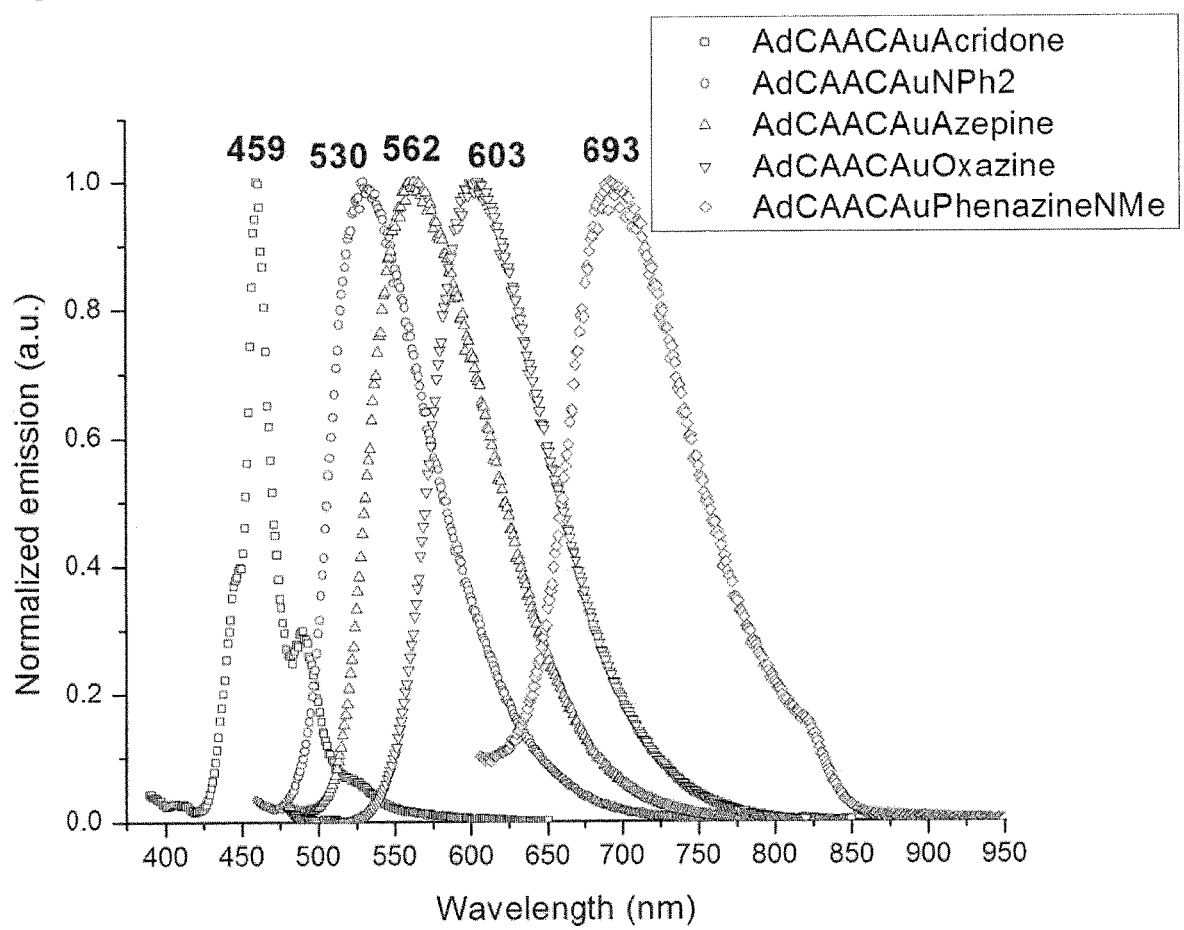
FIG. 27. Photoluminescence spectra of representative gold complexes of NPh$_2$ and ring amide ligands (in the solid state, 298 K), showing the range of emission colours provided by these compounds.

The photoluminescence spectra of the compounds of Examples 19, 20, 21, 23 and 25 were measured (in the solid state, 298 K), and the range of emission colours provided by these compounds is shown in FIG. 27.

Example 28. Performance of OLEDs and the Related Photophysical Data

Figure 18:
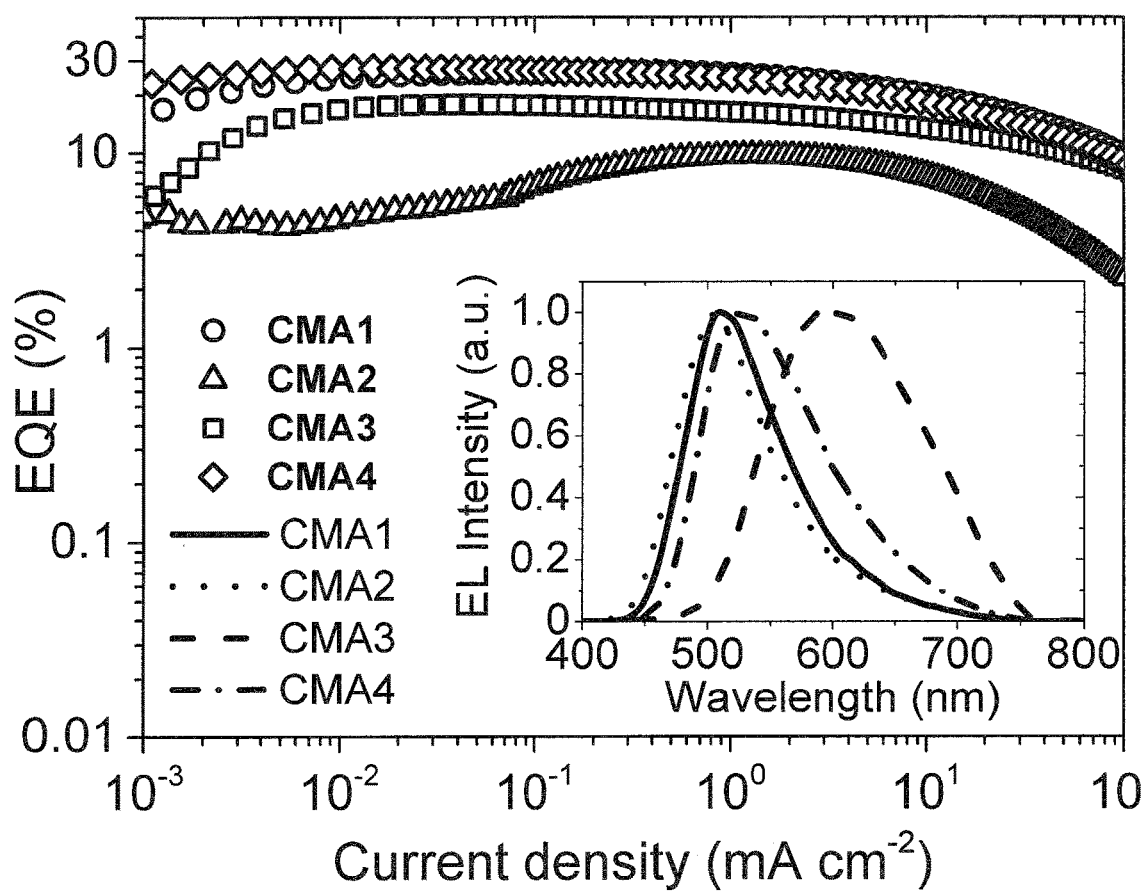
FIG. 18. a External quantum efficiency (EQEs) of multi-layer OLEDs prepared according to Example 28 incorporating ($^{Ad}$CAAC)metal amide complexes. Inset: Electroluminescence spectra of ($^{Ad}$CAAC)M-amide OLEDs. ◊ ($^{Ad}$CAAC)Au(DTBCz) (CMA4); ○ ($^{Ad}$CAAC)AuCz (CMA1); □ ($^{Ad}$CAAC)AuNPh$_2$(CMA3); Δ ($^{Ad}$CAAC)CuCz (CMA2).
Figure 19:
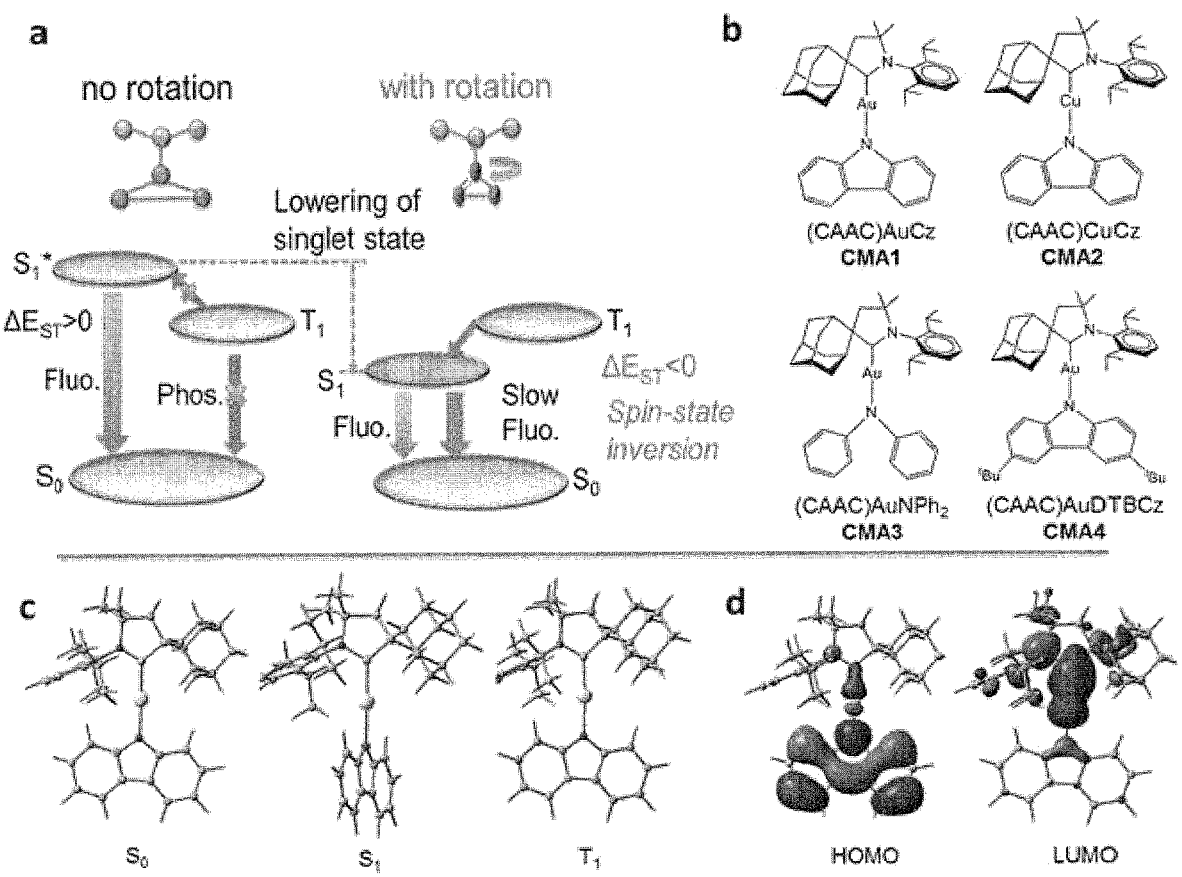
FIG. 19. Mechanism, chemical structures and density functional theory (DFT) calculations relating to Example 29. a, The rotationally accessed spin-state inversion mechanism, described using a molecule with a rotational degree of freedom between electron donating and accepting moieties. When the donor and acceptor are coplanar, it follows $E(S_1) \geq E(T_1)$, the conventional excited state energy arrangement. In a rotated geometry, $E(S_1)$ may be lowered sufficiently, so that the inversion of spin-state energies ($E(T_1)>E(S_1)$) can be achieved. b, ($^{Ad}$CAAC)AuCz (CMA1) and its analogues. c, Optimised molecular geometries of CMA1 for its ground state ($S_0$), excited singlet ($S_1$) and triplet ($T_1$) states. d, Highest-occupied molecular orbital (HOMO) and lowest-unoccupied molecular orbital (LUMO) of CMA1, obtained from DFT and time-dependent density functional theory (TD-DFT) calculations.
Figure 23:
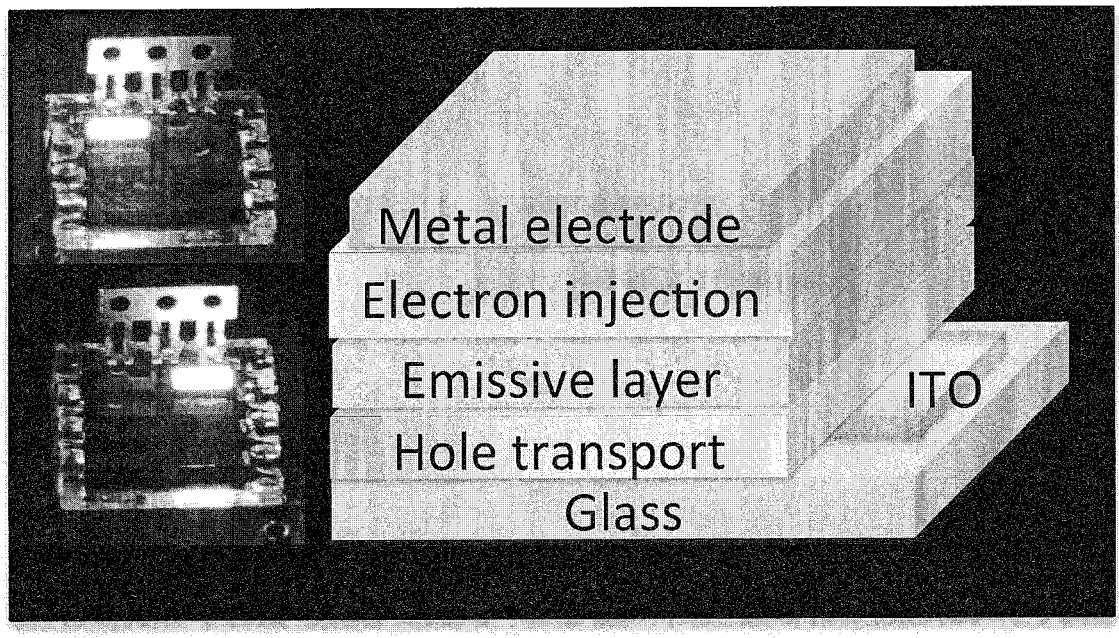
FIG. 23. Device performance and electroluminescence (EL) measurements. a, Structure and photographs of working devices. b, Energy levels of materials used to produce the prototype devices. CMA1 is used as an example. c, external quantum efficiency (EQE) curves and EL spectra (inset). d, Histogram of the maximum EQE measured from 135 devices based on CMA4. e, Comparison of fast, slow PL and steady-state EL (for 20 wt % of CMA1 in PVK host). f, Transient-EL curves measured after holding a device based on CMA1 at various steady-state current densities.
Figure 23:
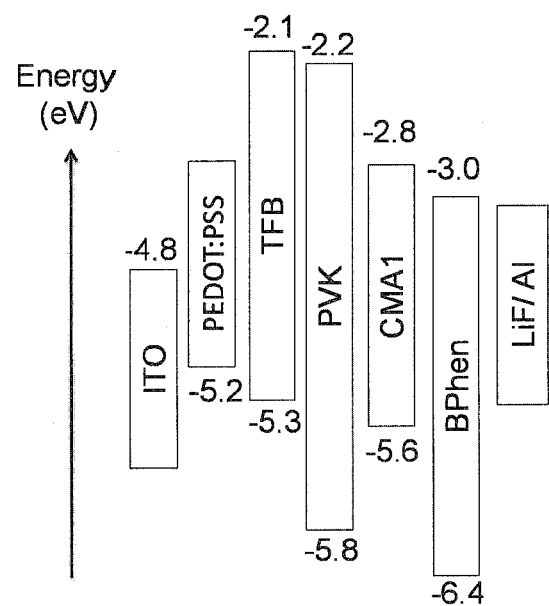
Figure 23:
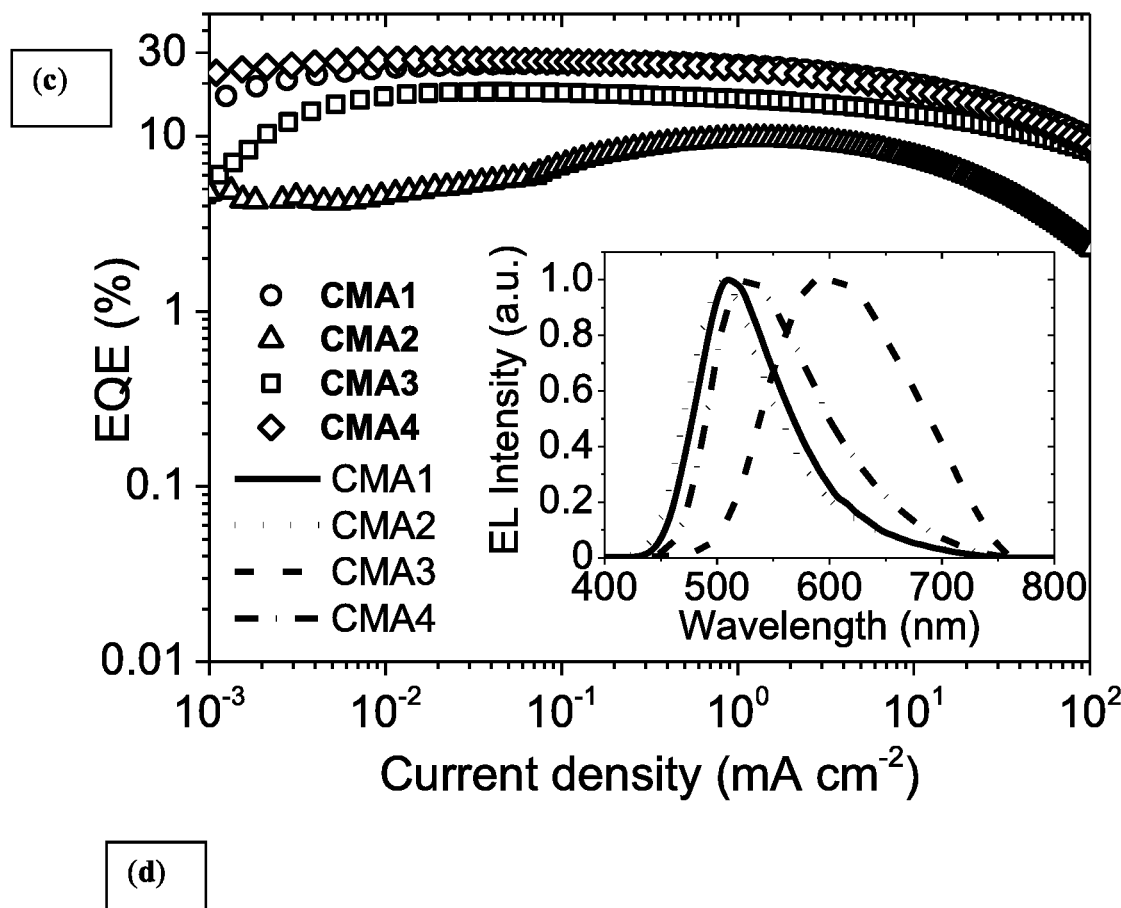
Figure 23:
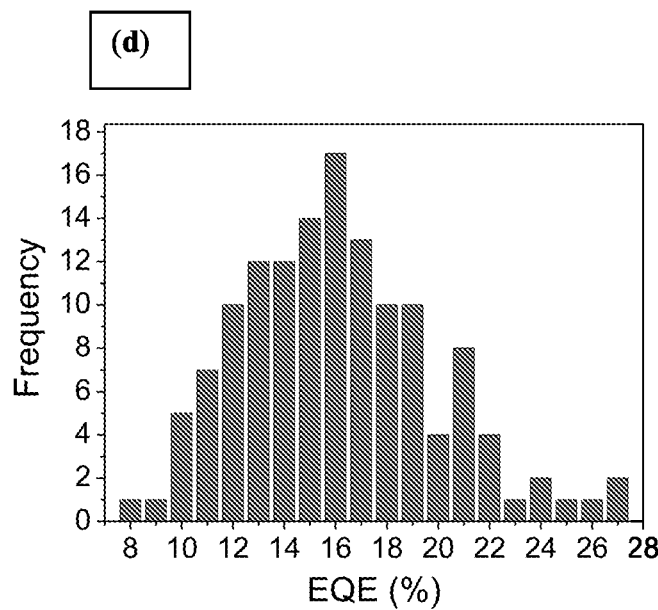
Figure 23:
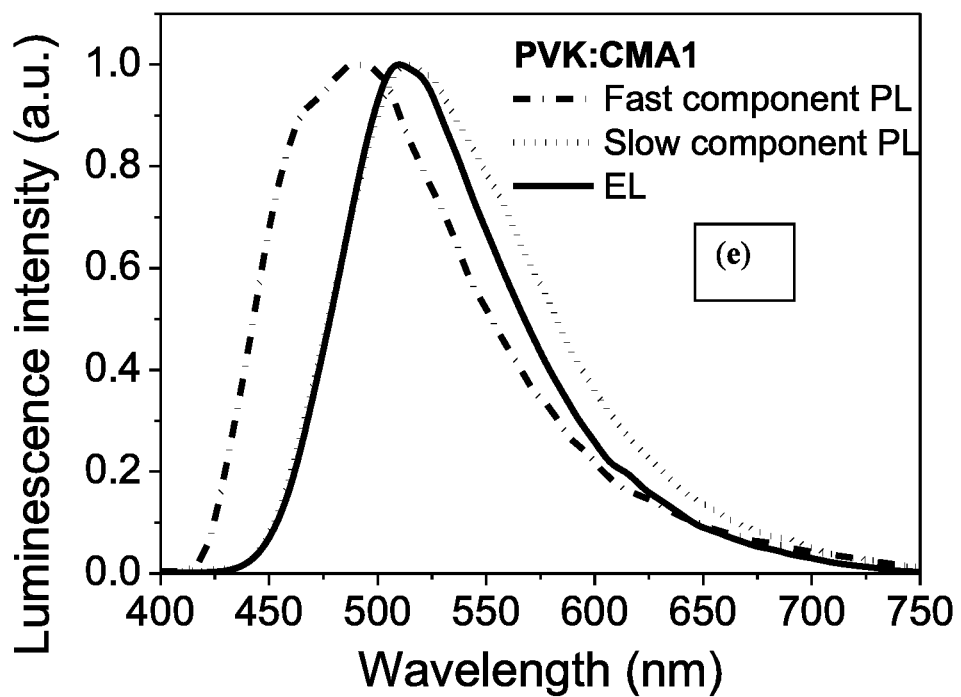
Figure 23:
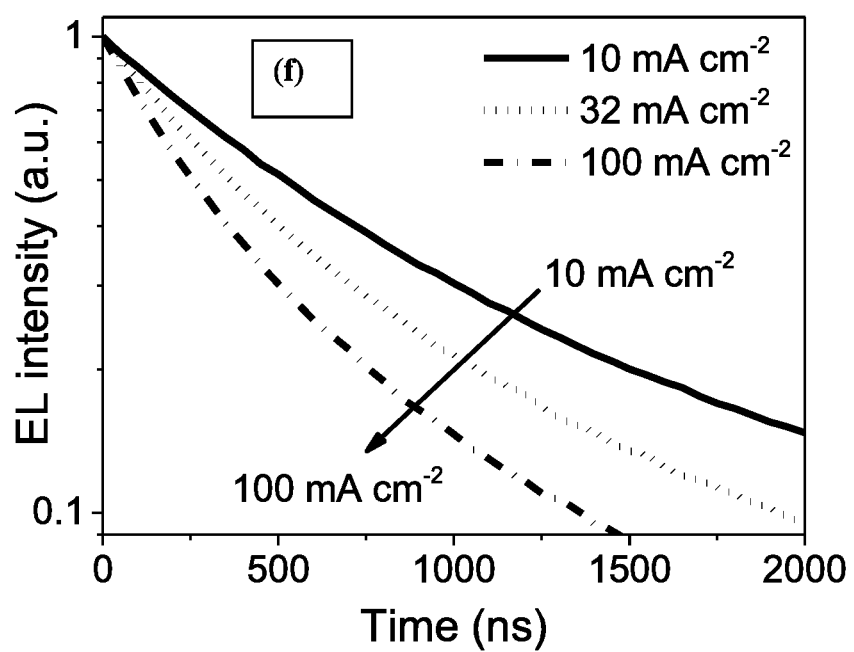
Figure 24:
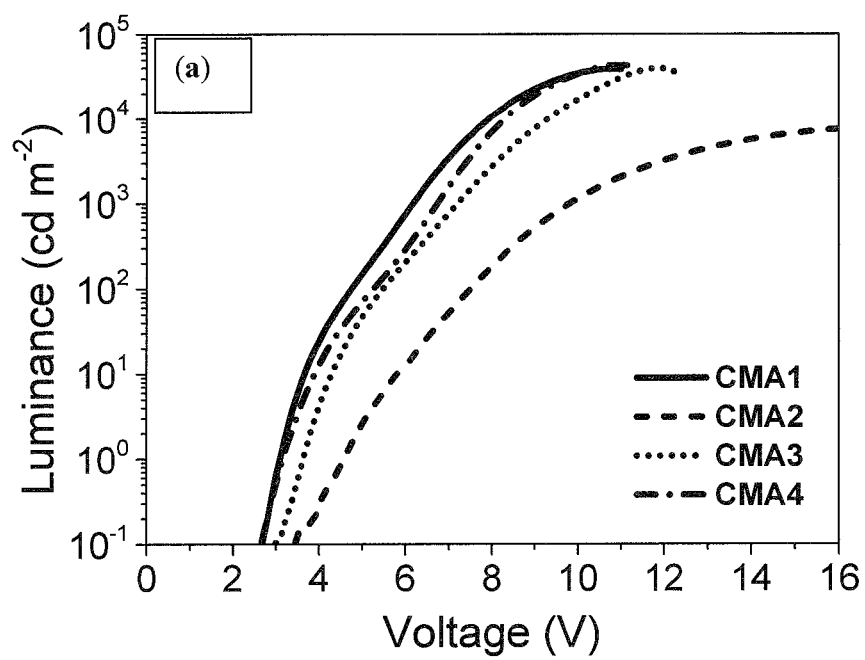
FIG. 24. Additional device performance data for Example 29. a, Luminance versus voltage. b, current density versus voltage. c, Angular emission profile of a representative device, consistent with Lambertian emission characteristics as fitted by the red line. d, e, CIE coordinates as a function of EQE for ROLEDs fabricated from CMA1 and CMA4.
Figure 24:
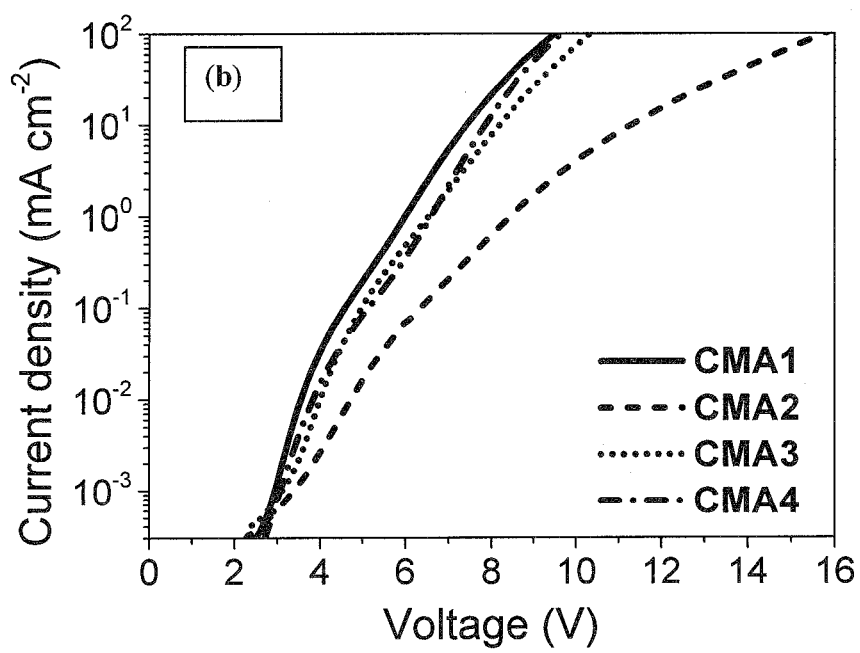
Figure 24:
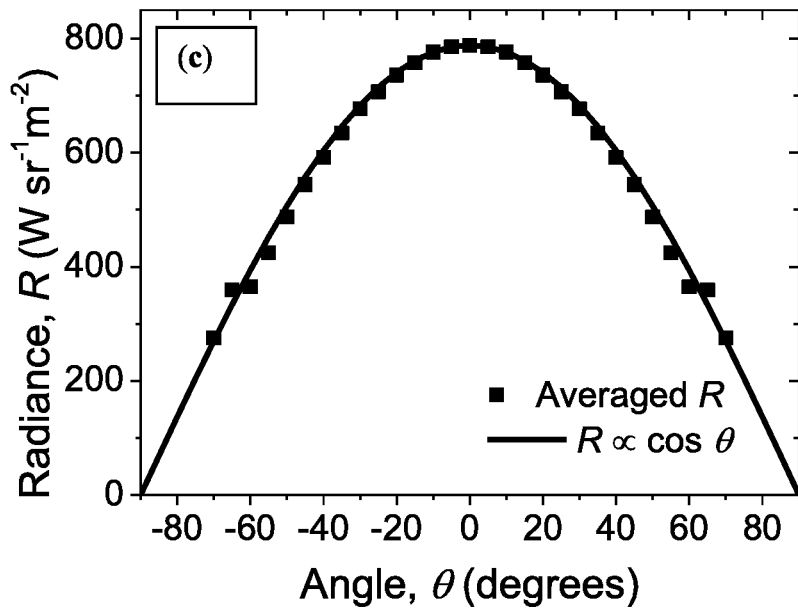
Figure 24:
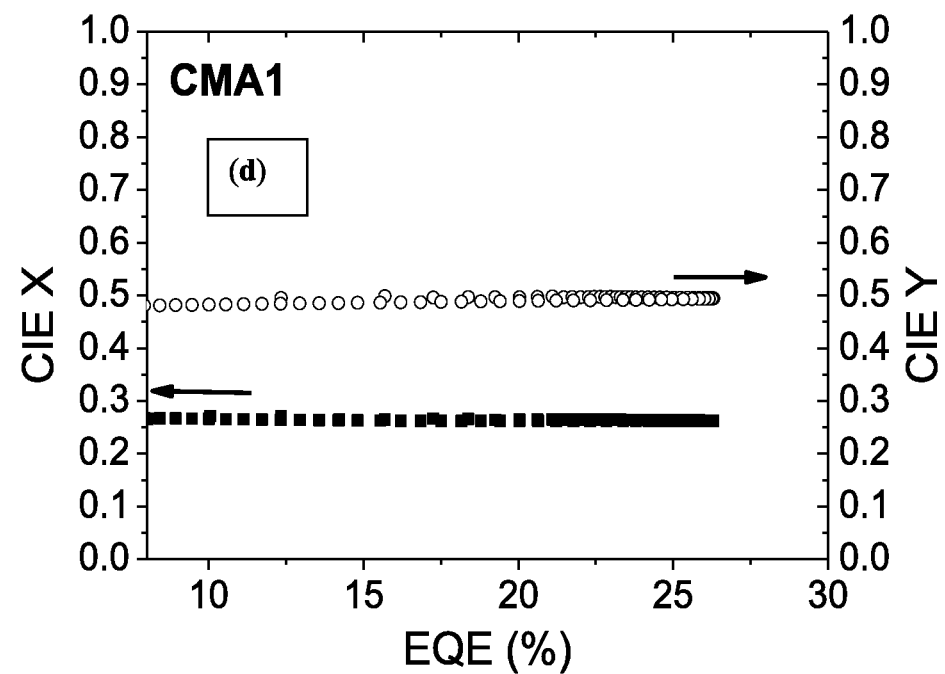
Figure 24:
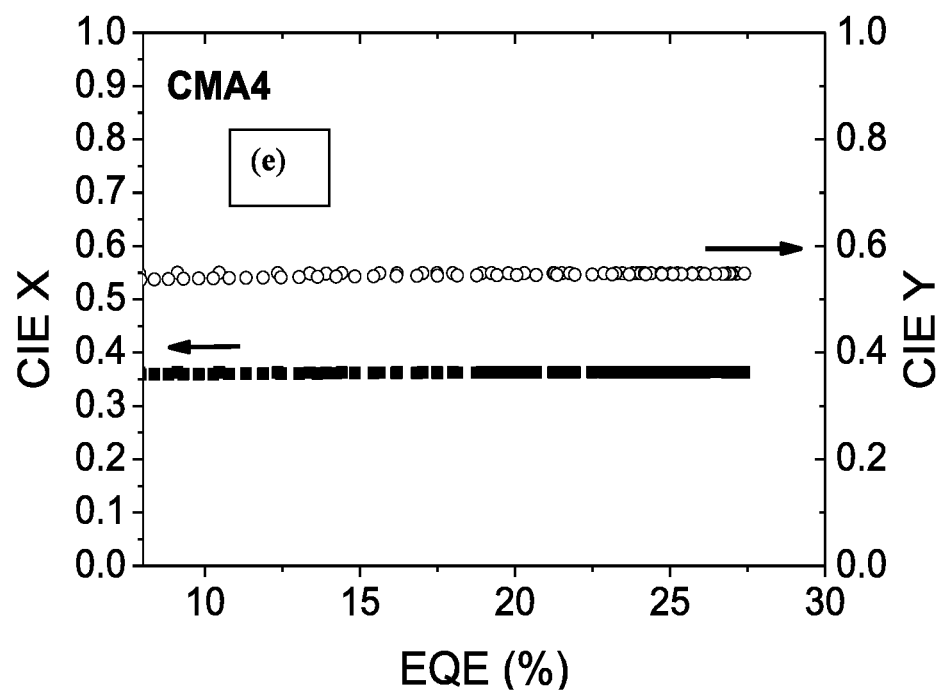

The performance of the OLED devices based on CMA1-4 is shown in FIGS. 18, 23 and 24. In this example, a multi-layer device structure of Glass/ITO/PEDOT:PSS/TFB/PVK:CMA/BPhen/LiF/Al is used. The functions of the layers can be described in reference to the OLED structure shown in FIG. 1. The PVK and CMA blend forms the emissive zone. PEDOT:PSS and TFB layers form the hole transporting layer. The electron injection layer is comprised of BPhen and LiF. Al is the cathode material.
ITO=Indium tin oxide
PEDTO:PSS=poly(3,4-ethylenedioxythiophene):polystyrene sulfonate (Clevios P VP AI 4083)
TFB=poly(9,9-dioctyl-fluorene-co-N-4-butylphenyl-diphenylamine) (Cambridge Display Technology)
PVK=poly(9-N-vinylcarbazole) (PVK) (Sigma-Aldrich)
"CMA"=CAAC metal amide (the CMAs designated CMA1, CMA2, CMA3 and CMA4, the structures of which are shown in FIG. 19b, were used)
BPhen=bathophenanthroline (97%, Sigma-Aldrich)
LiF=lithium fluoride (99.99%, Sigma-Aldrich)
Al=aluminium.

Figure 16:
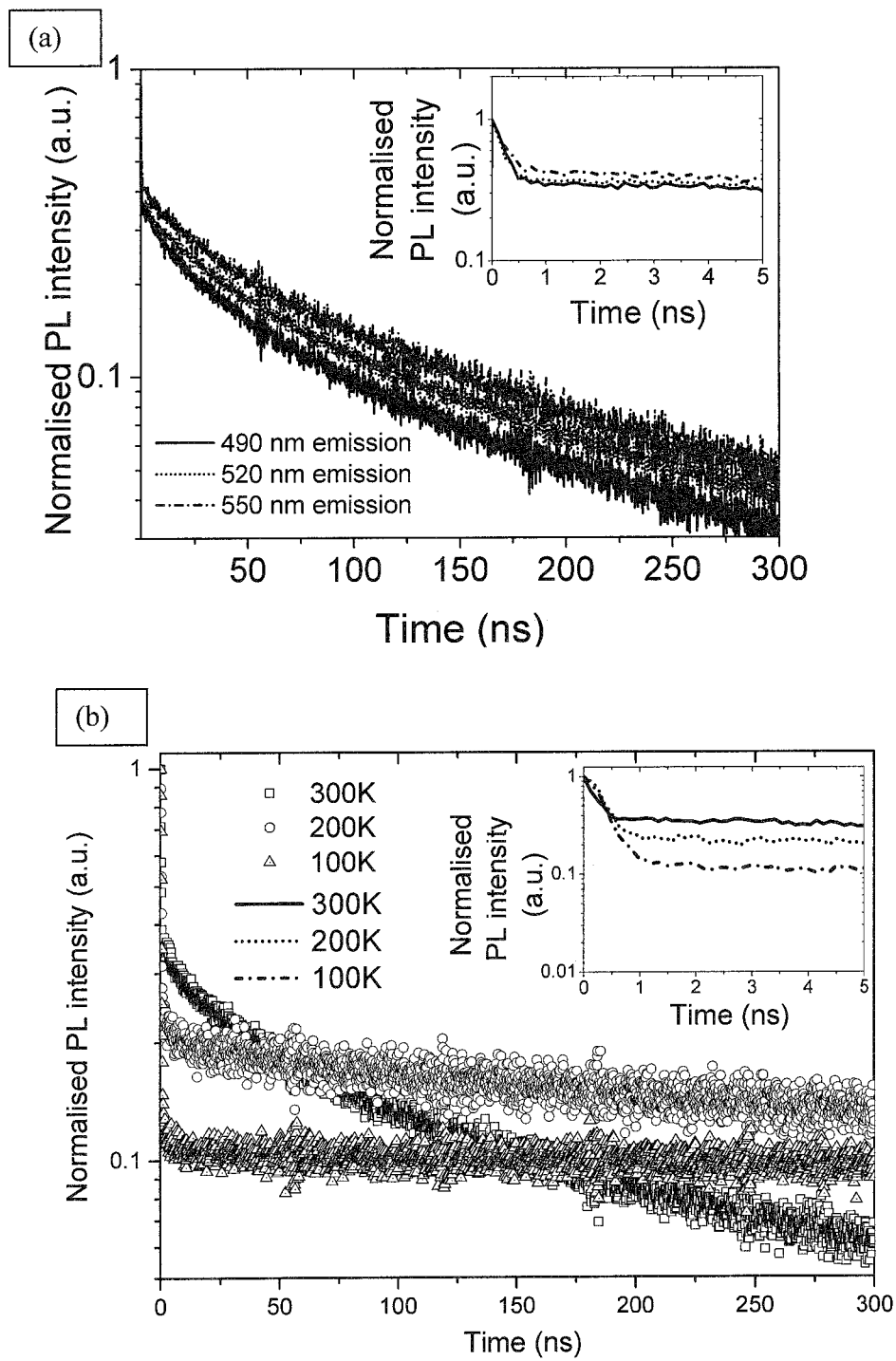
FIG. 16. Photoluminescence decay data of ($^{Ad}$CAAC)Au (carbazolate) (CMA1) measured by time-correlated single photon counting (TCSPC). (a) Room-temperature photoluminescent (PL) decay kinetics (inset: 0-5 ns data). (b) PL decay curves at three different temperatures (inset: 0-5 ns data). Note that the contribution of slow emission at low temperatures is artificially enhanced by the 2.5 MHz repetition rate of excitation pulses.

FIG. 16 shows photoluminescence (PL) decay data of ($^{Ad}$CAAC)Au(carbazolate) (CMA1) measured by time-correlated single photon counting (TCSPC). (a) Room-temperature photoluminescent (PL) decay kinetics (inset: 0-5 ns data). (b) PL decay curves at three different temperatures (inset: 0-5 ns data). Note that the contribution of slow emission at low temperatures is artificially enhanced by the 2.5 MHz repetition rate of excitation pulses.

Figure 17:
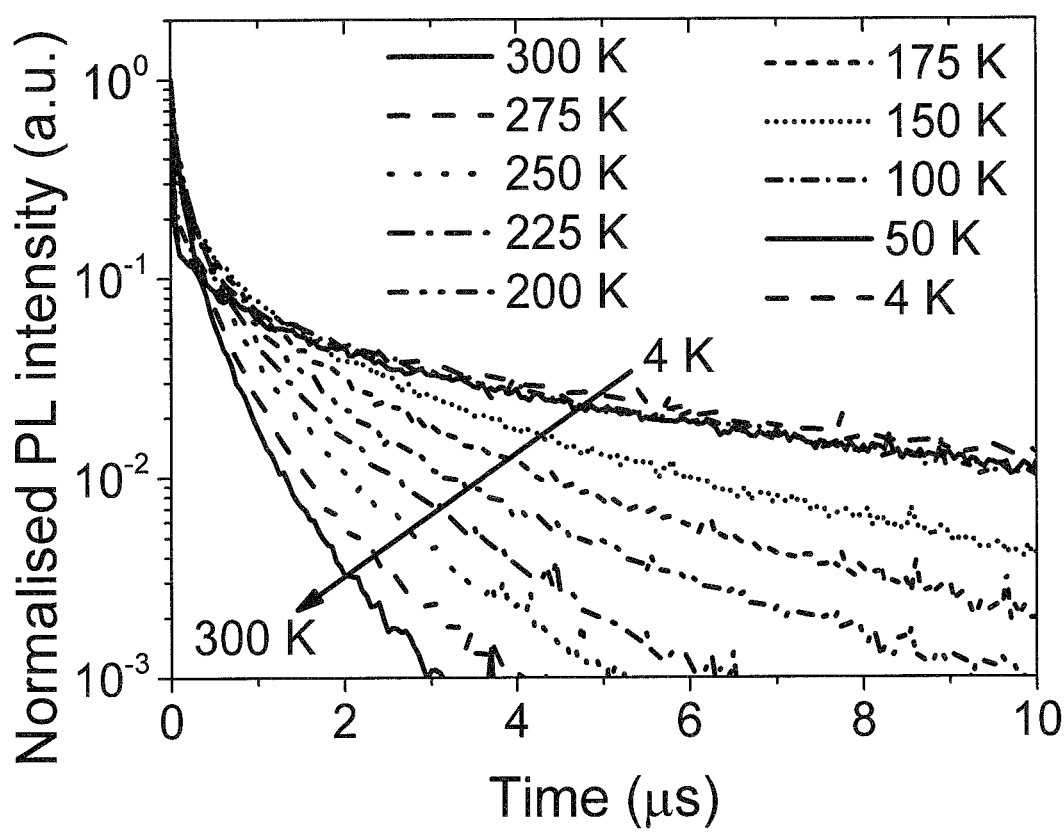
FIG. 17. Temperature-dependent Photoluminescence decay data of ($^{Ad}$CAAC)Au(carbazolate) (CMA1) measured by an electrically-gated intensified charge coupled device (CCD).

FIG. 17 shows temperature-dependent photoluminescence decay data of ($^{Ad}$CAAC)Au(carbazolate) (CMA1) measured by an electrically-gated intensified charge coupled device (CCD).

FIG. 18a shows the external quantum efficiency in OLEDs incorporating ($^{Ad}$CAAC) metal carbazolate CMA complexes, as a function of current density.

Example 29. Further Studies

The literature references designated as 8 to 25 and S1 to S14 mentioned in this Example are listed at the end of the Example.

For background information on the development of OLEDs, see for example references 1 to 7. Molecular rotation has attracted significant attention for its application in biological and molecular nanomachines[8], and can be controlled by introducing chemical[9], thermal[10,11], light[10,12], and electrical[12] energy. In this Example, we show that rotational flexibility can also be used to break the geometric equivalence of singlet and triplet excitations in OLEDs, by allowing each spin-state to relax into a different rotated geometry with different exchange interactions. Nearly all organic materials undergo some geometric reorganisation in response to both charged and neutral excitations, leading to the well-known behaviour of polaronic charge carriers and large Stokes shifts in emission. In rotationally flexible complexes this relaxation can be extreme, allowing the possibility for the geometrically relaxed singlet to lie lower in energy than the relaxed triplet. This inversion of the normal ordering of spin-state energies leads to efficient down-conversion from triplet excitons to lower lying singlets, which can subsequently emit. We term this process "rotationally accessed spin-state inversion" (RASI). FIG. 19a shows a schematic of the RASI process.

Figure 26:
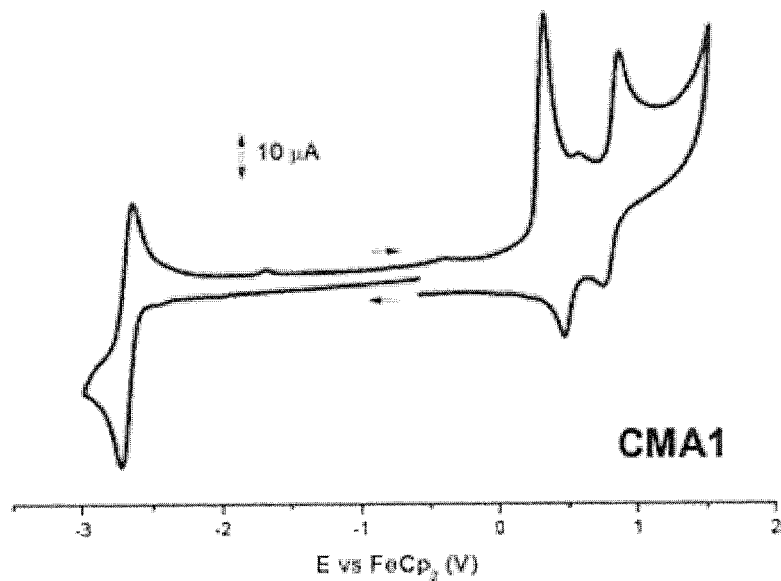
FIG. 26. Cyclic voltammogram. a, CMA1. b, CMA2. Data was recorded using a glassy carbon electrode in MeCN solution with [n-Bu$_4$N]PF$_6$ as supporting electrolyte with a scan rate of 0.1 V s$^{-1}$.
Figure 26:
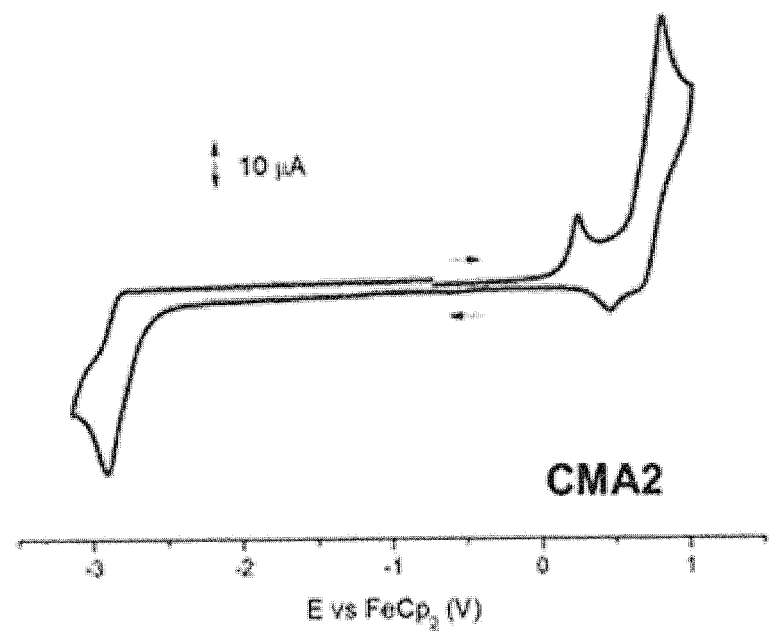

We designed and synthesised 2-coordinate cyclic (alkyl)(amino)-carbene (CAAC) compounds based on CAAC-M-amide (CMA) where M is Cu or Au. (CAAC)AuCz (CMA1) and its structurally similar analogues, (CAAC)CuCz (CMA2), (CAAC)AuNPh$_2$ (CMA3), and (CAAC)AuDTBCz (CMA4) are shown in FIG. 19b (Cz=carbazole anion, DTBCz=3,6-di-tert.-butylcarbazole anion). The synthetic procedures have been described in Examples 11, 14, 15 and 16. Cyclic voltammograms of CMA1 and CMA2 are shown in FIG. 26. The complexes CMA1 to CMA4 are soluble in a range of organic solvents, do not undergo ligand rearrangement reactions in solution, and are thermally stable to >270° C., as shown in Table 2:

TABLE 2

Decomposition temperatures for CMA1-4 by thermal gravimetric analysis (TGA).

| Compound | $T_d$ (° C.) |
| --- | --- |
| CMA1 | 334 |
| CMA2 | 303 |
| CMA3 | 271 |
| CMA4 | 336 |

The excited state energies of CMA1-4 were computed using density functional theory (DFT) and time-dependent density functional theory (TD-DFT) with optimisation of the molecular geometry. For CMA1 (FIGS. 19c and 19d), the ground state S$_0$ and the relaxed triplet state T$_1$ correspond to a geometry with the carbene and carbazole ligands being co-planar, while the relaxed singlet state S$_1$ corresponds to a geometry with the carbazole ligand being rotated by 90°. The relaxed T$_1$ state (2.44 eV) is higher in energy than the relaxed S$_1$ state (2.11 eV), leading to a S$_1$-T$_1$ energy gap of ΔE$_{ST}$=−0.33 eV. The excited singlet state constrained to the co-planar geometry, which we term S$_1$*, lies at 2.63 eV and obeys the conventional excited spin-state energy arrangement, as might be expected from Hund's rules. Similar calculations for CMA2-4 are shown in Table 3:

TABLE 3

TD-DFT calculation of excited state energies and oscillator strengths to $S_0$, for CMA1-4. Oscillator strengths normalised to $S_1^*$ of CMA1.

Figure 20:
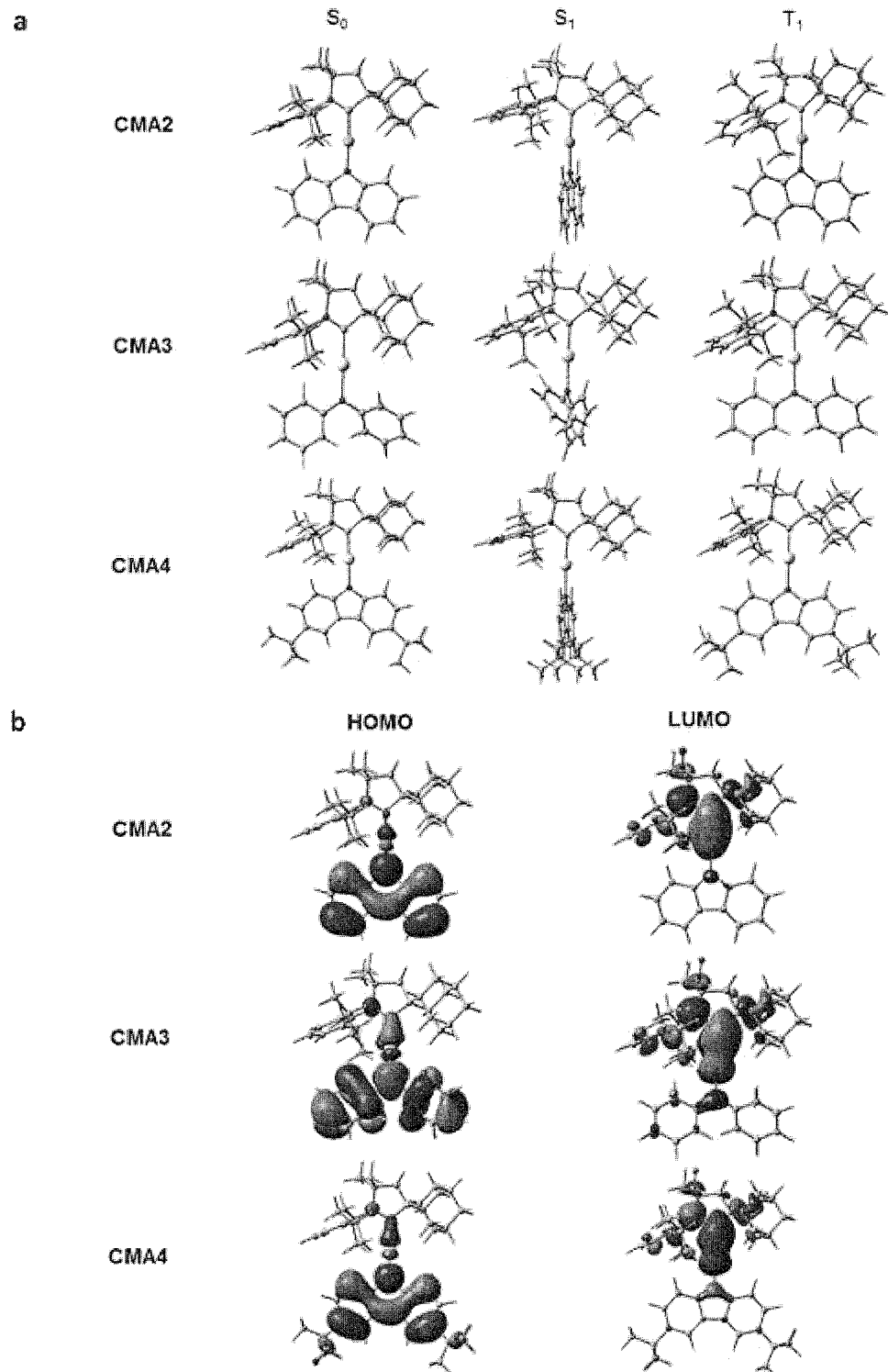
FIG. 20. DFT and TD-DFT calculations for CMA2-4. a, Optimised molecular geometries for $S_0$, $S_1$, and $T_1$. b, HOMO and LUMO.

| Compound | $S_1$ (relaxed) (eV) | $T_1$ (relaxed) (eV) | $S_1 - T_1$ (eV) | $S_1^*$ (planar) (eV) | Oscillator strength ($S_1$) | Oscillator strength ($S_1^*$) |
|---|---|---|---|---|---|---|
| CMA1 | 2.11 | 2.44 | −0.33 | 2.63 | 0.001 | 1.000 |
| CMA2 | 2.05 | 2.39 | −0.34 | 2.49 | 0.006 | 0.629 |
| CMA3 | 1.81 | 2.05 | −0.24 | 2.47 | 0.003 | 0.967 |
| CMA4 | 1.99 | 2.29 | −0.30 | 2.53 | 0.001 | 1.191 | and in FIG. 20. This contrasts with 3-coordinate Cu(I) compounds where rotational freedom does not lead to spin-state inversion[13]. Calculated oscillator strength for the $S_0 \rightarrow S_1^*$ transition in CMA1 is three orders of magnitude higher than that of the $S_0 \rightarrow S_1$ transition in the fully relaxed geometry. The lowest strong optical absorption is therefore primarily from $S_0$ to $S_1^*$, while emission can occur from both $S_1^*$ and $S_1$.

Solid films of CMA1-4 are photoluminescent, as has been observed in carbene metal halide compounds[14]. Absorption spectra for a spin-coated film of CMA1 has an onset at approximately 450 nm (FIG. 21a), in good agreement with the DFT calculations. To understand the emission mechanism of this class of compounds, we investigate the PL spectra and kinetics of spin-coated thin films under pulsed laser excitation. All compounds show a fast component to the PL decay with lifetime of approximately 1 ns (see FIG. 16) and a slow component whose lifetime is strongly dependent on temperature, as discussed further below.

Figure 21:
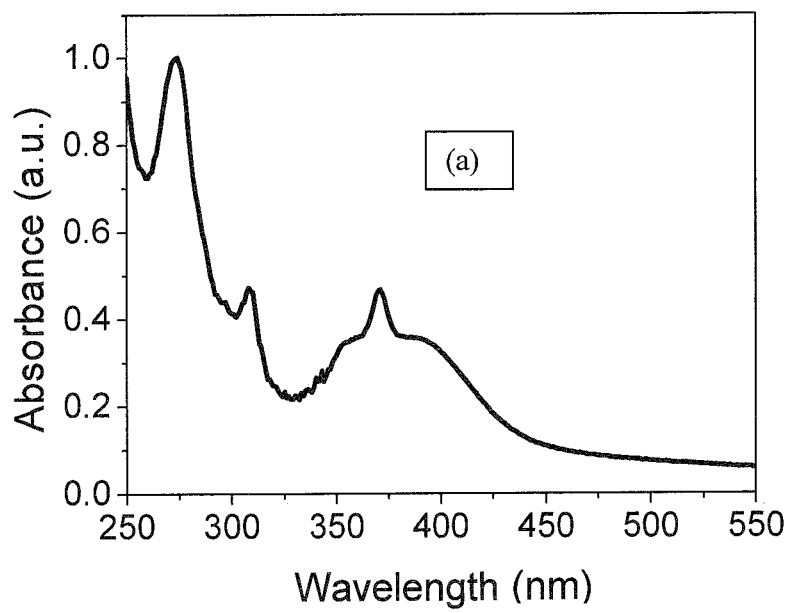
FIG. 21. Photophysical characterisation and temperature-dependent emission kinetics of CMA1. a, Absorption at 300K. b, Evolution of PL spectra with time at 300K. c, Temperature-dependent photoluminescent (PL) kinetics. d, Temperature-dependent total and slow PL intensities calculated by integrating the time-dependent decays. e, Fast (t<2 ns) and slow (t=2 µs) PL spectra recorded at 300K and 4K. f, Temperature-dependent decay rate $k_T$, showing an activation energy of 45 meV above 100K.
Figure 21:
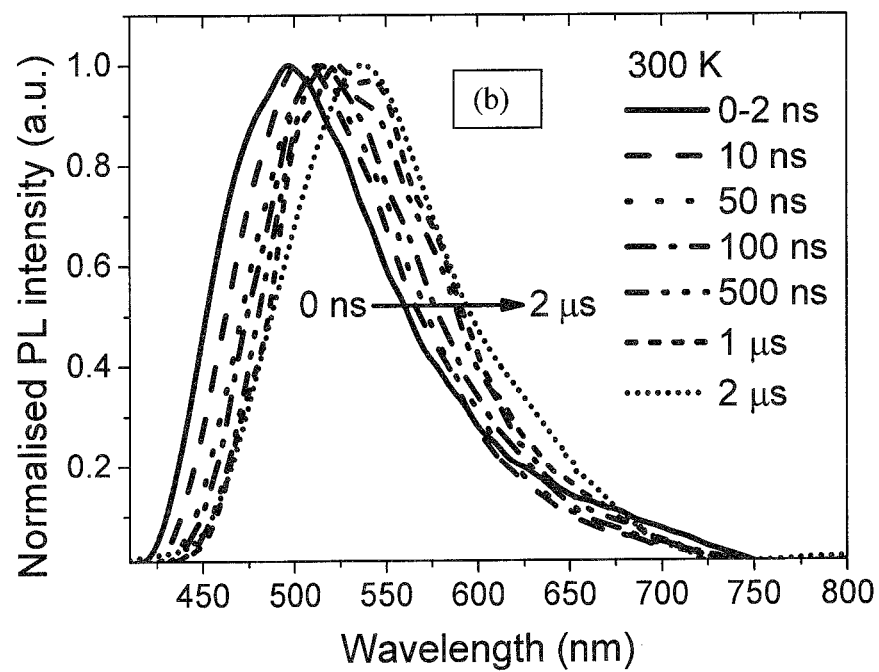
Figure 21:
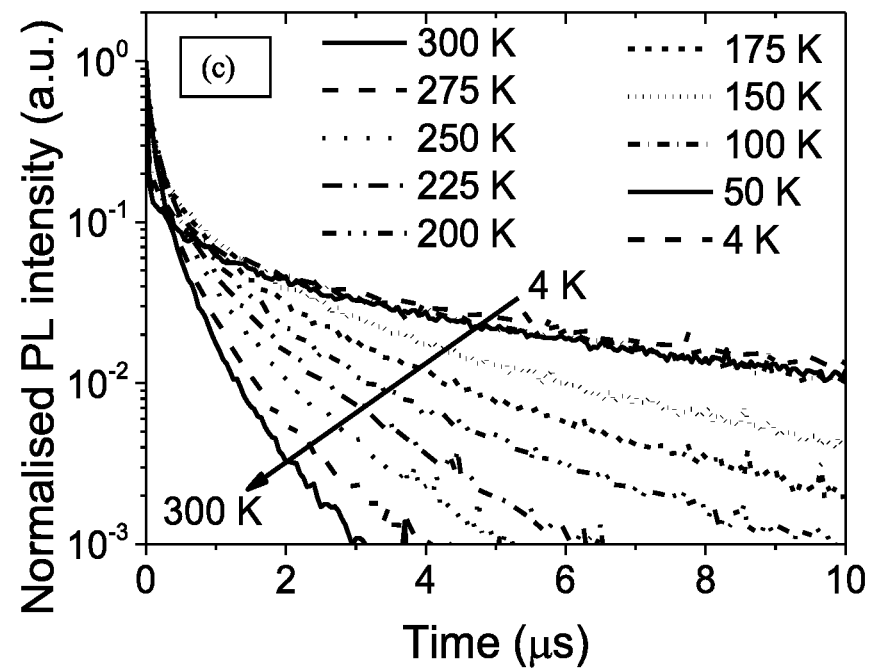
Figure 21:
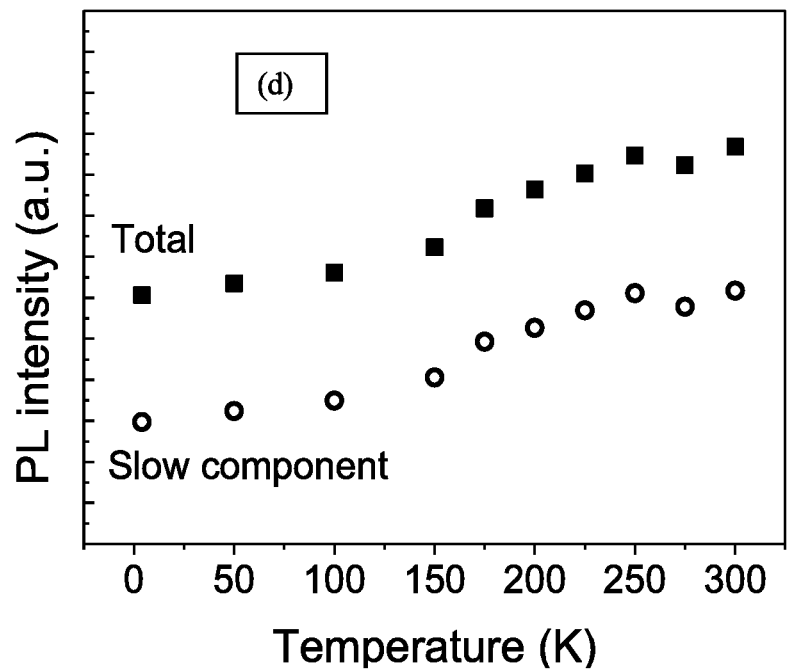
Figure 21:
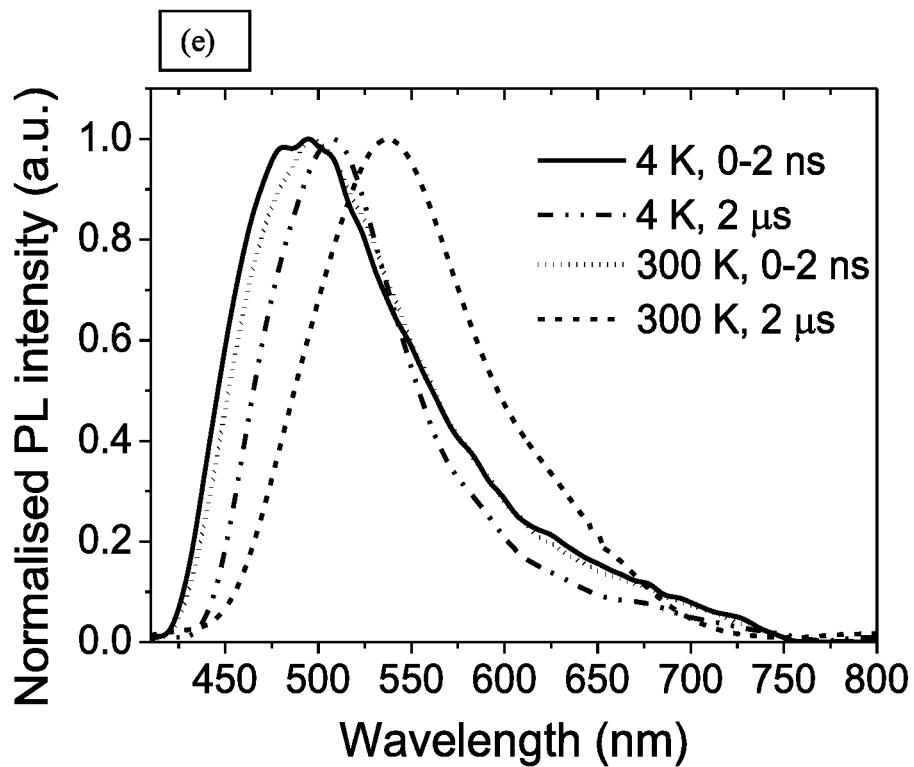
Figure 21:
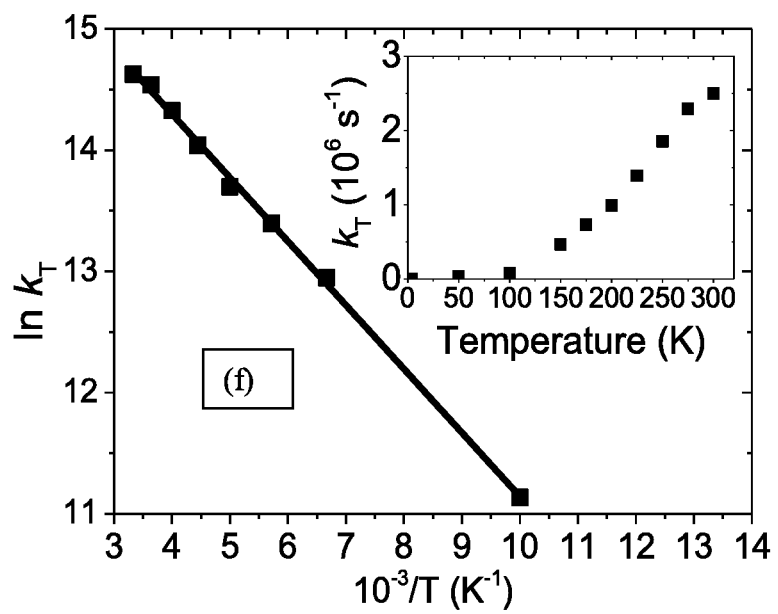

Time-resolved PL spectra of CMA1 on ns-μs timescales at 300K, FIG. 21b, show a red shift of the PL peak position from approximately 500 nm at early times (0-2 ns), to approximately 540 nm at 2 μs. The emissive species at early times is therefore spectrally distinct from the emissive species at late times, in contrast to the behaviour of thermally activated delayed fluorescence (TADF) compounds[5].

The lifetime of the red-shifted slow component decreases from approximately 5 μs at 4K to approximately 350 ns at 300K (FIG. 21c), while its intensity increases, leading to an increase in the total PL intensity with temperature (FIG. 21d). This contrasts with phosphorescent compounds such as Ir(ppy)$_3$[15], for which the PL intensity is not sensitive to temperature and no fast emission is observed.

Following Kasha's rule in the planar geometry, we assign the fast emission to transitions from $S_1^*$ to $S_0$. The excitations can explore lower-energy geometries at later times. We assign the slow emission to $S_1$ to $S_0$ transitions. By comparing the fast emission energy (approximately 2.6 eV) at 4K and the slow emission energy (approximately 2.3 eV) at 300K (FIG. 21e), we estimate a lower bound on the $S_1^*$-$S_1$ offset to be ~0.3 eV, in reasonable agreement with the value predicted by TD-DFT (0.5 eV).

Figure 22:
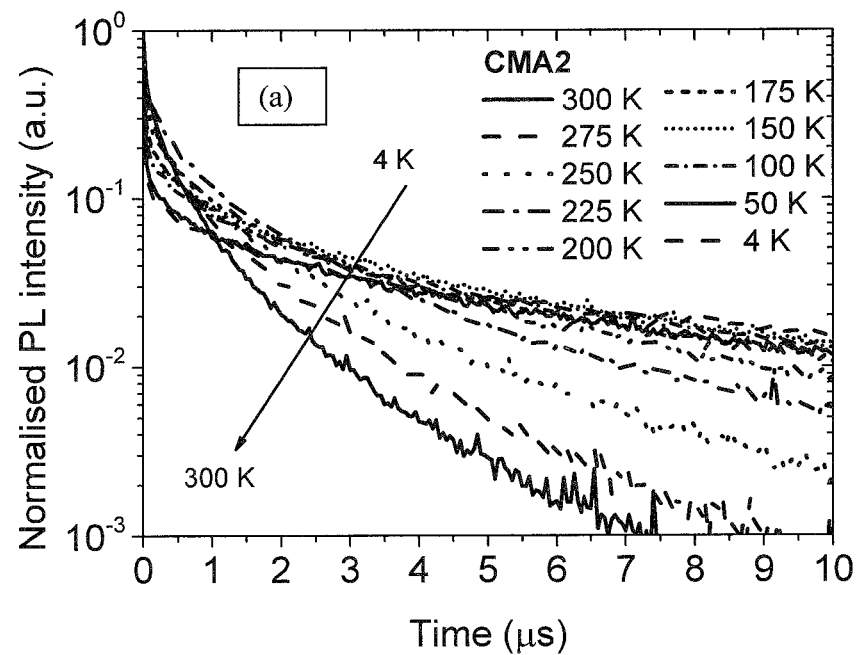
FIG. 22. Temperature-dependent PL decay kinetics and activation energies for CMA2-4.
Figure 22:
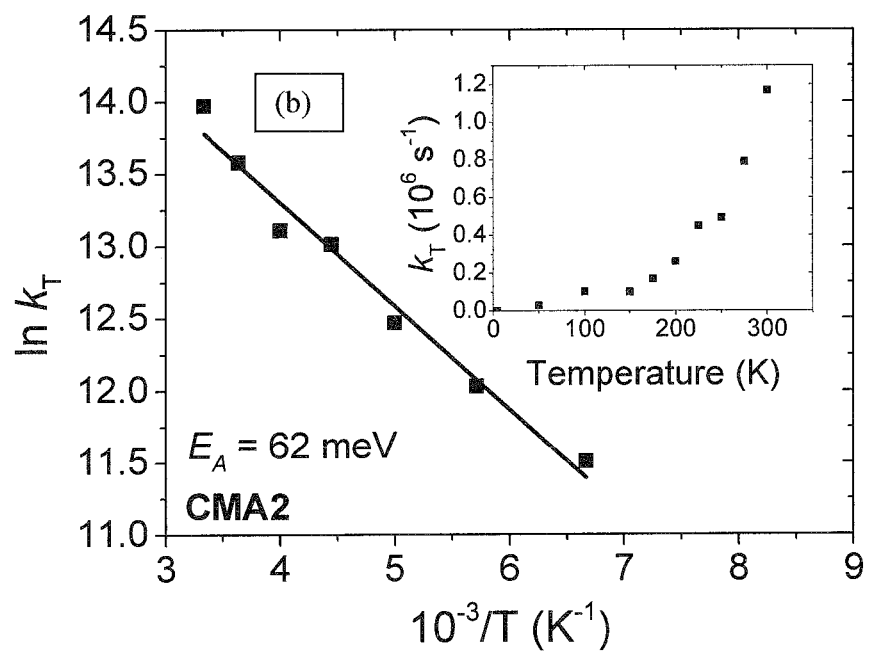
Figure 22:
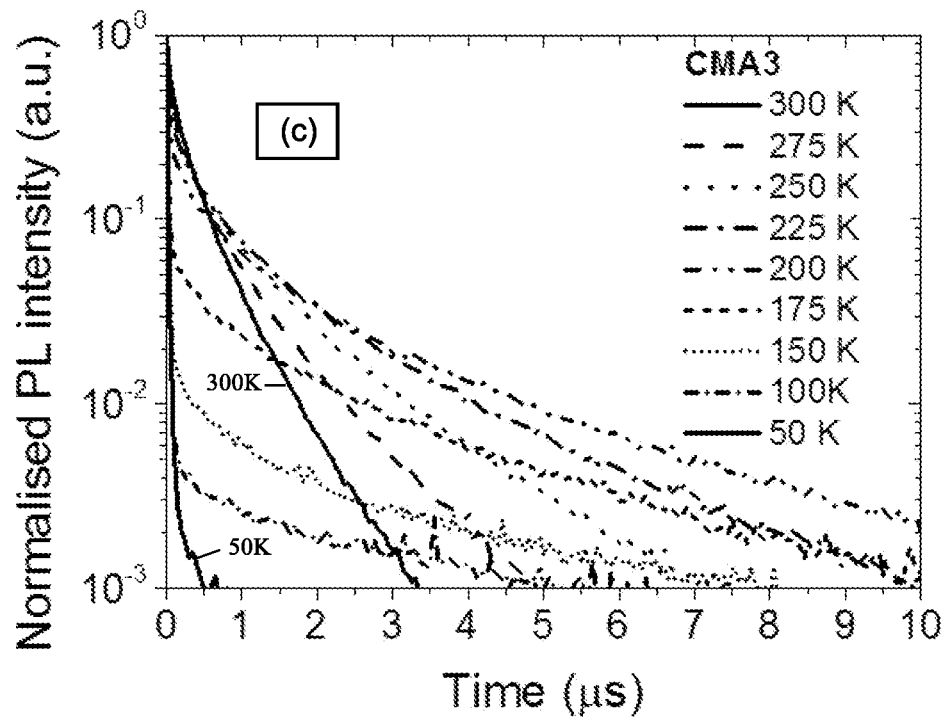
Figure 22:
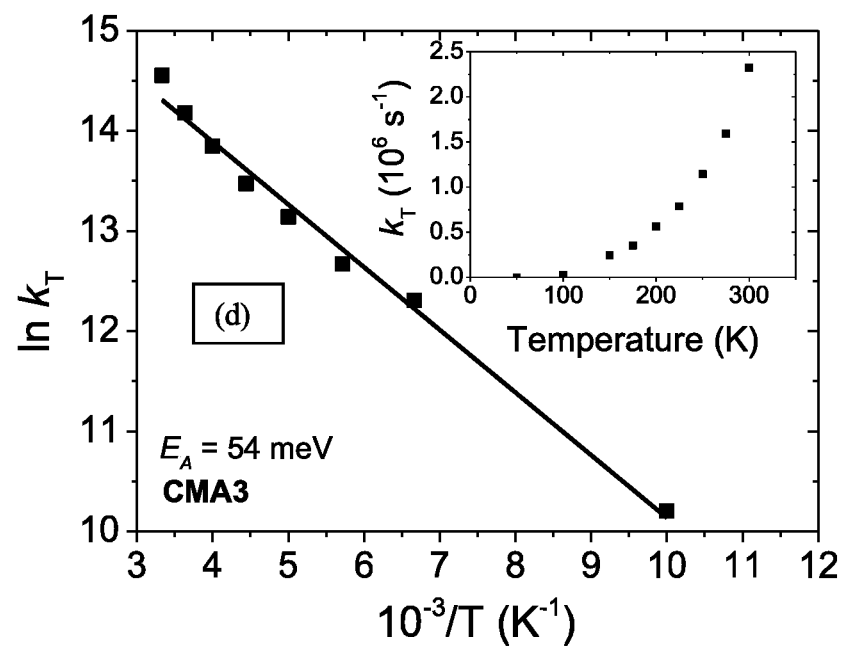
Figure 22:
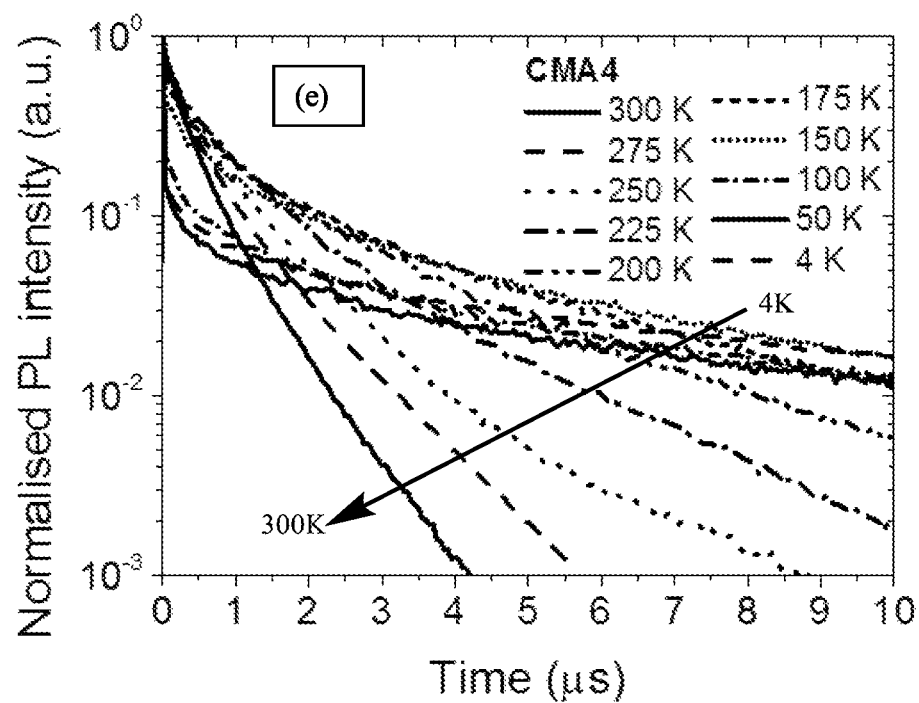
Figure 22:
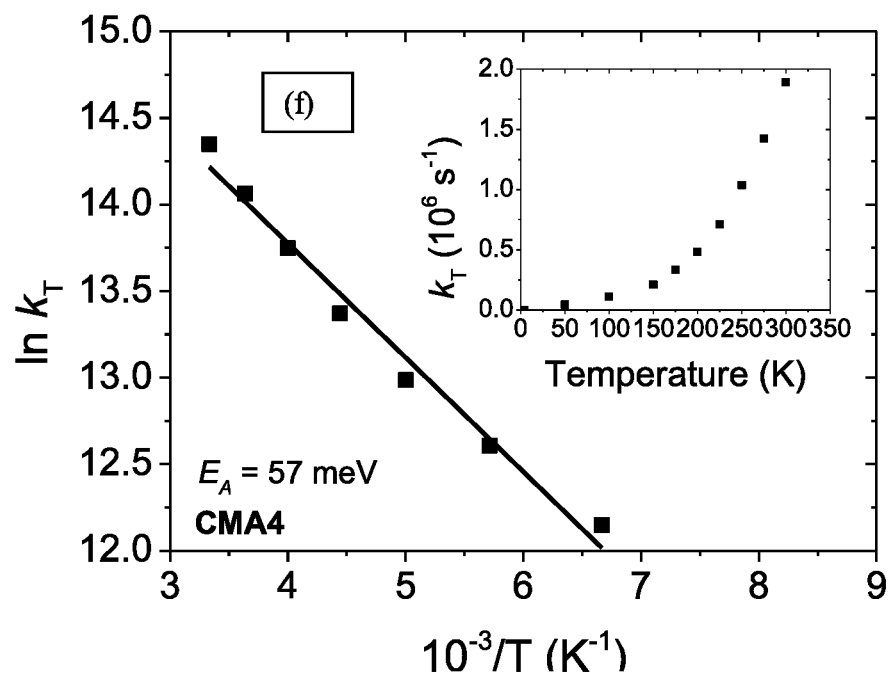

The lowering of the exciton energy through rotation of the metal-amide bond is opposed by the rotational stiffness of the molecule. This is calculated for CMA1 to be 143 meV for full rotation of the carbazole group using DFT for the $S_0$ ground state, equivalent to that of a freely rotatable carbon-carbon single bond[16]. From the PL data presented in FIG. 21c, we calculate the activation energy ($E_A$) for the slow emission in the solid film to be much lower. FIG. 21f shows an Arrhenius plot for CMA1, giving an $E_A$ of 45 meV, which is accessible at room temperature. Calculated activation energies for CMA2-4 are very similar, and are shown in FIG. 22.

We note that we do not see strong phosphorescence in these materials. We consider that this arises because the lowest triplet state lies above the singlet energy for the rotated geometry. For CMA1 the triplet is calculated to lie at 2.44 eV, between the planar geometry singlet at 2.6 eV and the rotated geometry at 2.3 eV as estimated from the PL measurements. At very low temperature, the slow emission lifetime saturates and its peak wavelength lies between those of the room-temperature fast and slow spectra (FIG. 21e), we therefore assign this emission to residual weak phosphorescence.

The performance of molecular rotation-based OLED (ROLEDs) is shown in FIG. 23a. The energy levels of the materials used are shown in FIG. 23b. HOMO/LUMO energies of CMA1-4 are shown in Table 4:

TABLE 4

Formal electrode potentials for the compounds.
Formal electrode potentials ($E_{1/2}$ for irreversible and E' for reversible processes (*) vs. FeCp$_2$), onset potentials (E vs. FeCp$_2$), $E_{HOMO}/E_{LUMO}$ (eV) and band gap values ($E_g$, eV) for the redox changes exhibited by the complexes under study in MeCN solution (0.14 mM), supporting electrolyte [n-Bu$_4$N][PF$_6$] (0.13 mol dm$^{-3}$), measured at 0.1 V s$^{-1}$. $E_{HOMO} = -(E_{onset\ ox\ Fc/Fc+} + 5.39)$ eV, based on first oxidation potential, and $E_{LUMO} = -(E_{onset\ red\ Fc/Fc+} + 5.39)$ eV, based on first reduction potential.

| | Reduction (V) | | $E_{LUMO}$ | Oxidation (V) | | | $E_{HOMO}$ | $E_g$ |
|---|---|---|---|---|---|---|---|---|
| Compound | $E_{M(I)/M(0)}$ | $E_{onset\ red}$ | (eV) | $E_{1st}$ | $E_{onset\ ox}$ | $E_{2nd}$ | (eV) | (eV) |
| CMA1 | −2.68* | −2.60 | −2.79 | +0.26 | +0.22 | +0.77 | −5.61 | 2.82 |
| CMA2 | −2.84* | −2.73 | −2.66 | +0.12 | +0.07 | +0.71 | −5.46 | 2.80 |
| CMA3 | −2.78* | −2.69 | −2.70 | −0.13 | −0.17 | +0.49 | −5.22 | 2.52 |
| CMA4 | −2.86* | −2.78 | −2.61 | +0.13 | +0.08 | +0.65 | −5.47 | 2.86 |

As described in Example 28, TFB[17] was deposited on PEDOT:PSS to form the hole-transporting layer, while CMA1-4 dispersed in a wide-bandgap polymer host PVK[4,18] were used as the emissive layer, followed by BPhen/LiF electron-injection layer.

The electroluminescence (EL) spectra and the external quantum efficiency (EQE) of the best ROLEDs are shown in FIGS. 18, 23c, 24a and 24b and in Table 5:

TABLE 5

Summary of ROLED performances (best devices). Efficiency values at different brightness (100 cd m$^{-2}$ and 1000 cd m$^{-2}$) are shown.

| Emitter | Turn-on Voltage (V) | EQE (%) Max/100/1000 cd m$^{-2}$ | Current Efficiency (cd A$^{-1}$) Max/100/1000 cd m$^{-2}$ | Power Efficiency (lm W$^{-1}$) Max/100/1000 cd m$^{-2}$ | Max. Luminance (cd m$^{-2}$) |
|---|---|---|---|---|---|
| CMA1 | 2.6 | 26.3/26.1/25.2 | 76.3/75.8/73.0 | 62.7/50.0/37.0 | 44700 |
| CMA2 | 3.4 | 9.7/8.9/9.2 | 30.4/28.0/29.0 | 11.8/11.7/9.3 | 7790 |
| CMA3 | 3.0 | 17.9/17.3/15.5 | 45.2/43.7/39.1 | 33.6/25.0/17.0 | 39540 |
| CMA4 | 2.6 | 27.5/26.6/24.5 | 87.1/84.5/77.9 | 75.1/50.2/35.5 | 64700 |

Angular emission profiles for the devices showed Lambertian emission (FIG. 24c), as is typical for OLEDs without microcavity outcoupling[19], and allowed accurate estimation of EQE from on-axis irradiance. Consistent with this, the Commission Internationale de l'Eclairage (CIE) colour coordinates of the devices showed no observable variation with EQE (FIGS. 24d and 24e). FIG. 23d shows the maximum EQE histogram of 135 ROLEDs using CMA4, which produced the most efficient devices. Performance metrics are summarised in Table 2 above. The EQEs of the best devices at practical brightness (100 & 1000 cd m$^{-2}$), higher than 25%, are higher than the best solution-processed LEDs[7,20] without enhanced optical outcoupling, while the peak EQE of our best device reached 27.5%.

These LEDs contain no features for enhancing outcoupling efficiency beyond the 20-30% range expected for planar OLEDs[5,7,19], giving a close-to-unity (80-100%) internal quantum efficiency for the best ROLEDs (based on CMA1 and 4). Time-resolved EL measurements confirm that 100% of emission occurs through the sub-μs slow emission channel (FIGS. 23e and 23f). There is no fast (ns) component which would usually distinguish between geminate singlets and triplets[21,22]. EL spectra usually correspond to the lowest energy excited state, since recombination will preferentially occur at these sites. The steady-state EL spectrum agrees very well with that of the lowest-energy PL (FIG. 23e). Together, these imply that all excitons, regardless of initial spin, contribute to luminescence in these materials, and that emission primarily occurs via the lowest energy rotated singlet state (300K), consistent with calculations placing $T_1$ higher in energy in this geometry. The lifetimes of the electroluminescence decreases with increasing current density, which may represent detrimental bimolecular interactions[23]. Given the relatively slow efficiency roll-off at high current, this may also be an effect of Joule heating increasing the emission rate. At present, it is difficult to separate these effects, but it is clear there is scope for performance improvement at high current densities.

We consider that the rapid intersystem crossing (ISC) required for this efficient device performance is achieved at rotational configurations at which the exchange energy is close to zero. This allows spin-orbit coupling, which is relatively strong for these systems where the excited state wave functions occupy Cu or Au sites, to mix the two spin states effectively. As such, the activation energies we measure are likely to correspond to partial rotation of the molecule, sufficient to allow rapid transitions between spin states. However, we cannot rule out a contribution from exciton migration.

In conclusion, we demonstrate high-performance OLEDs utilising a new class of material to harvest the energy of normally non-emissive triplet excitons. Inversion of the usual ordering of the excited singlet and triplet states allowed by molecular rotation provides a mechanism to drive excitations to the lowest energy singlet, where they can emit efficiently. Spin-state inversion opens a new route for the design of organic optoelectronics. For example, spontaneous down-conversion from triplets to singlets is highly desirable for the realisation of electrically-pumped organic lasers. The possibilities of modulating the rotational motion of the emissive molecules with thermal and electromagnetic energies could allow the present invention to be used in the development of optoelectronic nanomachines.

Methods Used in Example 29:

Time-Correlated Single Photon Counting (TCSPC) Measurements

The solid-state samples for TCSPC studies were spin-coated from anhydrous tetrahydrofuran solutions (10 mg/mL) onto pre-cleaned quartz substrates. The samples were placed under high vacuum for 15 min to remove the solvent. The samples were photoexcited using a 407 nm pulsed laser with pulse width <200 ps, at a repetition rate of 2.5 MHz. The photoluminescence was detected by a Si-based single-photon avalanche photodiode. The instrument response function has a lifetime of about 200 ps. A 420 nm long-pass filter was used to screen out any scattered laser signal in the optical path.

Cryogenic Time-Resolved Photoluminescence Measurements

Preparation of solid-state samples was the same as for TCSPC measurements. Time-resolved PL spectra were recorded using an electrically-gated intensified CCD (ICCD) camera (Andor iStar DH740 CCI-010) connected to a calibrated grating spectrometer (Andor SR303i). Photoexcitation was provided by femtosecond laser pulses which were created by second harmonic generation (SHG) in a BBO crystal from the fundamental output (pulse energy=1.55 eV, pulse width=80 fs) of a T$_1$: Sapphire laser system (Spectra Physics Solstice). The photons from the laser pulses had a wavelength of 400 nm. A 420 nm long-pass filter was used to prevent scattered laser signal from entering the camera. Temporal evolution of the PL emission was obtained by stepping the ICCD gate delay with respect to the excitation pulse. The minimum gate width of the ICCD was approximately approximately 2.5 ns. The cooling of the samples was provided by liquid helium, and the temperature of the samples was regulated using a temperature-controlled cryostat.

To calculate the activation energy, we assume the slow PL process has a general decay rate of the form:

$$k_{slow} = k_0 + k_T$$

where $k_0$ is a temperature-independent rate constant, and $k_T$ is a temperature-dependent rate, given by $$k_T = \beta e^{-\frac{E_A}{k_B T}}$$

where $E_A^{E^A}$ is the thermal activation energy, $k_B$ is Boltzmann constant, T is the temperature in Kelvin and $\beta$ is a constant. It follows that:

$$PL_{slow} = PL_{slow\,0} e^{-(k_0 + k_T)t}$$

where $PL_{slow}$ and $PL_{slow0}$ are the intensity and the initial (t=0) intensity of the slow PL component. We therefore obtain:

$$\ln(k_T) = -\left(\frac{E_A}{k_B}\right)\left(\frac{1}{T}\right) + C$$

where C is a constant. We outline a physical model for $k_T$ below (Rate equations for the interpretation of activation energy).

OLED Performance Characterisation

The EL spectra of the devices were recorded using the calibrated ICCD-spectrometer set-up used in the PL measurements. The accuracy of the spectral data was cross-checked against a Labsphere CDS-610 spectrometer, as well as a Minolta CS-1000 luminance meter. Current density-voltage-luminance (J-V-L) characteristics were measured using a Minolta CS-200 luminance meter and a Keithley 2400 source-meter. The EQE of the devices were calculated based on the Lambertian emission profile measured. In addition, the accuracy of the EQE measurements for a subset of devices was checked using a calibrated silicon photodiode with known spectral response function, a Minolta CS-1000 luminance meter, as well as an integrating sphere.

Transient-Electroluminescence Measurements

The devices were electrically excited by a function generator using 1 kHz square voltage (current) pulses with a pulse width of 0.5 ms for the on-cycles (forward bias). The off-cycles of the device operation were provided by a reverse bias of −4 V to eliminate charge accumulation effects. The instrument response time of the function generator was approximately 10 ns. The transient-EL of the samples was recorded by the same ICCD spectrometer used in the PL measurements.

Synthesis and Characterisation of Carbene Metal Amides

Unless stated otherwise all reactions were carried out in air. Solvents were distilled and dried as required. Sodium tert-butoxide, $HNPh_2$, carbazole and 3,6-di-$^t$Bucarbazole were purchased from Sigma-Aldrich and used as received. Complexes (CAAC)MCl (M=Cu and Au) were obtained as described[24,S1]. Spectra of $^1H$, $^{13}C\{^1H\}$ were recorded using a Bruker Avance DPX-300 MHz NMR spectrometer. $^1H$ NMR (300.13 MHz) and $^{13}C\{^1H\}$ (75.47 MHz) were referenced to $CD_2Cl_2$ at δ 5.32 ($^{13}C$, δ 53.84), UV-visible absorption spectra were recorded in 1 cm quartz cuvette using a Perkin-Elmer Lambda 35 UV-vis spectrometer. Photoluminescence measurements were recorded on a Perkin Elmer LS55 Fluorescence Spectrometer with a solids mount attachment where appropriate. All electrochemical experiments were performed using an Autolab PGSTAT 302N computer-controlled potentiostat. Cyclic voltammetry (CV) was performed using a three-electrode configuration consisting of either a glassy carbon macrodisk working electrode (GCE) (diameter of 3 mm; BASi, Ind., USA) combined with a Pt wire counter electrode (99.99%; GoodFellow, Cambridge, UK) and an Ag wire pseudoreference electrode (99.99%; GoodFellow, Cambridge, UK). The GCE was polished between experiments using alumina slurry (0.3 μm), rinsed in distilled water and subjected to brief ultrasonication to remove any adhered alumina microparticles. The metal electrodes were then dried in an oven at 100° C. to remove any residual traces of water, the GCE was left to air dry and residual traces of water were removed under vacuum. The Ag wire pseudoreference electrodes were calibrated to the ferrocene/ferrocenium couple in MeCN at the end of each run to allow for any drift in potential, following IUPAC recommendations[S2]. All electrochemical measurements were performed at ambient temperatures under an inert Ar atmosphere in MeCN containing complex under study (0.14 mM) and supporting electrolyte [n-Bu$_4$N][PF$_6$] (0.13 mM). Data were recorded with Autolab NOVA software (v. 1.11). Elemental analyses were performed by the London Metropolitan University.

X-Ray Crystallography

The crystals suitable for X-ray study for CMA2 and CMA4 were obtained by layering $CH_2Cl_2$ solution with hexanes at −20° C. Gold complexes (CMA1 and CMA3) were crystallized by slow evaporation of benzene solution. Crystals were mounted in oil on glass fibres and fixed in the cold nitrogen stream on a diffractometer. X-ray diffraction experiment was carried out with an Oxford Diffraction Xcalibur-3/Sapphire3-CCD diffractometer, using graphite monochromated Mo $K_\alpha$ radiation (λ=0.71073 Å) at 140 K. Data were processed using the CrystAlisPro-CCD and -RED software[S3].

The principal crystallographic data CMA1: $C_{39}H_{47}AuN_2$, orthorhombic, space group $P2_12_12_1$, α=9.4256(1) Å, b=15.6507(2) Å, c=21.8140(2) Å, V=3217.94(6) Å$^3$, Z=4, $d_{calc}$=1.529 g cm$^{-3}$, μ=4.601 mm$^{-1}$, yellow/prism, crystal size 0.45×0.42×0.31 mm, F(000)=1496, $T_{min}/T_{max}$ 0.3296/0.2313, $R_1$=0.0156 (from 6203 unique reflections with I>2σ(I)) and w$R_2$=0.0379 (from all 6307 unique reflections), GOF=1.046, $\Delta\rho_{min}/\Delta\Sigma_{max}$=0.706/−0.310. CMA2: $C_{39}H_{47}AuN_2 \cdot CH_2Cl_2$, monoclinic, space group $P2_1/n$, a=10.8520(2) Å, b=18.8311(3) Å, c=18.3279(4) Å, β=106.337(2°), V=3594.17(12) Å$^3$, Z=4, $d_{calc}$=1.279 g cm$^{-3}$, μ=0.786 mm$^{-1}$, colourless/prism, crystal size 0.49×0.41×0.23 mm, F(000)=1464, $T_{min}/T_{max}$ 0.8398/0.6993, $R_1$=0.0361 (from 7150 unique reflections with I>2σ(I)) and w$R_2$=0.0989 (from all 8668 unique reflections), GOF=1.063, $\Delta\rho_{min}/\Delta\rho_{max}$=0.738/−0.697. CMA3: $C_{39}H_{49}AuN_2 \cdot C_6H_6$, monoclinic, space group $P2_1/c$, a=12.3977(2), b=20.1046(3) æ, c=15.7158(2) Å, β=107.794(2°), V=3729.78(9) Å$^3$, Z=4, $d_{calc}$=1.462 g cm$^{-3}$, μ=3.978 mm$^{-1}$, yellow/plate, crystal size 0.26×0.23×0.15 mm, F(000)=1672, $T_{min}/T_{max}$ 0.5868/0.4244, $R_1$=0.0226 (from 7931 unique reflections with I>2σ(I)) and w$R_2$=0.0529 (from all 9002 unique reflections), GOF=1.045, $\Delta\rho_{min}/\Delta\rho_{max}$=1.357/−0.998. CMA4: $C_{47}H_{63}AuN_2 \cdot 2CH_2Cl_2$, monoclinic, space group $P2_1/c$, a=12.7613(4) Å, b=15.3884(3) Å, c=24.1466(5) Å, β=95.427(2°), V=4720.6(2) Å$^3$, Z=4, $d_{calc}$=1.439 g cm$^{-3}$, μ=3.377 mm$^{-1}$, colourless/plate, crystal size 0.26×0.17×0.09 mm, F(000)=2088, $T_{min}/T_{max}$ 0.7509/0.4738, $R_1$=0.0360 (from 11579 unique reflections with I>2σ(I)) and $wR_2$=0.0798 (from all 14388 unique reflections), GOF=1.077, $\Delta\rho_{min}/\Delta\rho_{max}$=1.836/−1.205. Alert B is originated from the restriction of the resolution range of the data which was imposed by SHEL statement on the final refinement step. One of the $^tBu$-groups was disordered into two positions with equal occupancies for CMA4. DFIX statement was used to adopt a tetrahedral geometry for the disordered groups of atoms. The structures were solved by direct methods and refined by the full-matrix least-squares against $F^2$ in an anisotropic (for non-hydrogen atoms) approximation. All hydrogen atom positions were refined in isotropic approximation in "riding" model with the $U_{iso}(H)$ parameters equal to 1.2 $U_{eq}(C_i)$, for methyl groups equal to 1.5 $U_{eq}(C_{ii})$, where $U(C_i)$ and $U(C_{ii})$ are respectively the equivalent thermal parameters of the carbon atoms to which the corresponding H atoms are bonded. All calculations were performed using the SHELXTL software[S4].

DFT and Time-Dependent DFT Computations

The ground states were fully optimised by the hybrid density functional PBE0 method[S5,S6] in combination with def2-TZVP basis set of Ahlrichs and coworkers[S7,S8]. Relativistic effective core potential of 60 electrons was used to describe the core electrons of Au[S9,S10] The excited states were calculated for both relaxed and ground state geometries using TD-DFT[S11]. The methods and basis sets have been previously employed with success in studies of luminescent Cu- and Au-complexes[S12,S13]. All calculations were carried out by Gaussian 09[S14].

Rate Equations for the Interpretation of Activation Energy

We consider the excited state kinetics for a general organic emitter with intersystem crossing between singlet and triplet states. We focus on the slow (temperature activated) emission since the dynamics of the approximately ns fast emission is determined by competing geometric, spin and radiative relaxation processes, for which we do not yet have sufficiently well-resolved spectral information. By comparison with 3-coordinate Cu and Au complexes, in which ISC can be ultrafast, we assume in this model that after the initial fast decay of $S_1^*$ the excited state population primarily comprises triplets in the $T_1$ state. The kinetics of the slow PL component is therefore primarily govenened by the temporal evolution of the triplet population, and $S_1^*$ is completely depopulated.

The singlet decay processes are characterised by $k_r^S$ (radiative decay of singlets) and $k_{nr}^S$ (non-radiative decay of singlets). Similarly, in this model, $k_r^T$ (radiative decay of triplets) and $k_{nr}^T$ (non-radiative decay of triplets) are assumed to be possible in the triplet decay channels.

Conversion from singlets to triplets is characterised by the intersystem crossing (ISC) rate $k_{ISC}$, while the reverse process (RISC) is given by $k_{RISC}$. The kinetics of the singlet and triplet populations can be described by the following equations:

$$\frac{d[S]}{dt} = (-k_r^S - k_{nr}^S - k_{ISC})[S] + k_{RISC}[T] \quad (S1)$$

$$\frac{d[T]}{dt} = (-k_r^T - k_{nr}^T - k_{RISC})[T] + k_{ISC}[S] \quad (S2)$$

where [S] and [T] are singlet and triplet populations, respectively. During the slow PL process (t>>1 ns), the singlet population is small and varies much more slowly than $(k_r^S + k_{nr}^S + k_{ISC})$. Therefore, the relation $$\frac{d[S]}{dt} \approx 0$$

can be assumed. Setting Eqn. S1 to zero, yields:

$$(-k_r^S - k_{nr}^S - k_{ISC})[S] + k_{RISC}[T] = 0 \quad (S3)$$

which can be rearranged to:

$$[S] = \frac{k_{RISC}}{k_r^S + k_{nr}^S + k_{ISC}}[T] \quad (S4)$$

Substitute Eqn. S4 into Eqn. S2, we obtain:

$$\frac{d[T]}{dt} = (-k_r^T - k_{nr}^T - k_{RISC})[T] + \frac{k_{ISC} k_{RISC}}{k_r^S + k_{nr}^S + k_{ISC}}[T] \quad (S5)$$

Therefore, under these assumptions the decay rate constant of the slow emission $k_{slow}$, is given by $$k_{slow} = k_r^T + k_{nr}^T + k_{RISC}\left(1 - \frac{k_{ISC}}{k_r^S + k_{nr}^S + k_{ISC}}\right) \quad (S6)$$

In principle, both $k_{ISC}$ and $k_{RISC}$ may be thermally activated, e.g. through the promotion of molecular rotation. We examine below which is dominant. For simplicity, we assume the rates of the other decay processes remain constant.

Eqn. S6 can be re-written as:

$$k_{slow} = k_r^T + k_{nr}^T + k_{RISC} - \frac{k_{RISC}}{\frac{k_r^S + k_{nr}^S}{k_{ISC}} + 1} \quad (S7)$$

According to Eqn. S7, if $k_{ISC}$ is the dominant activated process, increasing temperature will result in a lower $k_{slow}$, which corresponds to longer lifetime of the slow PL. By contrast, if $k_{RISC}$ is the dominant activated process, Eqn. S6 predicts a higher $k_{slow}$ as the temperature increases. The latter agrees with experiment (FIG. 2c) so we conclude $k_{RISC}$ is the dominant activated process.

We define a temperature-independent triplet decay rate constant $$k_0 = k_r^T + k_{nr}^T \quad (S8)$$

and a temperature-independent coefficient $$\alpha = 1 - \frac{k_{ISC}}{k_r^S + k_{nr}^S + k_{ISC}} \quad (S9)$$

By inspecting Eqn. S9, it is clear that α is a constant between 0 and 1.

The temperature-dependent part of Eqn. S6 can then be written as $$k_T = \alpha k_{RISC} \quad (S10)$$

which corresponds to the temperature-dependent emission rate described in the main text.

Then Eqn. S6 can be simplified to $$k_{slow} = k_0 + k_T \tag{S11}$$

Therefore, the function to describe the slow PL process can be written as $$PL_{slow} = PL_{slow\,0} e^{-(k_0 + k_T)t} \tag{S12}$$

where $PL_{slow}$ and $PL_{slow\,0}$ are the intensity and the initial (t=0) intensity of the slow PL component respectively.

Assume the temperature-dependent rate constant has the form $$k_T = \beta e^{-\frac{E_A}{k_B T}} \tag{S13}$$

where $E_A$ is the thermal activation energy, $k_B$ is Boltzmann constant, T is the temperature in Kelvin and $\beta$ is a constant. Therefore, we have:

$$\ln(k_T) = -\left(\frac{E_A}{k_B}\right)\left(\frac{1}{T}\right) + C. \tag{S14}$$

REFERENCES

1. Tang, C. W. & VanSlyke, S. A. Organic electroluminescent diodes. *Appl. Phys. Lett.* 51, 913-915 (1987).
2. Burroughes, J. H., Bradley, D. D. C., Brown, A. R., Marks, R. N., Mackay, K., Friend, R. H., Burns, P. L. & Holmes, A. B. Light-emitting diodes based on conjugated polymers. *Nature* 347, 539-541 (1990).
3. Baldo, M. A., O'Brien, D. F., You, Y., Shoustikov, A., Sibley, S., Thomson, M. E. & Forrest, S. R. Highly efficient phosphorescent emission from organic electroluminescent devices. *Nature* 395, 151-154 (1998).
4. Ma, Y., Zhang, H., Shen, J. & Che, C. Electroluminescence from triplet metal-ligand charge-transfer excited state of transition metal complexes. *Synthetic Metals* 94, 245-248 (1998).
5. Uoyama, H., Goushi, K., Shizu, K., Nomura, H. & Adachi, C. Highly efficient organic light-emitting diodes from delayed fluorescence. *Nature* 492, 234-238 (2012).
6. Reineke, S. et al. White organic light-emitting diodes with fluorescent tube efficiency. *Nature* 459, 234-238 (2009).
7. Dai, X. et al. Solution-processed, high-performance light-emitting diodes based on quantum dots. *Nature* 515, 86-89 (2014).
8. Browne, W. R. & Feringa, B. L. Making molecular machines work. *Nature Nanotechnol.* 1, 25-35 (2006).
9. Fletcher, S. P., Dumur, F., Pollard, M. M. & Feringa, B. L. A reversible, unidirectional molecular rotary motor driven by chemical energy. *Science* 310, 80-82 (2005).
10. Koumura, N. Zijlstra, R. W. J., van Delden R. A., Harada, N. & Feringa, B. L. Light-driven molecular rotor. *Nature* 401, 152-155 (1999).
11. Leigh, D. A., Wong, J. K. Y., Dehez, F. & Zerbetto, F. Unidirectional rotation in a mechanically interlocked molecular rotor. *Nature* 424, 174-179 (2003).
12. Hawthorne, M. F. et al. Electrical or photocontrol of the rotary motion of a metallacarborane. *Science* 303, 1849-1851 (2004).
13. Leitl, M. J., Krylova, V. A., Djurovich, P. I., Thompson, M. E. & Yersin, H. Phosphorescence versus thermally activated delayed fluorescence. Controlling singlet-triplet splitting in brightly emitting and sublimable Cu(I) compounds. *J. Am. Chem. Soc.* 45, 16032-16038 (2014).
14. Romanov, A. S. et al. Highly photoluminescent copper carbene complexes based on prompt rather than delayed fluorescence. *Chem. Commun.* (2016). DOI:10.1039/c6cc02349e
15. Goushi, K., Kawamura, Y., Sasabe, H. & Adachi, C. Unusual Phosphorescence Characteristics of Ir(ppy)$_3$ in a Solid Matrix at Low Temperatures. *Jpn. J. Appl. Phys.* 43, L937-L939 (2004).
16. Zheng, J., Kwak, K., Xie, J. & Fayer, M. D. Ultrafast carbon-carbon single-bond rotational isomerization in room-temperature solution. *Science* 313, 1951-1955 (2006).
17. Png, R.-Q. et al. High-performance polymer semiconducting heterostructure devices by nitrene-mediated photocrosslinking of alkyl side chains. *Nat. Mater.* 9, 152-158 (2010).
18. Lee, C.-L., Lee, K. B. & Kim, J.-J. Polymer phosphorescent light emitting devices doped with tris(2-phenylpyridine) iridium as a triplet emitter. *Appl. Phys. Lett.* 77, 2280-2282 (2000).
19. Greenham, N. C., Friend, R. H. & Bradley, D. D. C. Angular-dependence of the emission from a conjugated polymer light-emitting diode: implications for efficiency calculations. *Adv. Mater.* 6, 491-494 (1994).
20. Aizawa, N., et al. Solution-processed multilayer small-molecule light-emitting devices with high-efficiency white-light emission. *Nat. Commun.* 5, 5756 (2014).
21. Kondakov, D. Y. Characterization of triplet-triplet annihilation in organic light-emitting diodes based on anthracene derivatives. *J. Appl. Phys.* 102, 114504 (2007).
22. Wallikewitz B. H., Kabra D., Gélinas S., Friend R. H. Triplet dynamics in fluorescent polymer light-emitting diodes. *Phys. Rev. B* 85, 045209 (2012).
23. Giebink, N. C. & Forrest, S. R. Quantum efficiency roll-off at high brightness in fluorescent and phosphorescent organic light emitting diodes. *Phys. Rev. B* 77, 235215 (2008).
24. Romanov, A. S. & Bochmann, M. Gold(I) and Gold(III) Complexes of Cyclic (Alkyl)(amino)carbenes. *Organometallics* 34, 2439-2454 (2015).
S1. Romanov, A. S. & Bochmann, M. Gold(I) and Gold(III) Complexes of Cyclic (Alkyl)(amino)carbenes. *Organometallics* 34, 2439-2454 (2015).
S2. Gritzner, G. & Kůta, J. Recommendations on reporting electrode potentials in nonaqueous solvents. *Electrochimica Acta* 29, 869-873 (1984).
S3. *Programs CrysAlisPro*, Oxford Diffraction Ltd., Abingdon, UK (2010).
S4. Sheldrick, G. A short history of SHELX. *Acta Crystallogr. A* 64, 112-122 (2008).
S5. Perdew, J. P., Burke, K. & Ernzerhof, M. Generalized Gradient Approximation Made Simple. *Phys. Rev. Lett.* 77, 3865-3868 (1996).
S6. Adamo, C. & Barone, V. Toward reliable density functional methods without adjustable parameters: the PBE0 model. *J. Chem. Phys.* 110, 6158-6165 (1999).
S7. Weigend, F., Häser, M., Patzelt, H. & Ahlrichs, R. RI-MP2: optimized auxiliary basis sets and demonstration of efficiency. *Chem. Phys. Lett.* 294, 143-152 (1998).
S8. Weigend, F. & Ahlrichs, R. Balanced basis sets of split valence, triple zeta valence and quadruple zeta valence quality for H to Rn: Design and assessment of accuracy. *Phys. Chem. Chem. Phys.* 7, 3297-3312 (2005).
S9. Peterson, K. A. et al. Systematically convergent basis sets with relativistic pseudopotentials. II. Small-core pseudopotentials and correlation consistent basis sets for the post-d group 16-18 elements. *J. Chem. Phys.* 119, 11113-11123 (2003).

S10. Andrae, D., Haeussermann, U., Dolg, M., Stoll, H. & Preuss, H. Energy-adjusted ab initio pseudopotentials for the 2nd and 3rd row transition elements. *Theor. Chim. Acta* 77, 123-141 (1990).

S11. Furche, F. & Rappoport, D. Density functional methods for excited states: equilibrium structure and electronic spectra in *Computational Photochemistry* (ed. Olivuccim, M.) 93-128 (Elsevier, 2005).

S12. Koshevoy, I. et al. Intensely Luminescent Alkynyl—Phosphine Gold(I)—Copper(I) Complexes: Synthesis, Characterization, Photophysical, and Computational Studies. *Inorganic Chemistry* 48, 2094-2102 (2009).

S13. Koshevoy, I. et al. Luminescent Gold(I) Alkynyl Clusters Stabilized by Flexible Diphosphine Ligands. *Organometallics* 33, 2363-2371 (2014).

S14. Frisch, M. J., Trucks, G. W., Schlegel, H. B., Scuseria, G. E., Robb, M. A., Cheeseman, J. R., Scalmani, G., Barone, V., Mennucci, B., Petersson, G. A., Nakatsuji, H., Caricato, M., Li, X., Hratchian, H. P., Izmaylov, A. F., Bloino, J., Zheng, G., Sonnenberg, J. L., Hada, M., Ehara, M., Toyota, K., Fukuda, R., Hasegawa, J., Ishida, M., Nakajima, T., Honda, Y., Kitao, O., Nakai, H., Veven, T., Montgomery, J. A., Jr., Peralta, J. E., Ogliaro, F., Bearpark, M., Heyd, J. J., Brothers, E., Kudin, K. N., Staroverov, V. N., Keith, T., Kobayashi, R., Normand, J., Raghavachari, K., Rendell, A., Burant, J. C., Iyengar, S. S., Tomasi, J., Cossi, M., Rega, N., Millam, J. M., Klene, M., Knox, J. E., Cross, J. B., Bakken, V., Adamo, C., Jaramillo, J., Gomperts, R., Stratmann, R. E., Yazyev, O., Austin, A. J., Cammi, R., Pomelli, C., Ochterski, J. W., Martin, R. L., Morokuma, K., Zakrzewski, V. G., Voth, G. A., Salvador, P., Dannenberg, J. J., Dapprich, S., Daniels, A. D., Farkas, O., Foresman, J. B., Ortiz, J. V., Cioslowski, J. & Fox, D. J. Gaussian 09, Revision C.01, Gaussian, Inc., Wallingford, Conn., 2010.

The foregoing broadly describes the present invention without limitation. Variations and modifications as will be readily apparent to those skilled in the art are intended to be included in the scope of this patent application and any patents granted thereon.

The invention claimed is:

1. A complex of the following Formula I:

(L)M(X), (I)

in which

M is a gold atom;

L is a cyclic alkyl amino carbene (CAAC) ligand having a saturated cyclic structure in which the atoms of the ring which includes the carbene site consist of carbon atoms and one nitrogen atom; and X is a monoanionic amide ligand having the formula R'—N—R" or N⊃ in which R' and R" are selected from hydrogen and organic groups, which when both organic groups may be the same or different;

and ⊃ represents a cyclic organic group which may contain one or more rings;

excluding the compound $^{Ad}$L-Au-NTf$_2$ in which $^{Ad}$L is

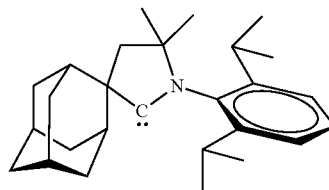

and Tf is CF$_3$—SO$_2$—.

2. A complex according to claim 1, wherein the complex has a neutral overall charge.

3. A complex according to claim 1, wherein the CAAC ligand L is selected from:

A. a compound of Formula IIIa:

(IIIa)

wherein R$^a$, R$^b$, R$^c$ and R$^d$ are CH$_3$ groups, and Ar represents a substituted phenyl group;

B. a compound of Formula IIIb:

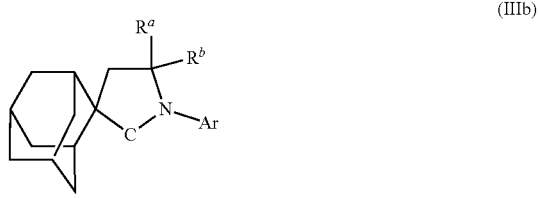

(IIIb)

wherein R$^a$ and R$^b$ are CH$_3$ groups and Ar represents a substituted phenyl group; and C. the following group of compounds:

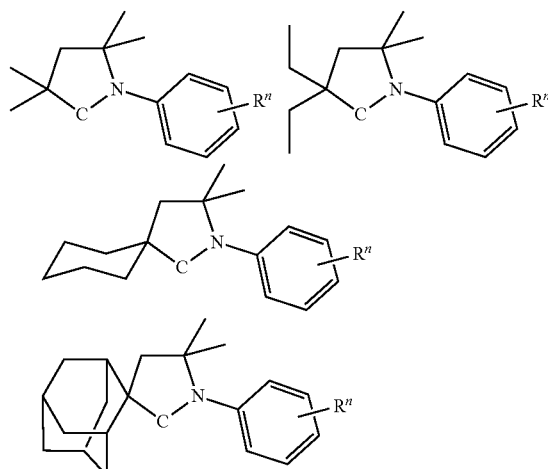

where R$^n$ represents a variable number n of 1-4 substituents, each of which is independently selected from the group comprising hydrogen, alkyl, alkenyl, alkynyl, alkoxy, amino, aryl and heteroaryl.

4. A complex according to claim 1, wherein the ligand X is selected from: arylamide and diarylamide; carbazolate; di-tert-butylcarbazolate; phenazine; N-methylphenazine; phenothiazine; 3,7-dinitrophenothiazine; acridone; dibenzazepine; and 10,11-dihydrodibenzazepine.

5. A complex according to claim 1, wherein the ligand X is selected from NHPh and NH(3,5-bis(trifluoromethyl) phenyl), NPh$_2$, where Ph=phenyl; carbazolate; 3,6-di-tert-butylcarbazolate; phenazine; N-methylphenazine; phenothiazine; 3,7-dinitrophenothiazine; acridone; dibenzazepine; and 10,11-dihydrodibenzazepine.

6. A light-emitting device comprising an emissive zone capable of emitting light in response to introduced energy, wherein the emissive zone capable of emitting light comprises at least one organometallic complex of Formula I:

$$(L)M(X), \qquad (I)$$

in which

A.

M is a gold atom;

L is a cyclic alkyl amino carbene (CAAC) ligand having a saturated cyclic structure in which the atoms of the ring which includes the carbene site consist of carbon atoms and one nitrogen atom; and X is a monoanionic amide ligand having the formula

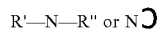

in which R' and R" are selected from hydrogen and organic groups, which when both organic groups may be the same or different;

and ⊃ represents a cyclic organic group which may contain one or more rings;

B.

M is a metal atom selected from copper and silver;

L is a cyclic alkyl amino carbene (CAAC) ligand having a saturated cyclic structure in which the atoms of the ring which includes the carbene site consist of carbon atoms and one nitrogen atom; and X is a monoanionic ligand;

C.

M is a gold atom;

L is a cyclic alkyl amino carbene (CAAC) ligand having a saturated cyclic structure in which the atoms of the ring which includes the carbene site consist of carbon atoms and one nitrogen atom; and X is a monoanionic amide ligand having the formula

in which R' and R" are selected from hydrogen and organic groups, which when both organic groups may be the same or different;

and ⊃ represents a cyclic organic group which may contain one or more rings;

wherein in both options B and C the ligand L is a cyclic compound of Formula III:

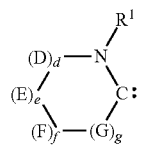

(III)

in which

R' is selected from an optionally substituted alkyl group, an optionally substituted alkenyl group, an optionally substituted aryl group, and an optionally substituted heteroaryl group;

d=e=f=1 and g=0 so that G has no meaning;

D=>CR$^d$R$^d$, where R$^d$=methyl;

E=>CH$_2$; and

F is >CR$^f$R$^{ff}$, in which wherein R$^f$ and R$^{ff}$ together with the carbon atom C to which they are linked form an unsubstituted adamantylidene group;

D.

M is a metal atom selected from copper and silver;

L is a cyclic alkyl amino carbene (CAAC) ligand having a saturated cyclic structure in which the atoms of the ring which includes the carbene site consist of carbon atoms and one nitrogen atom; and X is a monoanionic ligand which is a compound of Formula IV $$[E-Ar]^- \qquad (IV)$$

wherein Ar is an optionally substituted aryl or optionally substituted heteroaryl group, and E- is selected from C(R$^1$)(R$^2$)—, O—, S—, Se—, Te—, N(R)—, P(R)—, As(R)— and Sb(R)—, in which R, R$^1$ and R$^2$ are independently chosen from hydrogen, optionally substituted alkyl, optionally substituted alkenyl, optionally substituted allyl, optionally substituted aryl and optionally substituted heteroaryl; and R, R$^1$ and R$^2$ groups, when present, may optionally be directly linked to the Ar moiety by one or more linker species as well as via the said C, N, P, As or Sb atom

E.

M is a gold atom;

L is a cyclic alkyl amino carbene (CAAC) ligand having a saturated cyclic structure in which the atoms of the ring which includes the carbene site consist of carbon atoms and one nitrogen atom; and X is a monoanionic ligand which is a compound of Formula IV $$[E-Ar]^- \qquad (IV)$$

wherein Ar is an optionally substituted aryl or optionally substituted heteroaryl group, and E- is N(R)—, in which R is chosen from hydrogen, optionally substituted alkyl, optionally substituted alkenyl, optionally substituted allyl, optionally substituted aryl and optionally substituted heteroaryl; and an R group may optionally be directly linked to the Ar moiety by one or more linker species as well as via the said N atom; and excluding the compound $^{Ad}$L-Au-NTf$_2$ in which $^{Ad}$L is

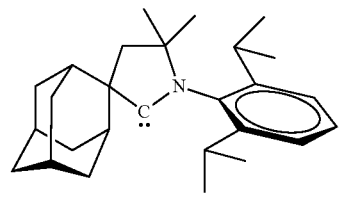

and Tf is CF$_3$—SO$_2$—.

7. A method of preparing complexes of Formula I:

 (I)

in which
A.
M is a gold atom;
L is a cyclic alkyl amino carbene (CAAC) ligand having a saturated cyclic structure in which the atoms of the ring which includes the carbene site consist of carbon atoms and one nitrogen atom; and
X is a monoanionic amide ligand having the formula

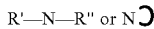

in which R' and R" are selected from hydrogen and organic groups, which when both organic groups may be the same or different;
and ⊃ represents a cyclic organic group which may contain one or more rings;
B.
M is a metal atom selected from copper and silver;
L is a cyclic alkyl amino carbene (CAAC) ligand having a saturated cyclic structure in which the atoms of the ring which includes the carbene site consist of carbon atoms and one nitrogen atom; and
X is a monoanionic ligand;
C.
M is a gold atom;
L is a cyclic alkyl amino carbene (CAAC) ligand having a saturated cyclic structure in which the atoms of the ring which includes the carbene site consist of carbon atoms and one nitrogen atom; and
X is a monoanionic amide ligand having the formula

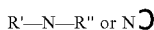

in which R' and R" are selected from hydrogen and organic groups, which when both organic groups may be the same or different;
and ⊃ represents a cyclic organic group which may contain one or more rings;
wherein in both options B and C the ligand L is a cyclic compound of Formula III:

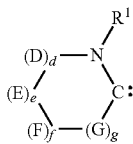 (III)

in which
$R^1$ is selected from an optionally substituted alkyl group, an optionally substituted alkenyl group, an optionally substituted aryl group, and an optionally substituted heteroaryl group;
d=e=f=1 and g =0 so that G has no meaning;
D=>$CR^dR^d$, where $R^d$=methyl;
E=>$CH_2$; and
F is >$CR^fR^{ff}$, in which $R^f$ and $R^{ff}$ together with the carbon atom C to which they are linked form an unsubstituted adamantylidene group;
D.
M is a metal atom selected from copper and silver;
L is a cyclic alkyl amino carbene (CAAC) ligand having a saturated cyclic structure in which the atoms of the ring which includes the carbene site consist of carbon atoms and one nitrogen atom; and
X is a monoanionic ligand which is a compound of Formula IV

 (IV)

wherein Ar is an optionally substituted aryl or optionally substituted heteroaryl group, and
E- is selected from $C(R^1)(R^2)$—, O—, S—, Se—, Te—, N(R)—, P(R)—, As(R)— and Sb(R)—,
in which R, $R^1$ and $R^2$ are independently chosen from hydrogen, optionally substituted alkyl, optionally substituted alkenyl, optionally substituted allyl, optionally substituted aryl and optionally substituted heteroaryl; and R, $R^1$ and $R^2$ groups, when present, may optionally be directly linked to the Ar moiety by one or more linker species as well as via the said C, N, P, As or Sb atom
E.
M is a gold atom;
L is a cyclic alkyl amino carbene (CAAC) ligand having a saturated cyclic structure in which the atoms of the ring which includes the carbene site consist of carbon atoms and one nitrogen atom; and
X is a monoanionic ligand which is a compound of Formula IV

 (IV)

wherein Ar is an optionally substituted aryl or optionally substituted heteroaryl group, and
E- is N(R)—, in which R is chosen from hydrogen, optionally substituted alkyl, optionally substituted alkenyl, optionally substituted allyl, optionally substituted aryl and optionally substituted heteroaryl; and an R group may optionally be directly linked to the Ar moiety by one or more linker species as well as via the said N atom; and
excluding the compound $^{Ad}$L-Au-NTf$_2$ in which $^{Ad}$L is

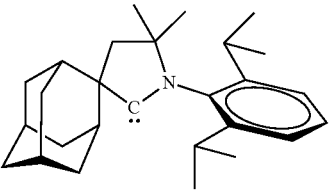

and Tf is $CF_3$—$SO_2$—
the method comprising:
A.
contacting a compound of Formula II:

 (II)

with the CAAC compound L in a solvent;
and recovering the complex of Formula I;
wherein L, M and X are as defined above for Formula I; or
B.
when M is copper and X is optionally substituted arylacetylide, optionally substituted aryloxide, or optionally substituted aryl amide,
contacting a CAAC compound of Formula Ib:

 (Ib)

in which L is as defined above for Formula I when M is copper, and X' is Cl, OH or O'Bu with a compound of formula V

X—H  (V)

in which X is optionally substituted arylacetylide, optionally substituted aryloxide, or optionally substituted aryl amide, in a solvent, and recovering the complex of Formula I wherein M is copper and X is optionally substituted arylacetylide, optionally substituted aryloxide, or optionally substituted aryl amide; or C.
when M is gold,
contacting a CAAC compound of Formula Ic:

L-Au—X'  (Ic)

in which L is as defined above for Formula I when M is gold and X' is Cl or OH or O'Bu
with a compound of formula Va X—H  (Va)

in which X is optionally substituted aryl amide having the formula

R'—N—R" or N⊃ in which R' and R" are selected from hydrogen and organic groups, which when both organic groups may be the same or different; provided that at least one of R and R" is aryl;
and ⊃ represents a cyclic organic group which may contain one or more rings;
provided that the cyclic organic group is such that the compound of formula Va is an optionally substituted aryl amide;
in a solvent, and recovering the complex of Formula I wherein M is gold.

8. A complex, of the following Formula I:

(L)M(X),  (I)

in which
A.
M is a metal atom selected from copper and silver;
L is a cyclic alkyl amino carbene (CAAC) ligand having a saturated cyclic structure in which the atoms of the ring which includes the carbene site consist of carbon atoms and one nitrogen atom; and
X is a monoanionic ligand; or
B.
M is a gold atom;
L is a cyclic alkyl amino carbene (CAAC) ligand having a saturated cyclic structure in which the atoms of the ring which includes the carbene site consist of carbon atoms and one nitrogen atom; and
X is a monoanionic amide ligand having the formula R'—N—R" or N⊃ in which R' and R" are selected from hydrogen and organic groups, which when both organic groups may be the same or different;
and ⊃ represents a cyclic organic group which may contain one or more rings;
wherein in both options A and B the ligand L is a cyclic compound of Formula III:

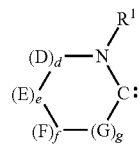

(III)

in which
R¹ is selected from an optionally substituted alkyl group, an optionally substituted alkenyl group, an optionally substituted aryl group, and an optionally substituted heteroaryl group;
d=e=f=1 and g =0 so that G has no meaning;
D=>CR$^d$R$^d$, where R$^d$=methyl;
E=>CH$_2$; and
F is >CR$^f$R$^{ff}$, in which R$^f$ and R$^{ff}$ together with the carbon atom C to which they are linked form an unsubstituted adamantylidene group;
excluding the compound $^{Ad}$L-Au-NTf$_2$ in which $^{Ad}$L is

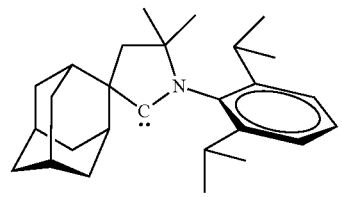

and Tf is CF$_3$—SO$_2$—.

9. A complex according to claim 8, wherein R¹ is selected from an optionally substituted phenyl, carbazole, indole, benzindole, benzofuran, dibenzofuran, benzothiophene, azacarbazole, azabenzofuran or azadibenzothiophene group.

10. A complex according to claim 8, wherein R¹ is a disubstituted phenyl group.

11. A complex according to claim 8, wherein:
M is selected from copper, silver and gold, more preferably copper and gold;
L is a spiroadamantane compound of Formula IIIb:

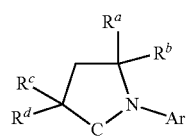

(IIIa)

wherein R$^a$ and R$^b$ are CH$_3$ groups and Ar represents a substituted phenyl group, more preferably a 2,6-dialkyl substituted phenyl group, and most preferably a 2,6-diisopropylphenyl group;
and
X is a monoanionic organic amide ligand having the formula R'—N—R" or N⊃ in which R' and R" are selected from hydrogen and organic groups, which when both organic groups may be the same or different;
and ⊃ represents a cyclic organic group which may contain one or more rings;
preferably having the following general formula in which the nitrogen atom N is an amide anionic nitrogen:

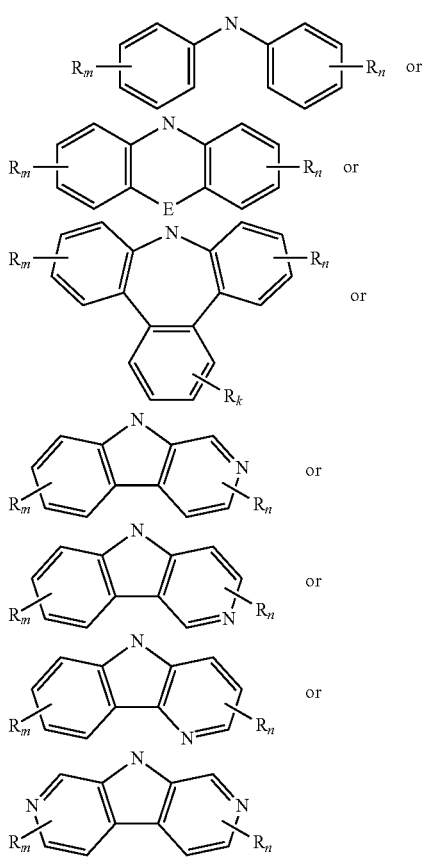

in which Rn, Rm and Rk represent optional substituents of the respective aromatic rings, in which n, m and k are numbers from 0 to the maximum available and in each case the presence, number, position and/or identity of the said substituents may be the same or different as between different aromatic ring moieties; and, where n, m or k is more than 1, the identity of each R group of the substituents of a particular aromatic ring moiety may be the same or different as between each other; and E is a bond or is a group selected from optionally substituted hydrocarbyl [for example, optionally substituted >CH$_2$, optionally substituted —CH=CH—, optionally substituted —CH$_2$—CH$_2$— ethylene, optionally substituted aryl (for example, optionally substituted —C$_6$H$_4$—, for example unsubstituted —C$_6$H$_4$—)], O, S, NR', SO, SO$_2$ and AsR', in which R' is selected from hydrogen, optionally substituted alkyl, optionally substituted alkenyl, optionally substituted allyl, optionally substituted aryl and optionally substituted heteroaryl;

and preferably X is a diarylamide or carbazolate anion in which the aryl groups in the diarylamide anion or the aromatic rings in the carbazolate anion may each be optionally substituted, more preferably an unsubstituted diphenylamide anion (NPh$_2^-$) or a diphenylamide anion in which the phenyl groups are each substituted by one or more substituents; for example an unsubstituted diphenylamide anion; or an unsubstituted carbazolate anion or a carbazolate in which the aromatic rings are each substituted by one or more substituents, for example an unsubstituted carbazolate anion or a 3,6-di-t.butyl-carbazolate anion.

12. A complex according to claim 8, wherein the ligand X is selected from: arylamide and diarylamide; carbazolate; di-tert-butylcarbazolate; phenazine; N-methylphenazine; phenothiazine; 3,7-dinitrophenothiazine; acridone; dibenzazepine; and 10,11-dihydrodibenzazepine.

13. A complex according to claim 8, wherein the ligand X is selected from NHPh and NH(3,5-bis(trifluoromethyl)phenyl), NPh$_2$, where Ph=phenyl; carbazolate; 3,6-di-tert-butylcarbazolate; phenazine; N-methylphenazine; phenothiazine; 3,7-dinitrophenothiazine; acridone; dibenzazepine; and 10,11-dihydrodibenzazepine.

14. A complex according to claim 8, wherein the complex is a complex selected from the following:

Complex 1Ad

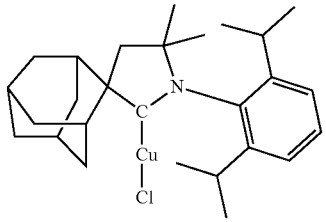

Complex 2Ad

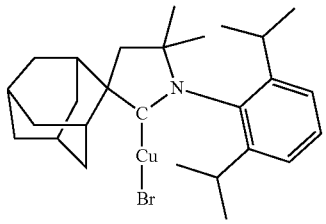

Complex 3Ad

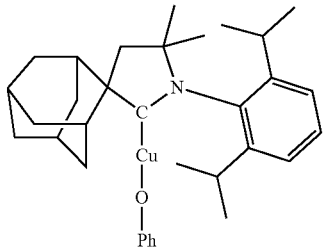

Complex 4Ad

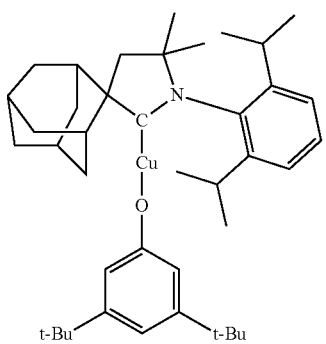

Complex 5Ad

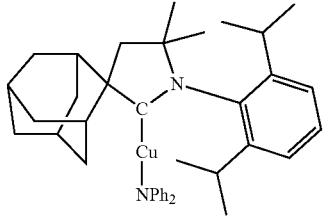

-continued

Complex 6Ad

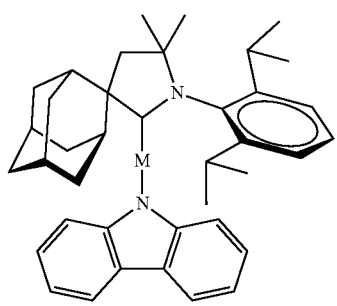

(M = Au or Cu)

Complex 7Ad

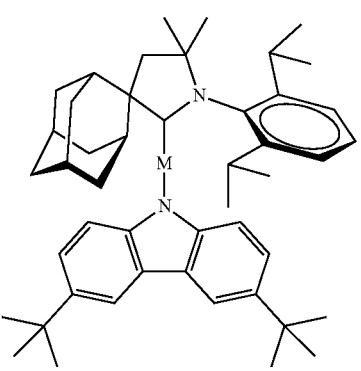

(M = Au or Cu)

Complex 8C

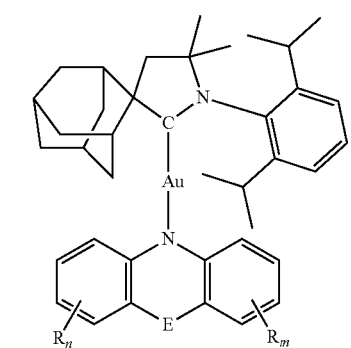

Complex 8D

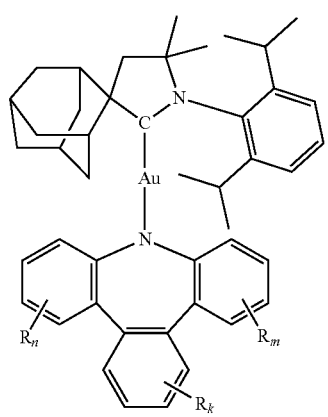

wherein in complex 8C and 8D, Rn, Rm and Rk represent optional substituents of the respective aromatic rings, in which n, m and k are numbers from 0 to the maximum available and in each case the presence, number, position and/or identity of the said substituents may be the same or different as between different aromatic ring moieties; and, where n, m or k is more than 1, the identity of each R group of the substituents of a particular aromatic ring moiety may be the same or different as between each other; and E is a bond or is a group selected from optionally substituted hydrocarbyl [for example, optionally substituted >CH$_2$, optionally substituted —CH=CH—, optionally substituted —CH$_2$—CH$_2$— ethylene, optionally substituted aryl (for example, optionally substituted —C$_6$H$_4$—, for example unsubstituted —C$_6$H$_4$—)], O, S, NR', SO, SO$_2$ and AsR', in which R' is selected from hydrogen, optionally substituted alkyl, optionally substituted alkenyl, optionally substituted allyl, optionally substituted aryl and optionally substituted heteroaryl.

15. A complex according to claim 14, wherein the complex is selected from the group consisting of:

Complex 8A, wherein E is N—CH$_3$, Rn is H and Rm is H;
Complex 8A, wherein E is a bond, Rn is H and Rm is H;
Complex 8A, wherein E is —CH$_2$—CH$_2$—, Rn is H and Rm is H;
Complex 8A, wherein E is —O—, Rn is H and Rm is H;
Complex 8A, wherein E is —S—, Rn and Rm are —NO$_2$ at each of the 3 and 7 positions of the phenothiazine moiety;
Complex 8B, wherein E is N—CH$_3$, Rn is H and Rm is H;
Complex 8B, wherein 8B in which E is a bond, Rn is H and Rm is H;
Complex 8B, wherein E is —CH$_2$—CH$_2$—, Rn is H and Rm is H;
Complex 8B, wherein E is —O—, Rn is H and Rm is H;
Complex 8B, wherein E is —S—, Rn and Rm are —NO$_2$ at each of the 3 and 7 positions of the phenothiazine moiety;
Complex 8C, wherein E is N—CH$_3$, Rn is H and Rm is H;
Complex 8C, wherein E is a bond, Rn is H and Rm is H;
Complex 8C, wherein E is —CH$_2$—CH$_2$—, Rn is H and Rm is H;
Complex 8C, wherein E is —O—, Rn is H and Rm is H;
Complex 8C, wherein E is —S—, Rn and Rm are —NO$_2$ at each of the 3 and 7 positions of the phenothiazine moiety;
Complex 2Ad, wherein Br is replaced with I;
Complex 2Ad, wherein Br is replaced with SCN;
Complex 2Ad, wherein Br is replaced with CN;
Complex 2 Ad, wherein Br is replaced with phenylacetylene;
Complex 3Ad, wherein OPh is replaced with thiophenol;
Complex 4Ad, wherein 3,5-di(tert.butyl)phenyl is replaced with 2,6-difluorophenol;
Complex 4Ad, wherein 3,5-di(tert.butyl)phenyl is replaced with 2-tert.butyl-5-methylphenol;
Complex 5Ad, wherein NPh$_2$ is replaced with carbazole;
Complex 5Ad, wherein NPh$_2$ is replaced with NHPh;
Complex 5Ad, wherein NPh$_2$ is replaced with NH{3,5-(CF$_3$)$_2$Ph;
Complex S12=Complex 6Me, wherein M is Cu;
Complex S13=Complex 6Et, wherein M is Cu;
Complex S14=Complex 6Ad, wherein M is Cu;
Complex S15=Complex 7Me, wherein M is Cu;
Complex S16=Complex 7Et, wherein M is Cu;
Complex S17=Complex 7Ad, wherein M is Cu;
Complex S18=Complex 8A, wherein Au is replaced with Cu;

Complex S19=Complex 8B, wherein Au is replaced with Cu;

Complex S20=Complex 8C, wherein Au is replaced with Cu;

Complex S21=Complex 8D, wherein Au is replaced with Cu;

Complex 8A, wherein E is N—CH₃, Rn is H, Rm is H, and Au is replaced with Cu;

Complex 8A, wherein E is a bond, Rn is H, Rm is H, an Au is replaced with Cu;

Complex 8A, wherein E is —CH₂—CH₂—, Rn is H, Rm is H, and Au is replaced with Cu;

Complex 8A, wherein E is —O—, Rn is H, Rm is H, and Au is replaced with Cu;

Complex 8A, wherein E is —S—, Rn and Rm are —NO₂ at each of the 3 and 7 positions of the phenothiazine moiety, and Au is replaced with Cu;

Complex 8B, wherein E is N—CH₃, Rn is H, Rm is H, and Au is replaced with Cu;

Complex 8B, wherein 8B in which E is a bond, Rn is H, Rm is H, and Au is replaced with Cu;

Complex 8B, wherein E is —CH₂—CH₂—, Rn is H, Rm is H, and Au is replaced with Cu;

Complex 8B, wherein E is —O—, Rn is H, Rm is H, and Au is replaced with Cu;

Complex 8B, wherein E is —S—, Rn and Rm are —NO₂ at each of the 3 and 7 positions of the phenothiazine moiety, and Au is replaced with Cu;

Complex 8C, wherein E is N—CH₃, Rn is H, Rm is H, and Au is replaced with Cu;

Complex 8C, wherein E is a bond, Rn is H, Rm is H, and Au is replaced with Cu;

Complex 8C, wherein E is —CH₂—CH₂—, Rn is H, Rm is H, and Au is replaced with Cu;

Complex 8C, wherein E is —O—, Rn is H, Rm is H, and Au is replaced with Cu;

Complex 8C, wherein is —S—, Rn and Rm are —NO₂ at each of the 3 and 7 positions of the phenothiazine moiety, and Au is replaced with Cu;

Complex 5Me, wherein Cu is replaced with Au;

Complex 5Et, wherein Cu is replaced with Au; and

Complex 5Ad, wherein Cu is replaced with Au.

16. A complex of the following Formula I:

$$(L)M(X),\qquad (I)$$

in which

A.

M is a metal atom selected from copper and silver;

L is a cyclic alkyl amino carbene (CAAC) ligand having a saturated cyclic structure in which the atoms of the ring which includes the carbene site consist of carbon atoms and one nitrogen atom; and X is a monoanionic ligand which is a compound of Formula IV $$[\text{E-Ar}]^-\qquad (IV)$$

wherein Ar is an optionally substituted aryl or optionally substituted heteroaryl group, and E- is selected from $C(R^1)(R^2)$—, O—, S—, Se—, Te—, N(R)—, P(R)—, As(R)— and Sb(R)—, in which R, $R^1$ and $R^2$ are independently chosen from hydrogen, optionally substituted alkyl, optionally substituted alkenyl, optionally substituted allyl, optionally substituted aryl and optionally substituted heteroaryl; and R, $R^1$ and $R^2$ groups, when present, may optionally be directly linked to the Ar moiety by one or more linker species as well as via the said C, N, P, As or Sb atom

B.

M is a gold atom;

L is a cyclic alkyl amino carbene (CAAC) ligand having a saturated cyclic structure in which the atoms of the ring which includes the carbene site consist of carbon atoms and one nitrogen atom; and X is a monoanionic ligand which is a compound of Formula IV $$[\text{E-Ar}]^-\qquad (IV)$$

wherein Ar is an optionally substituted aryl or optionally substituted heteroaryl group, and E- is N(R)—, in which R is chosen from hydrogen, optionally substituted alkyl, optionally substituted alkenyl, optionally substituted allyl, optionally substituted aryl and optionally substituted heteroaryl; and an R group may optionally be directly linked to the Ar moiety by one or more linker species as well as via the said N atom.

17. A complex according to claim 6, X is selected from:

arylamide and diarylamide; carbazolate; di-tert-butylcarbazolate; phenazine; N-methylphenazine; phenothiazine; 3,7-dinitrophenothiazine; acridone; dibenzazepine; and 10,11-dihydrodibenzazepine.

18. A complex according to claim 6, wherein the complex is a complex selected from the following:

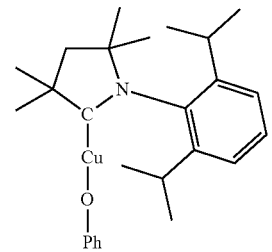

Complex 3Me

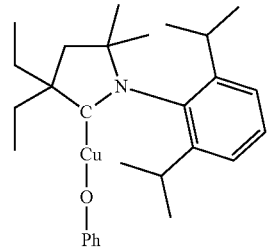

Complex 3Et

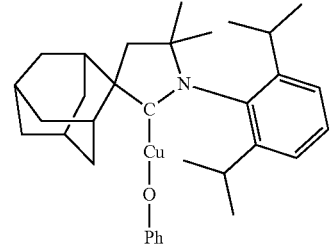

Complex 3Ad

Complex 4Me
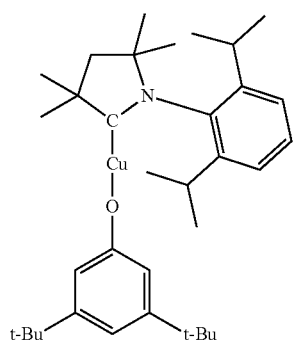
Complex 4Et
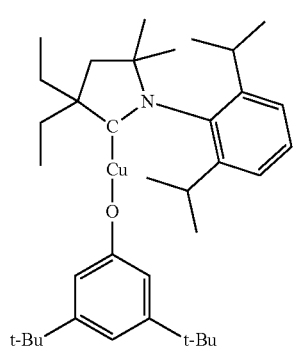
Complex 4Ad
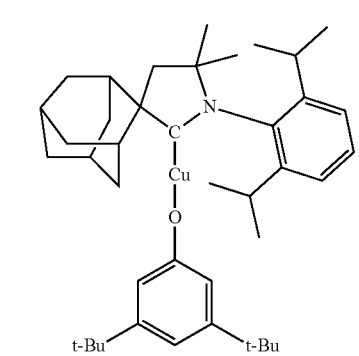
Complex 5Me
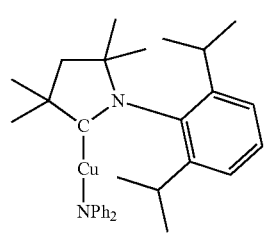
Complex 5Et
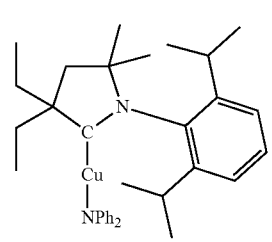
Complex 5Ad
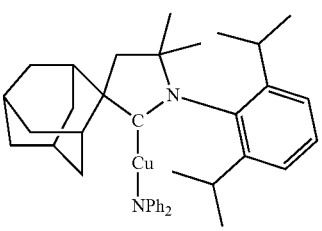
Complex 6Me
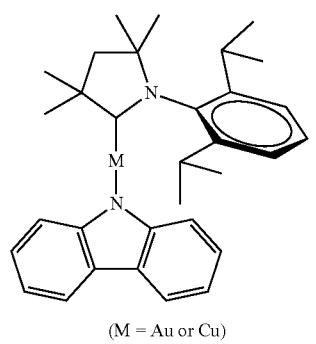
(M = Au or Cu)
Complex 6Et
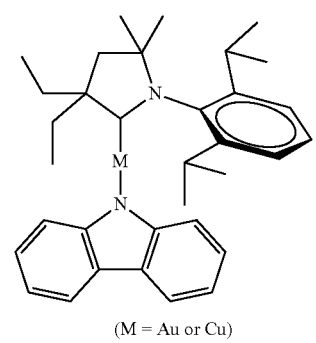
(M = Au or Cu)
Complex 6Ad
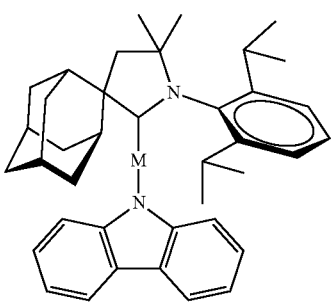
(M = Au or Cu)

-continued

Complex 7Me

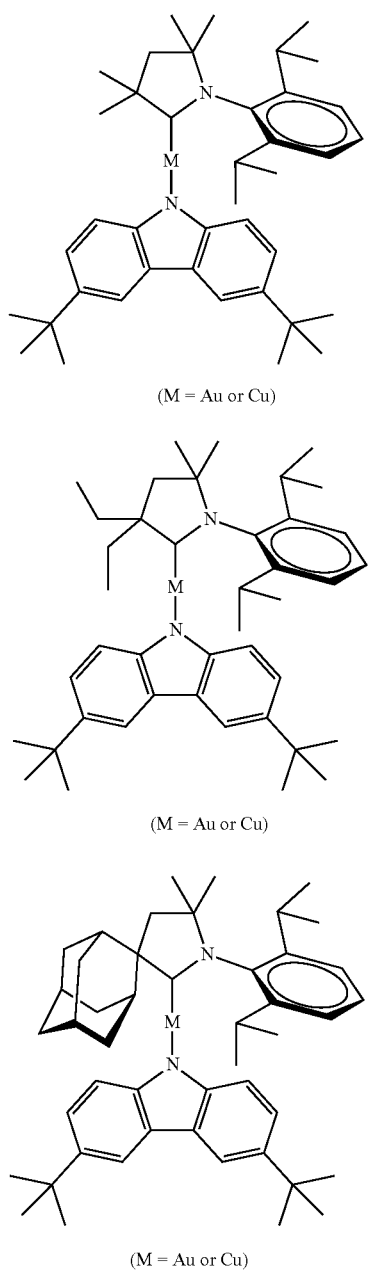

(M = Au or Cu)

Complex 7Et (M = Au or Cu)

Complex 7Ad (M = Au or Cu)

Complex 8A

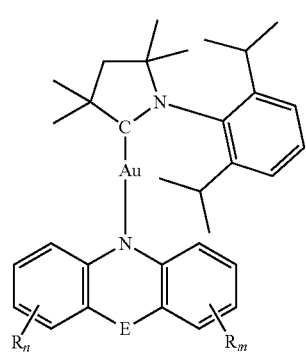

-continued

Complex 8B

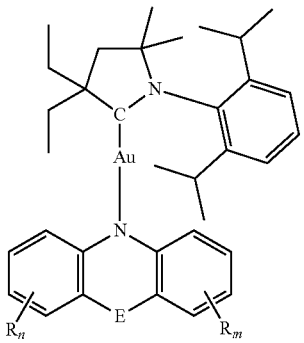

Complex 8C

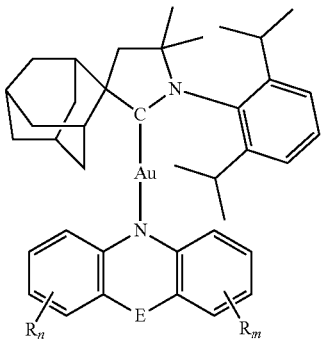

Complex 8D

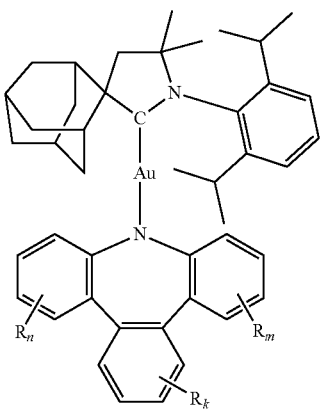

wherein in complex 8A, 8B, 8C and 8D, Rn, Rm and Rk represent optional substituents of the respective aromatic rings, in which n, m and k are numbers from 0 to the maximum available and in each case the presence, number, position and/or identity of the said substituents may be the same or different as between different aromatic ring moieties; and, where n, m or k is more than 1, the identity of each R group of the substituents of a particular aromatic ring moiety may be the same or different as between each other; and E is a bond or is a group selected from optionally substituted hydrocarbyl [for example, optionally substituted >CH$_2$, optionally substituted —CH=CH—, optionally substituted —CH$_2$—CH$_2$— ethylene, optionally substituted aryl (for example, optionally substituted —C$_6$H$_4$—, for example unsubstituted —C$_6$H$_4$—)], O, S, NR', SO, SO$_2$ and AsR', in which R' is selected from hydrogen, optionally substituted alkyl, optionally substituted alkenyl, optionally substituted allyl, optionally substituted aryl and optionally substituted heteroaryl.

19. A complex according to claim 18, wherein the complex is selected from the group consisting of:

Complex 8A, wherein E is N—CH$_3$, Rn is H and Rm is H;
Complex 8A, wherein E is a bond, Rn is H and Rm is H;
Complex 8A, wherein E is —CH$_2$—CH$_2$—, Rn is H and Rm is H;
Complex 8A, wherein E is —O—, Rn is H and Rm is H;
Complex 8A, wherein E is —S—, Rn and Rm are —NO$_2$ at each of the 3 and 7 positions of the phenothiazine moiety;
Complex 8B, wherein E is N—CH$_3$, Rn is H and Rm is H;
Complex 8B, wherein 8B in which E is a bond, Rn is H and Rm is H;
Complex 8B, wherein E is —CH$_2$—CH$_2$—, Rn is H and Rm is H;
Complex 8B, wherein E is —O—, Rn is H and Rm is H;
Complex 8B, wherein E is —S—, Rn and Rm are —NO$_2$ at each of the 3 and 7 positions of the phenothiazine moiety;
Complex 8C, wherein E is N—CH$_3$, Rn is H and Rm is H;
Complex 8C, wherein E is a bond, Rn is H and Rm is H;
Complex 8C, wherein E is —CH$_2$—CH$_2$—, Rn is H and Rm is H;
Complex 8C, wherein E is —O—, Rn is H and Rm is H;
Complex 8C, wherein E is —S—, Rn and Rm are —NO$_2$ at each of the 3 and 7 positions of the phenothiazine moiety;
Complex 3Ad, wherein OPh is replaced with thiophenol;
Complex 4Ad, wherein 3,5-di(tert.butyl)phenyl is replaced with 2,6-difluorophenol;
Complex 4Ad, wherein 3,5-di(tert.butyl)phenyl is replaced with 2-tert.butyl-5-methylphenol;
Complex 5Ad, wherein NPh$_2$ is replaced with carbazole;
Complex 5Ad, wherein NPh$_2$ is replaced with NHPh;
Complex 5Ad, wherein NPh$_2$ is replaced with NH{3,5-(CF$_3$)$_2$Ph;
Complex S12=Complex 6Me, wherein M is Cu;
Complex S13=Complex 6Et, wherein M is Cu;
Complex S14=Complex 6Ad, wherein M is Cu;
Complex S15=Complex 7Me, wherein M is Cu;
Complex S16=Complex 7Et, wherein M is Cu;
Complex S17=Complex 7Ad, wherein M is Cu;
Complex S18=Complex 8A, wherein Au is replaced with Cu;
Complex S19=Complex 8B, wherein Au is replaced with Cu;
Complex S20=Complex 8C, wherein Au is replaced with Cu;
Complex S21=Complex 8D, wherein Au is replaced with Cu;
Complex 8A, wherein E is N—CH$_3$, Rn is H, Rm is H, and Au is replaced with Cu;
Complex 8A, wherein E is a bond, Rn is H, Rm is H, an Au is replaced with Cu;
Complex 8A, wherein E is —CH$_2$—CH$_2$—, Rn is H, Rm is H, and Au is replaced with Cu;
Complex 8A, wherein E is —O—, Rn is H, Rm is H, and Au is replaced with Cu;
Complex 8A, wherein E is —S—, Rn and Rm are —NO$_2$ at each of the 3 and 7 positions of the phenothiazine moiety, and Au is replaced with Cu;
Complex 8B, wherein E is N—CH$_3$, Rn is H, Rm is H, and Au is replaced with Cu;
Complex 8B, wherein 8B in which E is a bond, Rn is H, Rm is H, and Au is replaced with Cu;
Complex 8B, wherein E is —CH$_2$—CH$_2$—, Rn is H, Rm is H, and Au is replaced with Cu;
Complex 8B, wherein E is —O—, Rn is H, Rm is H, and Au is replaced with Cu;
Complex 8B, wherein E is —S—, Rn and Rm are —NO$_2$ at each of the 3 and 7 positions of the phenothiazine moiety, and Au is replaced with Cu;
Complex 8C, wherein E is N—CH$_3$, Rn is H, Rm is H, and Au is replaced with Cu;
Complex 8C, wherein E is a bond, Rn is H, Rm is H, and Au is replaced with Cu;
Complex 8C, wherein E is —CH$_2$—CH$_2$—, Rn is H, Rm is H, and Au is replaced with Cu;
Complex 8C, wherein E is —O—, Rn is H, Rm is H, and Au is replaced with Cu;
Complex 8C, wherein is —S—, Rn and Rm are —NO$_2$ at each of the 3 and 7 positions of the phenothiazine moiety, and Au is replaced with Cu;
Complex 5Me, wherein Cu is replaced with Au;
Complex 5Et, wherein Cu is replaced with Au; and
Complex 5Ad, wherein Cu is replaced with Au.

20. A complex according to claim 16, wherein the ligand X is selected from NHPh and NH(3,5-bis(trifluoromethyl)phenyl), NPh$_2$, where Ph=phenyl; carbazolate; 3,6-di-tert-butylcarbazolate; phenazine; N-methylphenazine; phenothiazine; 3,7-dinitrophenothiazine; acridone; dibenzazepine; and 10,11-dihydrodibenzazepine.

* * * * *